(12) United States Patent
Boothby

(10) Patent No.: US 10,528,886 B2
(45) Date of Patent: Jan. 7, 2020

(54) QUANTUM FLUX PARAMETRON BASED STRUCTURES (E.G., MUXES, DEMUXES, SHIFT REGISTERS), ADDRESSING LINES AND RELATED METHODS

(71) Applicant: D-WAVE SYSTEMS INC., Burnaby (CA)

(72) Inventor: Kelly T. R. Boothby, Coquitlam (CA)

(73) Assignee: D-WAVE SYSTEMS INC., Burnaby (CA)

( * ) Notice: Subject to any disclaimer, the term of this patent is extended or adjusted under 35 U.S.C. 154(b) by 0 days.

(21) Appl. No.: 15/726,239

(22) Filed: Oct. 5, 2017

(65) Prior Publication Data
US 2018/0101786 A1    Apr. 12, 2018

Related U.S. Application Data

(60) Provisional application No. 62/405,027, filed on Oct. 6, 2016.

(51) Int. Cl.
  *G06N 10/00*    (2019.01)
  *H01L 39/02*    (2006.01)
  (Continued)

(52) U.S. Cl.
  CPC ............ *G06N 10/00* (2019.01); *H01L 39/02* (2013.01); *H01L 39/22* (2013.01); *H01L 39/223* (2013.01); *H03M 1/1009* (2013.01); *H03M 1/66* (2013.01)

(58) Field of Classification Search
  None
  See application file for complete search history.

(56) References Cited

U.S. PATENT DOCUMENTS

| 4,947,118 A | 8/1990 | Fujimaki |
| 5,248,941 A | 9/1993 | Lee et al. |

(Continued)

FOREIGN PATENT DOCUMENTS

| JP | 2007-074120 A | 3/2007 |
| JP | 2016-538809 A | 12/2016 |
| WO | 2017/192733 A2 | 11/2017 |

OTHER PUBLICATIONS

Bunyk et al., "Architectural considerations in the design of a superconducting quantum annealing processor," arXiv:1401.5504v1, Jan. 2014. (9 pages).

(Continued)

*Primary Examiner* — Lex H Malsawma
(74) *Attorney, Agent, or Firm* — Cozen O'Connor

(57) ABSTRACT

Approaches useful to operation of scalable processors with ever larger numbers of logic devices (e.g., qubits) advantageously take advantage of QFPs, for example to implement shift registers, multiplexers (i.e., MUXs), de-multiplexers (i.e., DEMUXs), and permanent magnetic memories (i.e., PMMs), and the like, and/or employ XY or XYZ addressing schemes, and/or employ control lines that extend in a "braided" pattern across an array of devices. Many of these described approaches are particularly suited for implementing input to and/or output from such processors. Superconducting quantum processors comprising superconducting digital-analog converters (DACs) are provided. The DACs may use kinetic inductance to store energy via thin-film superconducting materials and/or series of Josephson junctions, and may use single-loop or multi-loop designs. Particular constructions of energy storage elements are disclosed, including meandering structures. Galvanic connections between DACs and/or with target devices are disclosed, as well as inductive connections.

32 Claims, 25 Drawing Sheets

(51) Int. Cl.
  *H01L 39/22* (2006.01)
  *H03M 1/10* (2006.01)
  *H03M 1/66* (2006.01)

(56) References Cited

U.S. PATENT DOCUMENTS

| | | |
|---|---|---|
| 7,876,248 B2 | 1/2011 | Berkley et al. |
| 8,098,179 B2 | 1/2012 | Bunyk et al. |
| 8,169,231 B2 | 5/2012 | Berkley |
| 2006/0147154 A1 | 7/2006 | Thom et al. |
| 2006/0225165 A1 | 10/2006 | Maassen van den Brink et al. |
| 2009/0082209 A1* | 3/2009 | Bunyk .................. B82Y 10/00 505/190 |
| 2012/0094838 A1 | 4/2012 | Bunyk et al. |
| 2015/0032994 A1 | 1/2015 | Chudak et al. |
| 2016/0267032 A1* | 9/2016 | Rigetti .................. G06F 13/36 |

OTHER PUBLICATIONS

Choi, "Systems, Devices, and Methods for Analog Processing," U.S. Appl. No. 60/986,554, filed Nov. 8, 2007, 28 pages.

Harris et al., "Systems, Devices, and Methods for Controllably Coupling Qubits," U.S. Appl. No. 12/017,995, filed Jan. 22, 2008, 28 pages.

Johnson et al., "A scalable control system for a superconducting adiabatic quantum optimization processor," *arXiv:0907.3757v2*, Mar. 2010. (14 pages).

Johnson et al., "Quantum Flux Parametron Based Structures (E.G., Muxes, Demuxes, Shift Registers), Addressing Lines and Related Methods," U.S. Appl. No. 62/405,027, filed Oct. 6, 2016, 133 pages.

Rose et al., "Systems, Devices, and Methods for Interconnected Processor Topology," U.S. Appl. No. 12/013,192, filed Jan. 11, 2008, 38 pages.

Swanson et al., "Systems and Methods for Superconducting Kinetic Inductance DACS in Quantum Processors," U.S. Appl. No. 62/331,287, filed May 3, 2016, 51 pages.

International Search Report and Written Opinion for corresponding PCT Application No. PCT/US2018/054306 dated Apr. 8, 2019, 8 pages.

Bunyk et al., "Architectural Considerations in the Design of a Superconducting Quantum Annealing Processor," *IEEE Transactions on Applied Superconductivity* 24(4), Apr. 14, 2014, 9 pages.

* cited by examiner

QUANTUM FLUX PARAMETRON BASED STRUCTURES (E.G., MUXES, DEMUXES, SHIFT REGISTERS), ADDRESSING LINES AND RELATED METHODS

FIELD

This disclosure generally relates to superconducting devices such as those used in superconducting circuits and scalable computing, for instance quantum computing, and particularly relates to the design of superconducting digital-to-analog converters (DACs) in quantum processors, and the programming or reading-out of logic elements such as qubits of a quantum processor.

BACKGROUND

Qubits

Qubits can be used as fundamental units of information for a quantum computer. Qubits can refer to the actual physical device in which information is stored, and it can also refer to the unit of information itself, abstracted away from its physical device. Examples of qubits include quantum particles, atoms, electrons, photons, ions, and the like.

Qubits generalize the concept of a classical digital bit. A qubit contains two discrete physical states, which can also be labeled "0" and "1". Physically these two discrete states are represented by two different and distinguishable physical states of the quantum information storage device, such as direction or magnitude of magnetic field, current, or voltage, where the quantity encoding the bit state behaves according to the laws of quantum physics. If the physical quantity that stores these states behaves quantum mechanically, the device can additionally be placed in a superposition of 0 and 1. That is, the qubit can exist in both a "0" and "1" state at the same time, and so can perform a computation on both states simultaneously. In general, N qubits can be in a superposition of $2^N$ states.

In standard notation, the basis states of a qubit are referred to as the $|0\rangle$ and $|1\rangle$ states. During quantum computation, the state of a qubit, in general, is a superposition of basis states so that the qubit has a nonzero probability of occupying the $|0\rangle$ basis state and a simultaneous nonzero probability of occupying the $|1\rangle$ basis state. Mathematically, a superposition of basis states means that the overall state of the qubit, which is denoted $|\Psi\rangle$, has the form $|\psi\rangle = a|0\rangle + b|1\rangle$, where a and b are coefficients corresponding to the probabilities $|a|^2$ and $|b|^2$, respectively. The coefficients a and b each have real and imaginary components, which allow the phase of the qubit to be characterized. The quantum nature of a qubit is largely derived from its ability to exist in a coherent superposition of basis states and for the state of the qubit to have a phase. A qubit will retain this ability to exist as a coherent superposition of basis states when the qubit is sufficiently isolated from sources of decoherence.

To complete a computation using a qubit, the state of the qubit is measured (i.e., read out). Typically, when a measurement of the qubit is performed, the quantum nature of the qubit is temporarily lost and the superposition of basis states collapses to either the $|0\rangle$ basis state or the $|1\rangle$ basis state thus regaining its similarity to a conventional bit. The actual state of the qubit after it has collapsed depends on the probabilities $|a|^2$ and $|b|^2$ immediately prior to the readout operation.

Superconducting Qubits

There are many different hardware and software approaches under consideration for use in quantum computers. One hardware approach uses integrated circuits formed of superconducting materials, such as aluminum or niobium.

Superconducting qubits are a type of superconducting device that can be included in a superconducting integrated circuit. Typical superconducting qubits, for example, have the advantage of scalability and are generally classified depending on the physical properties used to encode information including, for example, charge and phase devices, phase or flux devices, hybrid devices, and the like. Charge devices store and manipulate information in the charge states of the device, where elementary charges consist of pairs of electrons called Cooper pairs. A Cooper pair has a charge of 2e and consists of two electrons bound together by, for example, a phonon interaction. Flux devices store information in a variable related to the magnetic flux through some part of the device. Phase devices store information in a variable related to the difference in superconducting phase between two regions of the phase device. Recently, hybrid devices using two or more of charge, flux and phase degrees of freedom have been developed.

Examples of flux qubits include rf-SQUIDs, which include a superconducting loop interrupted by one Josephson junction, or a compound Josephson junction (where a single Josephson junction is replaced by two parallel Josephson junctions), or persistent current qubits, which include a superconducting loop interrupted by three Josephson junctions, and the like. Examples of qubits include hybrid charge-phase qubits.

The qubits may be associated with a corresponding local bias device. The local bias devices may include a metal loop in proximity to a superconducting qubit that provides an external flux bias to the qubit. The local bias device may also include a plurality of Josephson junctions. Each superconducting qubit in the quantum processor may have a corresponding local bias device or there may be fewer local bias devices than qubits. In some instances, charge-based readout and local bias devices may be used. Conventional readout device(s) include dc-SQUID magnetometers inductively connected to a respective qubits within a topology. The readout device may provide a voltage or current. The dc-SQUID magnetometers typically are formed by a loop of superconducting material interrupted by at least one Josephson junction.

Quantum Processor

A computer processor may take the form of an analog processor, for instance a quantum processor such as a superconducting quantum processor. A superconducting quantum processor may include a number of qubits and associated local bias devices, for instance two or more superconducting qubits. Further detail and embodiments of exemplary quantum processors are described in U.S. Patent Publication No. 2006-0225165, U.S. patent application Ser. No. 12/013,192, and U.S. Provisional Patent Application Ser. No. 60/986,554 filed Nov. 8, 2007 and entitled "Systems, Devices and Methods for Analog Processing."

A superconducting quantum processor may include a number of coupling devices operable to selectively couple respective pairs of qubits. Examples of superconducting coupling devices include rf-SQUIDs and dc-SQUIDs, which couple qubits together by flux. SQUIDs include a superconducting loop interrupted by one Josephson junction (an rf-SQUID) or two Josephson junctions (a dc-SQUID). The coupling devices may be capable of both ferromagnetic and anti-ferromagnetic coupling, depending on how the coupling device is being utilized within the interconnected topology.

In the case of flux coupling, ferromagnetic coupling implies that parallel fluxes are energetically favorable and anti-ferromagnetic coupling implies that anti-parallel fluxes are energetically favorable. Alternatively, charge-based coupling devices may also be used. Other coupling devices can be found, for example, in U.S. Patent Publication No. 2006-0147154 and U.S. patent application Ser. No. 12/017, 995. Respective coupling strengths of the coupling devices may be tuned between zero and a maximum value, for example, to provide ferromagnetic or anti-ferromagnetic coupling between qubits.

Regardless of the specific hardware being implemented, managing a single qubit requires control over a number of parameters. Conventionally, this requirement necessitated outside communication (that is, communication from outside of the processor architecture) with individual qubits. However, since overall processing power increases with the number of qubits in the system, high capacity processors that exceed the abilities of conventional supercomputers must manage a large number of qubits and, thus, the conventional approach of employing outside control over multiple parameters on individual qubits requires a complicated system for programming qubit parameters.

Thus, the scalability of quantum processors is limited by the complexity of the qubit parameter control system and there is a need in the art for devices that enable a scalable qubit parameter control system.

Digital-to-Analog Converters (DACs)

Quantum processors provide a plurality of programmable devices for performing computations with quantum effects. Programmable devices include qubits, couplers (which programmably couple qubits), and components thereof. Programmable devices are programmed via signals applied to influence their operation—for example, a biasing signal may be applied to a flux qubit to affect its flux during computation.

Such signals often require conversion and/or storage prior to being applied to programmable devices. For example, a classical computer may generate digital signals for the quantum processor, and those digital signals may be converted to analog form via one or more digital-to-analog converter (DAC). The converted analog signal may be applied to the programmable device. As another example, a signal (which may be digital or analog) may be received by the quantum processor at one time before or during a computation and stored via a DAC until the signal is to be applied to a programmable device at a later time. DACs have many applications, and may be used for one or more of these purposes (i.e., conversion and/or memory) and/or for other purposes. Examples of applications of DACs for these and other purposes are described in greater detail in, for example, U.S. Pat. Nos. 7,876,248 and 8,098,179.

Superconducting quantum processors often comprise a plurality of DACs for these and other functions. Such DACs include superconducting DACs which store a flux (sometimes referred to as Φ-DACs), which generally comprise a storage inductor (e.g., a superconducting magnetic coil) and a programmable coupling element. Φ-DACs take advantage of the flux rate of change of the circuit (e.g., of the storage inductor) to store energy in their magnetic fields, thereby generating an effective inductance (sometimes referred to as a magnetic inductance).

Φ-DAC designs can impose various costs on the design of the processor. For example, magnetic storage inductors which can store sufficient flux for a typical design are often relatively large (and may require several fabrication layers using current techniques), which may constrain the space available for other components on the processor. Further, the magnetic field generated by the Φ-DAC may be powerful and require significant shielding. Even when shielded, the Φ-DAC will likely result in cross-talk with other flux-sensitive devices on the processor. Further still, at least some Φ-DAC designs are particularly sensitive to fabrication variability. Examples of Φ-DAC designs are described in greater detail in, for example, Johnson et al., "A scalable control system for a superconducting adiabatic quantum optimization processor", arXiv:0907.3757; and Bunyk et al., "Architectural considerations in the design of a superconducting quantum annealing processor", arXiv:1401.5504.

There is thus a general desire for systems and methods for providing superconducting DACs which ameliorate at least some of these deficiencies.

Quantum Flux Parametron

A quantum flux parametron (QFP) is a superconducting Josephson junction device similar in some respects to a compound rf-SQUID. A particular potential energy curve may be generated with a QFP device. This potential energy curve may resemble a "W" where the central peak or "barrier" is adjustable in height, as are the independent depths of the two wells on either side of the central barrier. Although the word "quantum" appears in the name of the QFP device, the device is generally operated in a classical manner. In short, quickly raising the height of the central barrier is classically believed to greatly disrupt the energy configuration of the system. Thus, damping resistors are traditionally incorporated into the QFP circuit to help dissipate energy and return the system to a stable energy configuration. These damping resistors dissipate excess energy in the form of heat, a process that can have negative effects on any system that is particularly sensitive to thermal noise. Thus, conventional QFP circuits are typically unsuitable for use with devices that are sensitive to thermal noise, such as the elements of a superconducting quantum processor.

Scalability

The data rate of a non-dissipative readout (NDRO) in a superconducting processor (such as the NDRO described in U.S. Pat. No. 8,169,231) is constant regardless of the processor size. Consequently, the approach does not scale to large processor sizes, for example, a quantum processor having a large number of qubits or a classical superconducting processor having a large number of devices.

Though the data rate can be increased by adding more NDRO lines and associated hardware, the approach is not readably scalable to large numbers of qubits.

Additional NDRO lines increase the thermal load on the refrigerator (i.e., fridge), raising a base temperature of the fridge. The increased power driven on-chip can increase the chip's heat load. Since performance of the processor can depend on low chip temperature, there can be a trade-off between processor performance and readout speed. Furthermore, adding more lines increases the cost of the hardware.

The performance of a superconducting quantum processor can be limited by the number and bandwidth of input lines. For example, in some existing implementations, the superconducting quantum processor can be accessed via approximately 200 lines each having a bandwidth of 30 MHz. The number and bandwidth of the input lines can, at least in part, determine the rate at which the system can encode new problems on the quantum processor.

Increasing the number and bandwidth of lines is not a readily scalable approach. Adding more lines can create a number of demands on the system including the need for a larger sample space, and the need for more contact pads on the periphery of the processor chip. Increasing the number of lines can also increase the thermal load on the processor. Moreover, an increase in the number of lines can open up more pathways for non-thermal photons.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

There exists a need to be able to processor at least some problems having size and/or connectivity greater than (and/or at least not fully provided by) the working graph of an analog processor. Computational systems and methods are described which, at least in some implementations, allow for the computation of at least some problem graphs which have representations which do not fit within the working graph of an analog processor (e.g. because they require more computation devices and/or more/other couplers than the processor provides).

A system may be summarized as including: a first two-dimensional array of digital-to-analog converters (DACs) comprising a plurality of DACs arranged in a plurality of sub-arrays, each sub-array comprising a number of rows, a first column of DACs, and a second column of DACs; a first power line coupled to selectively provide a current to the DACs of the first column of each sub-array of the plurality of sub-arrays of the first two-dimensional array; a second power line coupled to selectively provide a current to the DACs of the second column of each sub-array of the plurality of sub-arrays of the first two-dimensional array; and a first control line positioned proximate each DAC along a first diagonal of the first two-dimensional array of DACs to communicatively couple with the respective DACs along the first diagonal of the first two-dimensional array of DACs.

The first diagonal of the first two-dimensional array of DACs may extend across each row of the number of rows, the first column, and the second column of each sub-array of the plurality of sub-arrays of the first two-dimensional array of DACs. The system may further include: at least a second two-dimensional array of DACs comprising a plurality of DACs arranged in a plurality of sub-arrays, each sub-array comprising a number of rows, a first column of DACs, and a second column of DACs; wherein the first power line is further coupled to selectively provide a current to the DACs of the second column of each sub-array of the plurality of sub-arrays of the second two-dimensional array; the second power line is further coupled to selectively provide a current to the DACs of the first column of the sub-arrays of the second two-dimensional array; and the first control line is further positioned proximate each DAC along a first diagonal of the second two-dimensional array of DACs to communicatively couple with the respective DACs along the first diagonal of the second two-dimensional array of DACs. The first diagonal of the first two-dimensional array of DACs may extend across each row of the number of rows, the first column, and the second column of each sub-array of the plurality of sub-arrays of the first two-dimensional array of DACs. The first diagonal of the second two-dimensional array of DACs may extend across each row of the number of rows, the first column, and the second column of each sub-array of the plurality of sub-arrays of the second two-dimensional array of DACs. The first diagonal of the first two-dimensional array may be perpendicular to the first diagonal of the second two-dimensional array. The first control line may follow a meandering path along the first diagonal of the first two-dimensional array of DACs and the first control line may follow a meandering path along the first diagonal of the second two-dimensional array of DACs. The first control line may follow a meandering path along the first diagonal of the first two-dimensional array of DACs and the first control line may follow a meandering path along a second diagonal of the first two-dimensional array of DACs. The system may further include: a second control line positioned proximate each DAC along a third diagonal of the first two-dimensional array of DACs to communicatively couple with the respective DACs along the third diagonal of the first two-dimensional array of DACs and the second control line further positioned proximate each DAC along a second diagonal of the second two-dimensional array of DACs to communicatively couple with the respective DACs along the second diagonal of the second two-dimensional array of DACs. The system may further include: a third control line positioned proximate each DAC along a second diagonal of the first array to communicatively couple with the respective DACs along the second diagonal of the first array and the third control line is further positioned proximate each DAC along a third diagonal of the second array to communicatively couple with the respective DACs along the third diagonal of the second array. The system may further include: a second control line positioned proximate each DAC along a third diagonal of the first two-dimensional array of DACs to communicatively couple with the respective DACs along the third diagonal of the first two-dimensional array of DACs and the second control line further positioned proximate each DAC along a fourth diagonal of the first two-dimensional array of DACs to communicatively couple with the respective DACS along the fourth diagonal of the first two-dimensional array of DACs. The system may further include: a third control line positioned proximate each DAC along a second diagonal of the first array to communicatively couple with the respective DACs along the second diagonal of the first array and the third control line is further positioned proximate each DAC along a first diagonal of the first array to communicatively couple with the respective DACs along the first diagonal of the first array. The system wherein there may be a number n of control lines and a number P of power lines and each of the first and the second array of DACs may include a number $P(n-1)^2$ of DACs. The system may further include: control circuitry communicatively coupled to cause signals to be supplied to selected ones of the DACs via a respective triplet comprising one power line and two of the signal lines, the triplet uniquely communicatively coupled to operate a single respective DAC. The first power line may be coupled to selectively provide a current to the DACs of a third column of the first two-dimensional array of DACs, the third column non-adjacent to the first column; the second power line may be coupled to selectively provide a current to the DACs of a fourth column of the first two-dimensional array of DACs, the fourth column non-adjacent to the second column; and the first control line may be positioned operatively proximate at least one DAC in each of at least three rows and at least three columns of the first two-dimensional array of DACs to communicatively couple with the respective DACs in each of at least three rows and at least three columns of the first two-dimensional array of DACs. The system may further include: at least a second two-dimensional array of DACs comprising a plurality of DACs that are not DACs in the first two-dimensional array, and which are arranged in a plurality of rows and a plurality of columns of the second two-dimensional array; wherein the second power line is further coupled to selectively provide a current to the DACs of a third column of the second two-dimensional array of DACs, the third column non-adjacent to the first column of the second two-dimensional array of DACs; and the first power line is further coupled to selectively provide a current to the DACs of a fourth column of the second two-dimensional array of DACs, the fourth column non-adjacent to the second column of the second two-dimensional array of DACs. The system may further include: a second control line positioned operatively proximate at least one DAC in each of at least three rows and at least three columns of the first two-dimensional array of DACs to communicatively couple with the respective DACs in each of at least three rows and at least three columns of the first two-dimensional array of DACs. The first control line and the second control line may be positioned operatively proximate different DACs, with no DAC in common. The first control line and the second control line may be positioned operatively proximate a same at least one of DACs, with the at least one DAC in common.

A method of operation in a system including: a first two-dimensional array of digital-to-analog converters (DACs) comprising a plurality of DACs arranged in a plurality of sub-arrays, each sub-array comprising a number of rows, a first column, and a second column of DACs; a first power line coupled to selectively provide a current to the DACs of the first column of each sub-array of the plurality of sub-arrays of the first two-dimensional array; a second power line coupled to selectively provide a current to the DACs of the second column of each sub-array of the plurality of sub-arrays of the first two-dimensional array; a first control line positioned proximate each DAC along a first diagonal of the first two-dimensional array of DACs to communicatively couple with the respective DACs along the first diagonal of the first two-dimensional array of DACs; a second control line positioned proximate each DAC along a second diagonal of the first two-dimensional array of DACs to communicatively couple with the respective DACs along the second diagonal of the first two-dimensional array of DACs, the method may be summarized as including: during a first period of time, concurrently: applying signals to a first DAC via the first power line; applying signals to the first DAC via the first control line; and applying signals to the first DAC via the second control line.

A system may be summarized as including: a first array of digital-to-analog converters (DACs) comprising a plurality of DACs arranged in a plurality of rows and a plurality of columns of the first array; a first power line coupled to selectively provide a current to each DAC of a first column of the first array, the DACs of the first column positioned in a first arrangement; the first power line further coupled to selectively provide a current to each DAC of a second column of the first array, the DACs of the second column positioned in a second arrangement; a first control line positioned operatively proximate each DAC of the first column and the second column of the first array to communicatively couple with the respective DACs of the first column and the second column of the first array; a second control line positioned operatively proximate each DAC of first column of the first array to communicatively couple with the respective DACs of the first column of the first array; and a third control line positioned operatively proximate each DAC of the second column of the first array to communicatively couple with the respective DACs of second column of the first array.

The system may further include: a third column of DACs positioned in the first arrangement, the third column interposed between the first column and the second column of the first array; a fourth column of DACs positioned in the second arrangement, the fourth column adjacent to the second column of the first array; a second power line coupled to selectively provide a current to each DAC of the third column and the fourth column of the first array; wherein the first control line is further positioned operatively proximate each DAC of the third column and the fourth column of the first array to communicatively couple with the respective DACs of the third column and the fourth column of the first array; the second control line is further positioned operatively proximate each DAC of third column of the first array to communicatively couple with the respective DACs of the third column of the first array; and the third control line is further positioned operatively proximate each DAC of the fourth column of the first array to communicatively couple with the respective DACs of the fourth column of the first array. The system may further include: a fifth column of DACs positioned in the first arrangement, the fifth column interposed between the third column and the second column of the first array; a sixth column of DACs positioned in the second arrangement, the sixth column adjacent to the fourth column of the first array; a third power line coupled to selectively provide a current to each DAC of the fifth column and the sixth column of the first array; wherein the first control line is further positioned operatively proximate each DAC of the fifth column and the sixth column of the first array to communicatively couple with the respective DACs of the fifth column and the sixth column of the first array; the second control line is further positioned operatively proximate each DAC of the fifth column of the first array to communicatively couple with the respective DACs of the fifth column of the first array; and the third control line is further positioned operatively proximate each DAC of the sixth column of the first array to communicatively couple with the respective DACs of the sixth column of the first array. The system may further include: a first additional column of DACs positioned in the first arrangement, the first additional column interposed between the second column and a subset of columns of the first array that includes DACs positioned in the first arrangement; a second additional column of DACs positioned in the second arrangement, the second additional column adjacent to a subset of columns of the first array that includes DACs positioned in the second arrangement; an additional power line coupled to selectively provide a current to each DAC of the first additional column and the second additional column of the first array; wherein the first control line is further positioned operatively proximate each DAC of the first additional column and the second additional column to communicatively couple with the respective DACs of the first additional column and the second additional column of the first array; the second control line is further positioned operatively proximate each DAC of the first additional column to communicatively couple with the respective DACs of the first additional column of the first array; and the third control line further is positioned operatively proximate each DAC of the second additional column to communicatively couple with the respective DACs of the second additional column of the first array. The system may further include: at least a second array of DACs comprising a plurality of DACs that are not DACs in the first array, and which are arranged in a plurality of rows and a plurality of columns of the second array; wherein the first power line is coupled to selectively provide a current to each DAC of a first column of the second array, the DACs of the first column positioned in the first arrangement; the first power line is further coupled to selectively provide a current to each DAC of a second column of the second array, the DACs of the second column positioned in a second arrangement; the second control line is positioned operatively proximate each DAC of the second column of the second array to communicatively couple with the respective DACs of the second column of the second array; a fourth control line positioned operatively proximate each DAC of the first column and the second column of the second array to communicatively couple with the respective DACs of the first column and the second column of the second array; and a fifth control line is positioned operatively proximate each DAC of the first column of the second array to communicatively couple with the respective DACs of the first column of the second array. The system may further include: a first additional column of DACs positioned in the first arrangement, the first additional column interposed between the second column of the second array and a subset of columns of the second array that includes DACs positioned in the first arrangement; a second additional column of DACs positioned in the second arrangement, the second additional column adjacent to a subset of columns of the second array that includes DACs positioned in the second arrangement; an additional power line coupled to selectively provide a current to each DAC of the first additional column and the second additional column of the second array; the second control line is further positioned operatively proximate each DAC of the second additional column to communicatively couple with the respective DACs of the second additional column of the second array; the fourth control line is further positioned operatively proximate each DAC of the first additional column and the second additional column to communicatively couple with the respective DACs of the first additional column and the second additional column of the second array; and the fifth control line is further positioned operatively proximate each DAC of the first additional column to communicatively couple with the respective DACs of the first additional column of the second array. The system may further include a third array wherein the fourth control line is electrically coupled to the first control line of the third array. The system may further include a third array wherein the fifth control line is electrically coupled to the third control line of the third array. The system may further include: at least a second array of DACs comprising a plurality of DACs that are not DACs in the first array, and which are arranged in a plurality of rows and a plurality of columns of the second array; wherein the first power line is coupled to selectively provide a current to each DAC of a first column and a second column of the second array; wherein the first control line is positioned operatively proximate each DAC of the first column and the second column of the second array to communicatively couple with the respective DACs of the first column and the second column of the second array; a fourth control line is positioned operatively proximate each DAC of the first column of the second array to communicatively couple with the respective DACs of the first column of the second array; and a fifth control line is positioned operatively proximate each DAC of the second column of the second array to communicatively couple with the respective DACs of the second column of the second array. The system may further include: a first additional column of DACs positioned in the first arrangement, the first additional column interposed between the second column and a subset of columns that includes DACs positioned in the first arrangement of the second array; a second additional column of DACs positioned in the first arrangement, the second additional column adjacent to a subset of columns that includes DACs positioned in the second arrangement of the second array; an additional power line coupled to selectively provide a current to each DAC of the first additional column and the second additional column; wherein the first control line is further positioned operatively proximate each DAC of the first additional column and the second additional column to communicatively couple with the respective DACs of the first additional column and the second additional column; the fourth control line is further positioned operatively proximate each DAC of the first additional column to communicatively couple with the respective DACs of the first additional column; and the fifth control line is further positioned operatively proximate each DAC of the second additional column to communicatively couple with the respective DACs of the second additional column. The system may further include a third array wherein the fourth control line is electrically coupled to the third control line of the third array. The system may further include a third array wherein the fifth control line is electrically coupled to the second control line of the third array. The system wherein there may be a number n(n−1)P of DACs controlled by a total of n control lines and P power lines. The system wherein there may be a total of P power lines and the first array includes a number 2P of DACs. The system may further include: control circuitry communicatively coupled to cause signals to be supplied to selected ones of the DACs via a respective triplet comprising one power line and two of the signal lines, the triplet uniquely communicatively coupled to operate a single respective DAC.

A method of operation in a system, the system including: a first array of digital-to-analog converters (DACs) comprising a plurality of DACs arranged in a plurality of rows and a plurality of columns of the first array; a first power line coupled to selectively provide a current to each DAC of a first column of the first array, the DACs of the first column positioned in a first arrangement; the first power line further coupled to selectively provide a current to each DAC of a second column of the first array, the DACs of the second column positioned in a second arrangement; a second power line coupled to selectively provide a current to each DAC of a third column of DACs positioned in the first arrangement, the third column interposed between the first column and the second column of the first array; the second power line further coupled to selectively provide a current to each DAC of a fourth column of DACs positioned in the second arrangement, the fourth column adjacent to the second column of the first array; and a first control line positioned operatively proximate each DAC of the first column and the second column of the first array to communicatively couple with the respective DACs of the first column and the second column of the first array, the first control line also positioned operatively proximate each DAC of the third column and the fourth column of the first array to communicatively couple with the respective DACs of the third column and the fourth column of the first array; a second control line positioned operatively proximate each DAC of first column of the first array to communicatively couple with the respective DACs of the first column of the first array, the second control line also positioned operatively proximate each DAC of third column of the first array to communicatively couple with the respective DACs of the third column of the first array, the method may be summarized as including: during a first period of time, concurrently: applying signals to a first DAC and a second DAC via the first power line; applying signals to a third DAC and a fourth DAC via the second power line; applying signals to the first, the second, the third, and the fourth DACs via the first control line; and applying signals to the first, the second, the third, and the fourth DACs via the second control line.

A system may be summarized as including: a number N of control lines; a number P of power lines; a plurality of digital-to-analog converters (DACs), each of the DACs of the plurality of DACs including a respective loop of material and a respective pair of Josephson junctions that interrupt the respective loop and are electrically coupled in parallel with one another in the loop of material; and a plurality of control lines arranged in a braided configuration and communicatively coupled to the DACs of the plurality of DACs; wherein the sum of the DACs in the plurality of DACs includes a number $N(N-1)P$ of DACs that are communicatively coupled to respective triplets of signal lines to be controlled via signals carried by the respective triplet of signal lines.

Each DAC may be controlled via a respective triplet of signal lines, each triplet comprising a unique combination of two control lines and one of the power lines.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1:
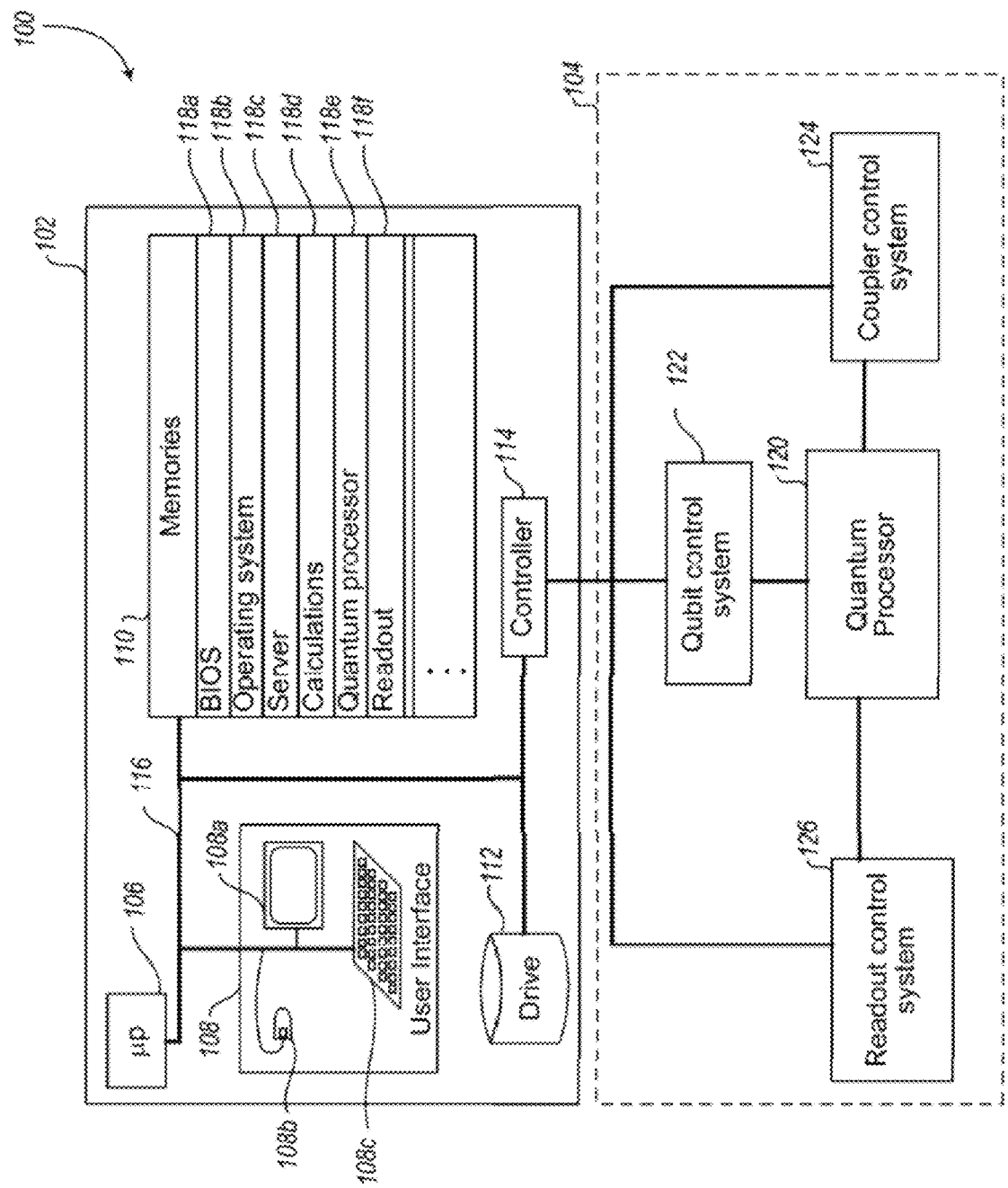
FIG. 1 is a schematic diagram of a hybrid computing system, including a digital computer and a quantum computer, that may incorporate various logic devices and/or implement various addressing approached described herein, according to at least one illustrated implementation.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations. Throughout this specification and the appended claims, the words "element" and "elements" are used to encompass, but are not limited to, all such structures, systems, and devices associated with computer systems, server computers, communications networks, superconductive circuits and resonators.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

In classical electrical circuits, complicated and elaborate operations may be carried out by a particular arrangement of simple switching devices, such as transistors. Examples of such arrangements include shift registers, memory arrays, adders, flip-flops, and the like. In the evolving field of superconducting electronics, and in particular superconducting quantum computing, it is essential to develop circuits that implement superconducting analogues of each of these arrangements. These arrangements may similarly be constructed using simple switching devices; however classical switching devices such as the transistor are not appropriate in the superconducting regime. Thus, in many superconducting systems it is important to establish a basic superconducting logic device with which many other circuits and operations may be realized.

An application of superconducting electronics that is of particular interest is in the field of quantum computing. Superconducting circuits are capable of exploiting quantum effects on a macroscopic scale, providing a mechanism for the implementation of quantum computation that is much more manageable than some of the alternatives. As discussed, the fundamental unit of quantum computation is the qubit. Superconducting qubits may come in a variety of forms, including the superconducting flux qubit. A superconducting flux qubit may be realized in the form of a superconducting loop that contains at least one switching device known as a Josephson junction. A quantum processor may then comprise any number of such superconducting flux qubits. Thus, in implementing such a quantum processor, techniques for fabricating large numbers of superconducting flux qubits may be developed, as well as a solid understanding of the operation of such devices. The present systems, methods and apparatuses describe the use of the basic superconducting flux qubit structure as a superconducting switching device in a quantum processor. In an exemplary embodiment, an arrangement of superconducting flux qubits may be implemented as a superconducting flux-based shift register in a superconducting quantum processor.

This disclosure relates to superconducting quantum processors comprising superconducting digital-analog converters (DACs). The DACs comprise energy storage elements which use kinetic inductance to store energy. Single-loop and multi-loop (or "cascading") DAC designs are disclosed in various implementations. Implementations of thin-film energy storage elements and Josephson-junction-based energy storage elements providing kinetic inductance are disclosed, including implementations with meandering layouts and/or galvanic couplings.

Although the term DAC is used throughout, it will be understood that the described devices may be used for a variety of purposes which are not necessarily restricted to converting digital signals to analog signals (and, in some implementations, do not involve such conversion at all). For example, as described above, superconducting DACs may be used by quantum processors to store a signal for a period of time (e.g., thereby operating as a form of memory).

To assist the understanding of the reader, the operation of an example superconducting quantum processor is discussed below. This provides a context in which a superconducting DAC may operate and illustrates at least some exemplary functions of such a DAC.

Exemplary Hybrid Computing System

FIG. 1 shows a hybrid computing system 100 according to at least one exemplary implementation, including a classical or digital computer 102 and a quantum computer 104, that may incorporate various logic devices and/or implement various addressing approaches described herein.

Digital computer 102 comprises one or more digital processors 106, for example one or more single- or multi-core microprocessors, central processor units (CPU), graphical processor units (GPUs), digital signal processors (DSPs), or application specific integrated circuits (ASICs). The digital computer 102 may include one or more user interface components, for example one or more displays 108a, pointer devices 108b (e.g., computer mouse, trackball), and keypads or keyboards 108c, collectively 108. The digital computer 102 may include one or more nontransitory computer- or processor-readable media, for example one or more memories (e.g., volatile memory, static memory, read only memory (ROM), random access memory (RAM)) 110 and/or one or more storage devices (e.g., magnetic hard disk drives (HDDs), optical disk drives, solid state drives (SSD), and/or Flash drives) 112. The digital computer 102 may include one or more quantum computer control subsystems 114 that interfaces with the quantum computer 104. The processor(s) 106, memories 110, storage 112 and quantum computer control subsystems 114 may be communicatively coupled via one or more communications channels, for instance one or more buses (e.g., power buses, communications buses, instruction buses, address buses) 116.

The nontransitory computer- or processor-readable media, for example one or more memories 110, stores processor-executable instructions and data which, when executed by one or more processors 106, causes the processors 106 to execute one or more of the various algorithms described herein. The processor-executable instructions and data may, for example, include a basic input and output system set of instructions or "module" 118a which configure the digital computer 102 for operation on boot up. The processor-executable instructions and data may, for example, include an operating system set of instructions or "module" 118b which configures the digital computer 102 for operation, for instance providing various file management services and user interface services. The processor-executable instructions and data may, for example, include a server set of instructions or "module" 118c which configures the digital computer 102 for operation as a server to provide access by other computers to information and services. The processor-executable instructions and data may, for example, include a calculations set of instructions or "module" 118d which configures the digital computer 102 to preform various calculations associated with converting problems into a problem graph and/or post-processing of potential solutions generated by the quantum computer 104. The processor-executable instructions and data may, for example, include a quantum processor set of instructions or "module" 118d which configures the digital computer 102 to map problems from a problem graph to a hardware graph for embedding in a quantum processor 120 of the quantum computer 104 for execution. The processor-executable instructions and data may, for example, include a read out set of instructions or "module" 118f which configures the digital computer 102 to perform various read out functions associated with reading out potential solutions to problems from the quantum computer 104.

The quantum computer 104 comprises the quantum processor 120, which typically includes a plurality of qubits and a plurality of couplers, each coupler selectively operable to couple a respective pair of the qubits. The quantum computer 104 includes a qubit control system 122, operatively coupled to control each of the qubits, for example via various interfaces, i.e., inductive interfaces that selectively couple a flux to the qubit. The quantum computer 104 includes a coupler control system 124, operatively coupled to control each of the couplers, for example via various interfaces, i.e., inductive interfaces that selectively couple a flux to the coupler to set a strength of coupling or "coupling strength" of the coupler. The quantum computer 104 includes a read out control system 126, operatively coupled to control various interfaces operable to read out a state of each of the qubits.

Various respective systems, components, structures and algorithms for implementing such are described herein. Many of the described systems, components, structures and algorithms may be implemented individually, while some may be implemented in combination with one another.

Quantum Flux Parametron (QFP)-Based Shift Registers

An existing system relies on X-Y-Z addressing scheme to address DACs, with Z denominated for convenience as power (all DAC stages in a C2 size processor are connected in series), and X and Y signals are denominated for convenience as address (ADDR) and trigger (TRIG). Powering up a C2 block, asserting ADDR and toggling TRIG several times writes corresponding number of pulses into one uniquely selected DAC stage. This addressing scheme can handle several thousand qubits level (e.g., 8,000 or 16,000). To move on the next complexity level with, for example 100,000 qubits and beyond, a way to serially load data into PMM can be employed, using only a couple of lines to write long bit streams into DACs. SFQ-based shift registers dissipate too much power on-chip, thus, it would be preferred to employ a QFP-based scheme.

Figure 2:
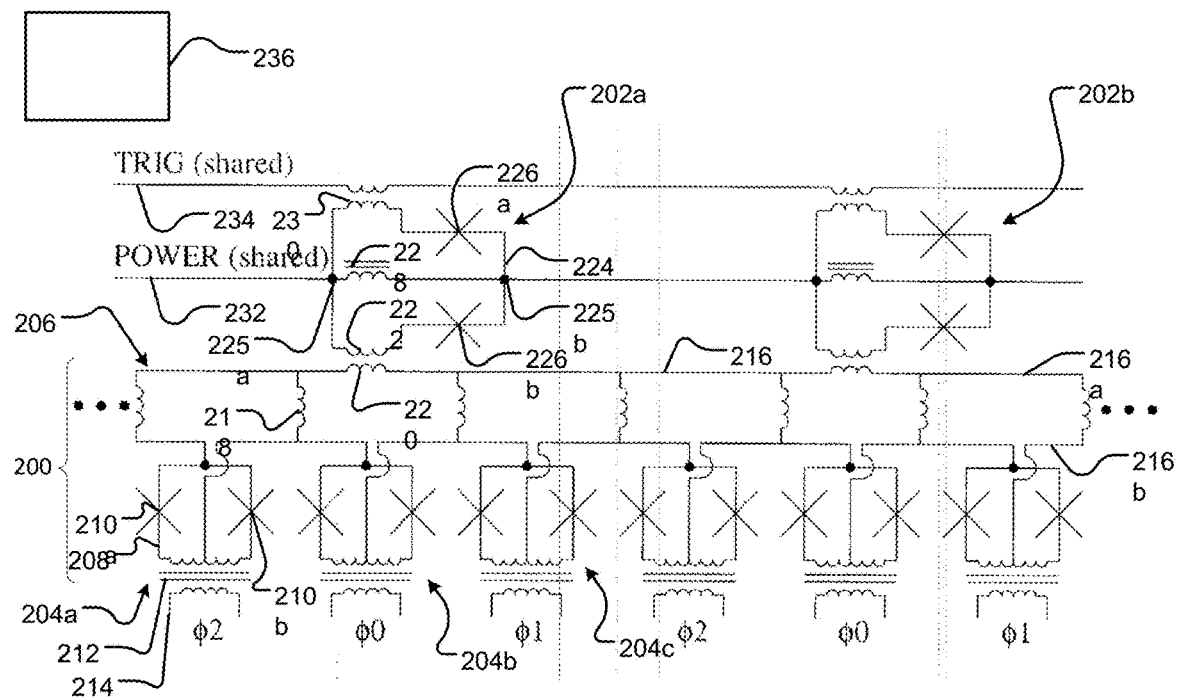
FIG. 2 is a schematic diagram illustrating a quantum flux parametron (QFP)-based shift register communicatively coupled to a set of digital-to-analog converters (DACs), according to at least one illustrated implementation.
Figure 3:
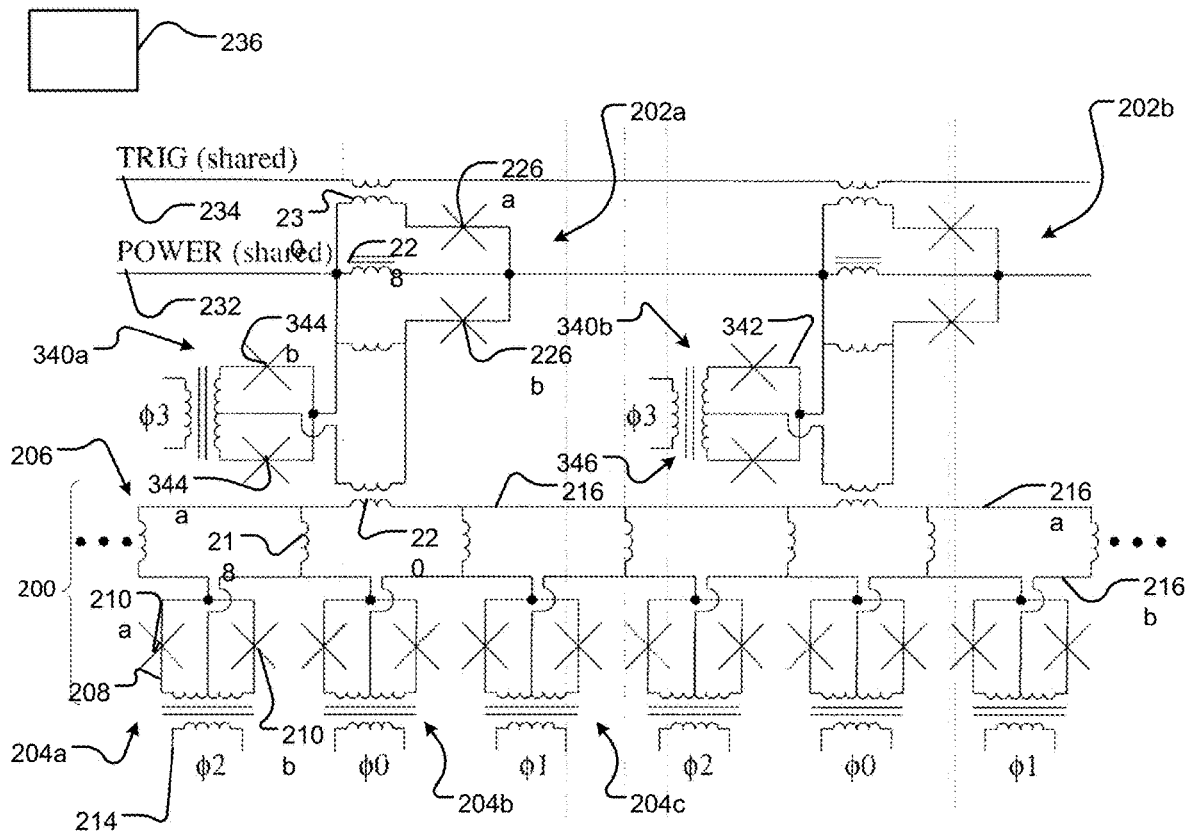
FIG. 3 is a schematic diagram illustrating a quantum flux parametron (QFP)-based shift register communicatively coupled to a set of digital-to-analog converters (DACs) via a number of intermediary QFPs, according to at least one illustrated implementation.

In at least one existing approach, each of ADDR and TRIG provide about ¼ of $\Phi_0$ (where $\Phi_0$ is the superconducting magnetic flux quantum), and a DAC stage which is selected (where ADDR and TRIG coincide in direction of flux, and the DAC stage is powered up) sees about ½ of $\Phi_0$ total signal when it switches, inserting another single flux quantum (SFQ) into the corresponding DAC storage inductor. In principle, one of these signals (e.g., ADDR) can be fed not from a dedicated room temperature line, but by a QFP stage magnetically, or galvanically if it is connected to a QFP shift register magnetically, coupled to half of the DAC stage. Two possible arrangements are illustrated in FIGS. 2 and 3. In particular, FIG. 2 shows a DAC magnetically coupled to a QFP-SR stage, while FIG. 3 shows an additional QFP galvanically coupled to a DAC, which serves as a flux amplifier, providing more signal into the DAC at the expense of extra junctions/body footprint. Since all DACs are connected in series (via POWER line), it may be preferable if the QFP Shift register (QFP-SR) has galvanic connections between stages, which may improve margins in the presence of possible flux offsets, and there should be a (less efficient) magnetic connection somewhere between DACs and QFP-SR.

FIG. 2 shows a quantum flux parametron (QFP)-based shift register 200 which is communicatively coupled to a set of digital-to-analog converters (DACs) 202a, 202b (only two shown, collectively 202), according to at least one illustrated implementation.

The QFP-based shift register contains a plurality of QFP-based shift register elements 204a, 204b, 204c (only three called out, collectively 204) and an inductor ladder circuit 206 that couples either inductively or galvanically to the DACs 202a, 202b of the set of DACs 202.

The QFP-based shift register elements 204 are respective QFPs, each including a respective loop of material 208, a pair of Josephson junctions 210a, 210b (two called out, collectively 210) that interrupt the respective loop of material 208, and a respective interface 212, for example an inductive interface. The loop of material 208 can be one that superconducts at a critical temperature. The interface 212 can be positioned to communicatively couple signals (e.g., flux) from address lines 214 (only one called out). The QFP based shift register 200 preferably includes at least three QFP register elements 204a, 204b, 204c, per DAC 202a of the set of DACs 202.

The inductor ladder circuit 206 includes a conductive path of material 216 with a pair of rails 216a, 216b and a plurality of inductors 218 (only one called out) in parallel with one another coupled across the rails 216a, 216b as "rungs". The inductor ladder circuit 206 also includes a number of interfaces (e.g., inductive interfaces) 220 (only one called out) positioned to communicatively couple a signal (e.g., flux) to respective DACs 202a, 202b via a complementary interface 222 (only one called out) of the DAC 202a. The conductive path of material 216 can be one that superconducts at a critical temperature.

Each of the DACs 202a, 202b of the set of DACs 202 includes a respective loop of material 224 (only one called out) and a respective pair of Josephson junctions 226a, 226b (only one pair called out) that interrupt the respective loop of material 224, the Josephson junctions 226a, 226b electrically coupled in parallel between electrical connections 225a and 225b of loop of material 224 with power line 232. Each of the DACs 202a, 202b of the set of DACs 202 includes a number of interfaces 222, 228, 230, for example inductive interfaces, to couple signals thereto. Each of the DACs 202a, 202b of the set of DACs 200 is independently addressable by a triplet of three signals, a successive number of times, to store a variable number of flux quanta. The triplet of three signals includes a first signal received via the QFP-based shift register elements 204 of the QFP-based shift register 200, a second signal received via a power line 232, and a third signal received via a trigger line 234.

Control circuitry 236 is communicatively coupled to apply signals to the power line 232, the trigger line 234 and the address lines 214. The control circuitry 236 applies signals to the power line 232, the trigger line 234 and the address lines 214 to load information (e.g., a number of flux quanta) to selected ones of the DACs 202a, 202b.

While illustrated as a first set of DACs 202 and first shift register 200, additional sets of DACs and additional associated shift registers can be employed.

FIG. 3 shows a QFP-based shift register 200 which is communicatively coupled to a set of DACs 202a, 202b (only two shown, collectively 202) via a number of intermediary QFPs 340a, 340b (only two shown, collectively 340), according to at least one illustrated implementation.

Many of the structures illustrated in FIG. 3 are similar or even identical to those illustrated in FIG. 2, and are thus denominated with the same reference numbers. In the interest of conciseness and hence clarity, only significant differences between FIG. 3 and FIG. 2 are discussed immediately below.

The intermediary QFPs 340a, 340b operate as QFP flux amplifiers that galvanically couple to respective DACs 202a, 202b of the first set of DAC 202. Each of the QFPs 340a, 340b includes a respective loop of material 342 (only one called out) and a respective pair of Josephson junctions 344a, 344b (only one pair called out) that interrupt the respective loop 342. Each of the QFPs 340a, 340b includes a respective interface (e.g., inductive interface) 346 (only one called out) to communicatively couple signals thereto. The respective loop of material 342 may superconduct at a critical temperature. Each of the QFPs 340a, 340b is communicatively coupled (e.g., galvanically or inductively) between a respective one of the DACs 202a, 220b and QFP-based shift register elements 204a, 204b, 204c of the QFP based shift register 200 via an inductor ladder circuit 206.

Figure 4:
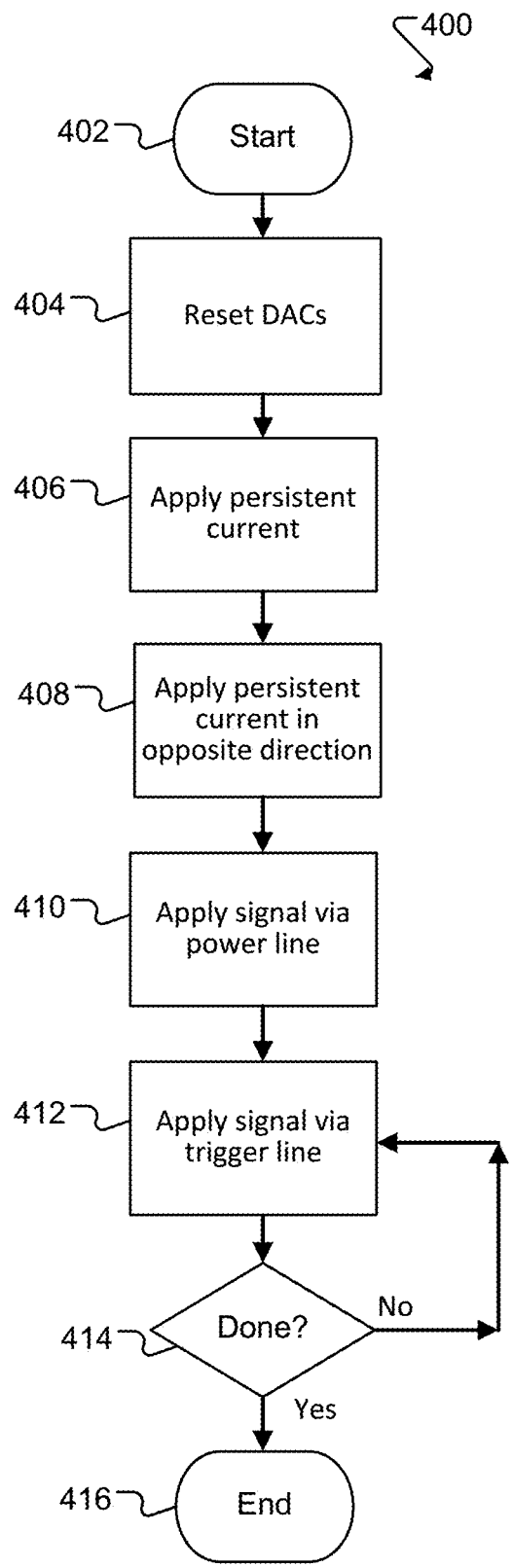
FIG. 4 is a flow diagram showing a method of operation of a circuit employing a QFP-based shift register of FIG. 2 or 3, according to at least one illustrated implementation.

FIG. 4 shows a method 400 of operation of a circuit employing a QFP-based shift register, according to at least one illustrated implementation. The method 400 can, for example, be employed with the QFP-based shift register 200 of FIG. 2 or the QFP-based shift register 300 of FIG. 3.

The method 400 starts at 402, for example in response to application of power, submission of a problem, a request or an invocation, for example by a calling routine or program.

At 404, control circuitry resets all of the DACs of the first set of DACs. To reset all of the DACs, the control circuitry may repeatedly cause application of a signal to or via the trigger line to release all flux in storage inductors.

At 406, the control circuitry causes an application of a persistent current in a first direction (e.g., clockwise) to a first number of the QFP-based shift registers which are coupled to respective DAC stages into which quantums of flux are to be added. At 408, the control circuitry causes an application of a persistent current in an opposite direction (e.g., counter-clockwise) to a second number of the QFP-based shift registers which are coupled to respective DAC stages into which quantums of flux are not to be loaded.

At 410, the control circuitry causes an application of a signal to the power line. At 412, for a first number of times, the control circuitry causes an application of a signal to the trigger line, where the first number of times is at least proportional to a total number of quantums of flux to be added. Typically, the first number of times is equal to the total number of quantums of flux to be loaded. Thus, the trigger line TRIG may be pulsed with a polarity which adds to clockwise current in selected QFP stages, and subtracts from counter-clockwise current in unselected stages, a total number of times equal to the number of pulses to written, increasing the number of SFQ quanta in storage inductors. If, at 414, the control circuitry determines a signal has not yet been applied to the trigger line for the first number of times, then the method 400 returns to 412.

When, at 414, the control circuitry determines that a signal has been applied to the trigger line for the first number of times, then the method 400 terminates at 416, until called or invoked again. Alternatively, the method 400 can continually operate.

Figure 5:
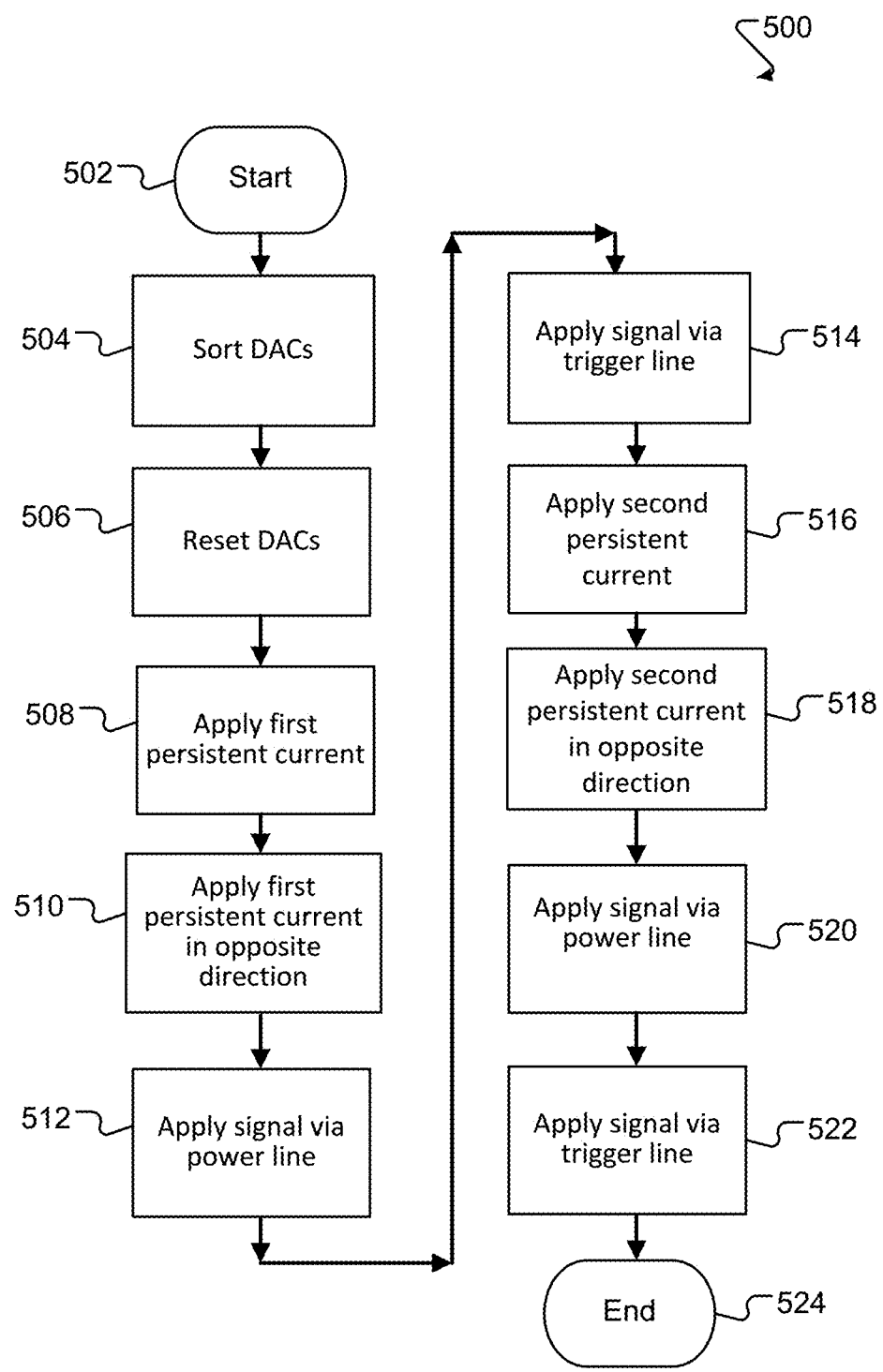
FIG. 5 shows a method of operation of a circuit employing a QFP-based shift register, which can be a specific implementation of the method of FIG. 4, according to at least one illustrated implementation.

FIG. 5 shows a method 500 of operation of a circuit employing a QFP-based shift register, according to at least one illustrated implementation. The method 500 can be a specific implementation of the method 400 (FIG. 4). The method 500 can, for example, be employed with the QFP-based shift register 200 of FIG. 2 or the QFP-based shift register 300 of FIG. 3.

The method 500 starts at 502, for example in response to application of power, submission of a problem, a request or an invocation, for example by a calling routine or program.

At 504, control circuitry sorts all of the DACs based on a number of quantums of flux to be loaded to the DACs. At 506, the control circuitry causes a reset of all of the DACs. To reset all of the DACs, the control circuitry may repeatedly cause application of a signal to or via the trigger line.

At 508, the control circuitry causes an application of a persistent current in a first direction (e.g., clockwise) to a number of the QFP-based shift registers which are coupled to respective DAC stages into which at least one quantum of flux is to be loaded. At 510, the control circuitry causes an application of a persistent current in an opposite direction (e.g., counter-clockwise) to a number of the QFP based shift register stages which are coupled to respective DACs into which less than one quantum of flux is to be loaded. At 512, the control circuitry causes an application of a signal to or via the power line. At 514, the control circuitry causes an application of a signal to or via the trigger line.

At 516, the control circuitry subsequently causes an application of a persistent current in the first direction to a number of the QFP-based shift registers which are coupled to respective DACs into which at least two quantums of flux are to be loaded. At 518, the control circuitry causes an application of a persistent current in the opposite direction to a second number of the QFP-based shift registers which are coupled to respective DACs into which less than two quantums of flux are to be loaded. At 520, the control circuitry causes an application of a signal to the power line. At 522, the control circuitry subsequently causes an application of a signal to or via the trigger line.

The method 500 terminates at 524, for example until called or invoked again.

Figure 6:
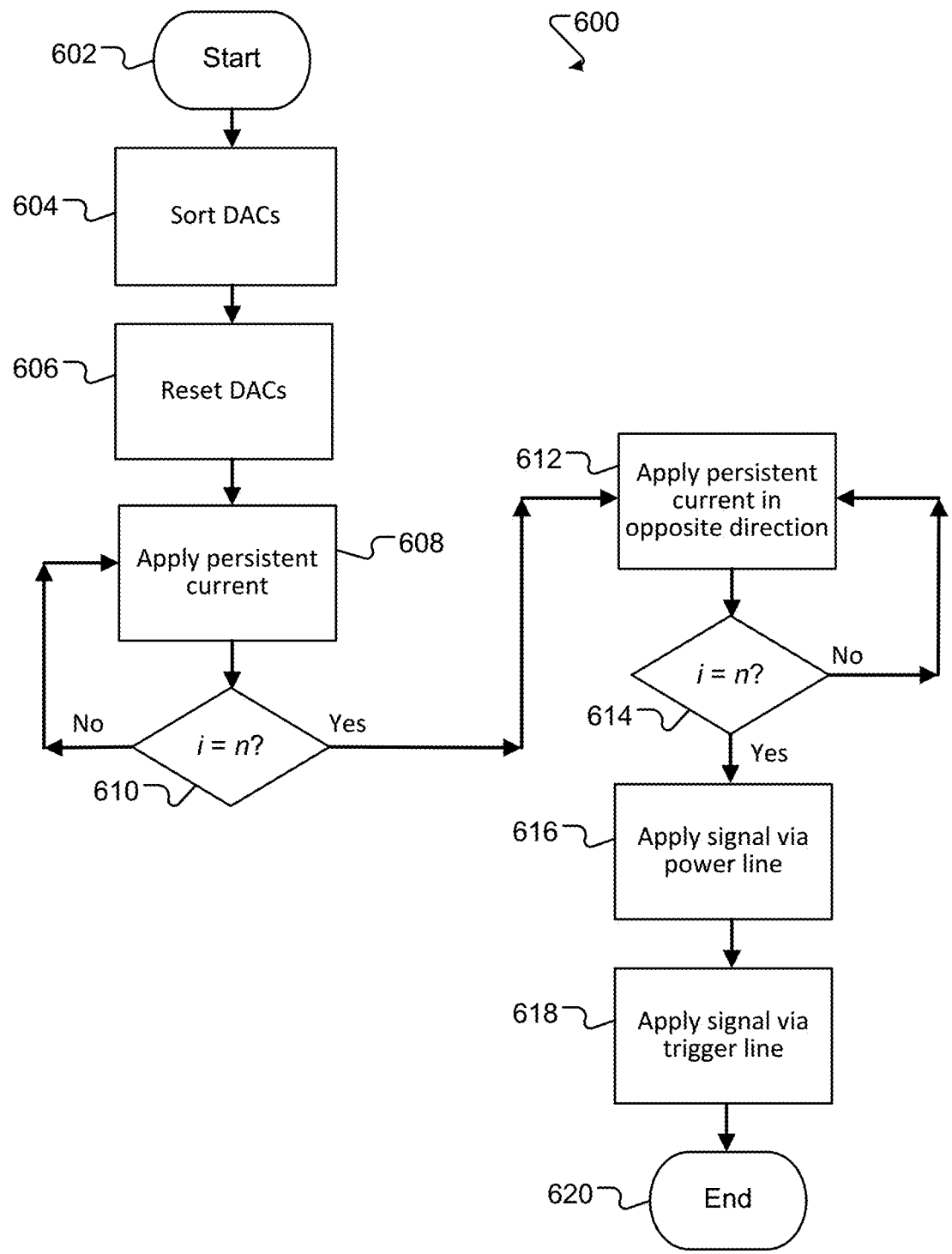
FIG. 6 shows a method of operation of a circuit employing a QFP-based shift register, which can be a generalization of the method of FIG. 4, according to at least one illustrated implementation.

FIG. 6 shows a method 600 of operation of a circuit employing a QFP-based shift register, according to at least one illustrated implementation. The method 600 can be a generalization of the method 400 (FIG. 4). The method 600 can, for example, be employed with the QFP-based shift register 200 of FIG. 2 or the QFP-based shift register 300 of FIG. 3.

To save on programming time (e.g., programming tens of thousands of qubits, 8 DACs per qubit, 16 DAC stages per qubit) the DAC stages can first be sorted by the number of pulses to be added to the respective stage (up to a maximum of single flux quanta (MAXSFQ) of, for example, about 20. Thus, there likely will be many stages with the same target number of pulses. For example, some stages may need 1 pulse, some may need 2 pulses, some other stages may need 3 pulses, etc., all the way to some stage needing 20 pulses. First, stages needing at least one pulse are selected and TRIG is pulsed once. The new pattern deselects stages which needed just one SFQ, and TRIG is pulsed twice. Notably, all others stages need 3 or more SFQ. This continues until only stages that need 20 SFQ remain, and these are subsequently selected and filled. This process in the worst case scenario requires up to MAXSFQ reprogramming cycles for the whole QFP-SR to write a new "serial program" onto the processor. This process can be further sped up by breaking QFP-SR into shorter sections, with slightly more lines going to room temperature.

The QFP-SR can also be used for qubit read-out with NDRO, rather than employing a separate structure to bring data in close to qubits to program their DACs. For reliability, a grid or array of shift register stages may be employed instead of one single long shift register. Thus, there are multiple possible paths through the QFP-SR to reach every point, and the QFP-SR can tolerate some percentage of failed devices.

The method 600 starts at 602, for example in response to application of power, submission of a problem, a request or an invocation, for example by a calling routine or program.

At 604, control circuitry sorts all of the DAC stages based on a number of quantums of flux to be loaded to the DACs. At 606, the control circuitry causes a reset of all of the DACs. To reset all of the DACs, the control circuitry may repeatedly cause application of a signal to or via the trigger line.

For an integer number i times from i equals 1 to a maximum number of quantums of flux n to be programmed, the control circuitry causes an application of a persistent current in a first direction (e.g., clockwise) to a number of the QFP-based shift registers which are coupled to respective DAC stages into which at least i quantums of flux are to be loaded at 608. If, at 610, the control circuitry determines that i<n, then control of method 600 returns to 608. If, at 610, the control circuitry determines that i=n, the control of method 600 proceeds to 612.

The control circuitry also causes an application of a persistent current in an opposite direction (e.g., counter-clockwise) to a number of the QFP-based shift registers which are coupled to respective DACs into which less than i quantums of flux are to be loaded at 612. If, at 614, the control circuitry determines that i<n, then control of method 600 returns to 612. If, at 614, the control circuitry determines that i=n, the control of method 600 proceeds to 616.

At 616, the control circuitry causes an application of a signal to or via the power line. At 618, the control circuitry causes an application of a signal to or via the trigger line. The maximum number of quantums of flux n may, for example, be between 18 and 22.

The method 600 terminates at 620, for example until called or invoked again.

Quantum Flux Parametron (QFP) Digital-to-Analog Converters (DACs) It may be desirable to achieve 4-bit control on all parameters, somewhat reduced thermal occupation of excited states compared with previous quantum processor designs, more reliable permanent magnet memory (PMM), and higher overall energy scales. At large integration scales, performance may be limited by the 4-bit control, thermal occupation, and nonlinearities on qubit Ip (which forces an increase thermal occupation by reducing energy scales to compensate and slow down processor running time).

Various significant changes to the architecture are described herein to improve qubit performance (e.g., shrink length leading to improved non-linearity of qubit Ip and faster devices), speed up calibration (e.g., no power dissipation on chip from readouts or PMM), and improve control precision (e.g., higher max-SFQ-DACs). The described platform provides a basis on which to speed up operation by employing high bandwidth lines, and via parallelized programming and readout as Input/Output (I/O) lines are freed up and/or as I/O lines are added.

Such an approach may result in much faster programming, calibration, readout, higher control precision, and larger processors. Further, with reduced power dissipation on chip, low frequency flux noise will be reduced, since free spins with an internal energy splitting of greater than for example 100 mK will no longer have thermal energy available to switch state; in other words the 1/f corner should move to lower frequency. This, combined with shorter qubits on a quantum processor chip, may enable higher control precision without having to significantly reduce fabrication noise.

While the above described performance improvements may be gained by lower temperature and shorter qubits, there are more reasons for employing the approaches described herein. Both problem solving and calibration time are principal areas for improvement. Calibration and problem solving time depend in different ways on: 1) dc SQUID readout time; 2) number of dc SQUIDs that can be read in parallel; 3) cooldown time after dc SQUID read; 4) cooldown time after PMM programming; and 5) equilibrium temperature on chip.

DAC lock-in style measurements can be employed for quantum flux parametron-DAC (QFP-DAC) calibration and offset flux measurements, roughly one third of the full calibration. For this one third of the calibration, the fourth and fifth item above will dominate the time on previous quantum processor architectures. An improved PMM may address this problem.

The remaining part of the calibration is time-limited by readouts and cooling after readouts. At least one approach described herein solves the cooling after readout limit and can also reduce the readout time.

The designs described herein may facilitate parallel calibration and parallel readout, allowing quantum processors with 1000 qubits or more to be calibrated and operable in finite time.

Problem solving time at all moderate integration scales will depend on qubit length (sets energy scale), temperature (item five above; via required repetitions), and at the smaller scales it will depend on readout time, and in some parametric ranges PMM programming time.

Various embodiments of a QFP-Demux and DAC are described herein, which should perform as well as existing SFQ-DACs but advantageously dissipate no power, thus removing several significant portions of current cycle time. This QFP-DAC/DEMUX does not actually improve loading time, and in fact it is slightly slower for the same I/O lines. Improvements to I/O lines and parallel loading is the one way to speed this up. Final parametric design of the QFP-DAC/DEMUX is driven significantly by fabrication capabilities.

A new readout scheme is also described, which should allow reading qubits out in parallel, as well as reading qubits out at a much higher rate than existing designs (e.g., about 100× faster). Design parameters in this readout scheme are set out.

To deal with the supposed requirement, lock-in measurements can be run on the DAC where a DAC has to quickly flip the state, a non-dissipative PMM scheme is proposed in this section which removes the need for the 10s of ms cooling between the measurements now needed and makes the measurement limited by Input/Output (I/O) bandwidth or readout time.

Figure 7A:
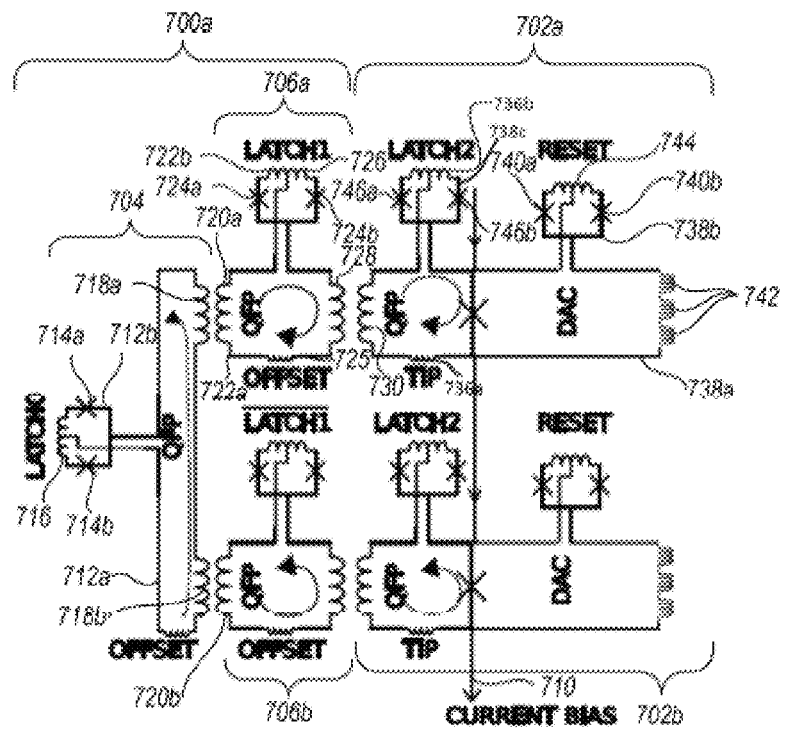
FIG. 7A shows a latch controlled quantum flux parametron demultiplexer (QFP-Demux) circuit coupled to digital-to-analog converters (DACs), according to at least one illustrated implementation.

The circuit illustrated in FIG. 7A generates the multiple flux quanta required for the DACs from the QFPs for use with a QFP demultiplexer tree. FIG. 7A shows part of the final branch of the demultiplexer tree addressed by LATCH1 and $\overline{\text{LATCH1}}$ The OFFSET signal is chosen to be the "off" direction of the QFP and is larger than the flux coupled between QFPs. Operation in this small circuit is: Set OFFSET to 0, apply LATCH1, Set offset to large value, apply $\overline{\text{LATCH1}}$. When a LATCH signal is applied, that means one moves it from $\Phi 0/2$ to $\Phi 0$, and when one is not applied it stays at $\Phi 0/2$. This can easily be achieve with only one line per level of the demux tree with an additional shared LATCH "offset" line (except the LATCH "offset" is time dependent).

Then, LATCH2 is asserted with no input at TIP. In principle, one could combine the last two QFP stages. Only one of the left hand parts of the QFP-DACs now has a positive (negative) flux quantum in it, and the rest have negative (positive) flux quanta. An input bias current is applied to the current bias shared by all DAC junctions. This can be done since only one DAC will switch at a time. Finally, a tipping pulse is applied which adds to the signal in the selected DAC and subtracts from all others. The selected DAC will have its critical current exceeded momentarily, thus shuffling the flux quanta from the QFP DAC loop into the DAC. The others will not. The LATCH2/TIP cycle can be repeated to load as many flux quanta as desired into the DAC without having to re-run the demultiplexer tree.

Since the quantum flux parametron QFP-DAC requires no power on chip, the current Ic of all junctions can be increased almost for free, although such might require a new trilayer at some point to limit growth of demux/DACs as the DAC become junction size limited. This allows reduction of inductances of DACs, shrinking the footprint of the DACs and shrinking qubit length. Such can advantageously lead to better qubits and faster processors. Notably, another metal layer or trilayer may be needed in order to implement the smaller DACs. An improved reset approach, discussed herein, may facilitate the concurrent decrease in DAC step size and improvement in precision.

Quantum flux parametron digital-to-analog converters (QFP DACs) advantageously facilitate the use of very small signals (QFP signal) into a multi-flux-quantum DAC. Such may advantageously be employed, for example, in large adiabatic quantum processors, or any quantum processor where quasi-dc magnetic fields are employed. Such can be employed with high bandwidth lines to run at multiple-GHz update rates, for example in a finite sized tree with DACs updated at hundreds of MHz rates.

FIG. 7A shows a latch controlled quantum flux parametron demultiplexer (QFP demux) circuit 700a coupled to QFP-digital-to-analog converters (QFP-DACs) 702a, 702b, according to at least one illustrated implementation. In particular, FIG. 7A shows a last stage of a QFP demux tree.

The latch controlled QFP demux circuit 700a includes a number of QFPs 704 (one shown), and for each QFP 704, a number (e.g. two) of sets or sequences of quantum flux parametron latches (QFP-latches) 706a, 706b (each sequence illustrated in FIG. 7A with only one QFP-latch). Each set or sequence of QFP-latches 706a, 706b is selectively operable to communicatively couple flux between the QFP 704 and a respective one of a first QFP-DAC 702a and a second QFP-DAC 702b of the respective pair of QFP-DACs 702a, 702b. A current bias line 710 is positioned to apply a current bias to at least both of the QFP-DACs 702a, 702b of the pair of the QFP-DACs 702, advantageously without any bias resistors.

The QFP-DACs 702 include an asymmetric DC SQUID (illustrated on the right hand side of FIG. 7A) connected by a current bias. It may be possible to remove the current bias and use a magnetic bias into a CJJ. Without that, the current bias needs no bias resistors advantageously resulting in no heat, but does require biasing all QFP-DACs 702 in series. Notably, the bias line 710 can be used to address different trees as well.

The QFP 704 can serve as an input or a node in a tree structure, between branches of the tree structure. The QFP 704 includes a first loop of material 712a, a second loop 712b of material that interrupts the first loop of material 712a, and a pair of Josephson junctions 714a, 714b that interrupt the second loop of material 712b. The second loop 712b includes an interface (e.g., inductive interface) 716 that receives a signal, for example signal denominated as LATCH0. The first loop of material 712a includes a pair of interfaces (e.g., inductive interfaces) 718a, 718b positioned to communicatively couple a signal (e.g., flux) to interfaces 720a, 720b of respective first QFP latches 706a, 706b of the first set or sequence and the second set or sequence of QFP latches 706a, 706b (only one shown in each set or sequence). The first and second loops of material 712a, 712b of the QFP 704 can, for example, be a material that is superconductive at or below a critical temperature.

The first QFP latches 706a, 706b of the first and second set or sequence of QFP latches 706a, 706b each include a first loop of material 722a (only one called out in FIG. 7A), a second loop of material 722b (only one called out in FIG. 7A) that interrupts the first loop of material 722a, and a pair of Josephson junctions 724a, 724b (only one pair called out in FIG. 7A) that interrupt the second loop of material 722b.

The first loop includes an interface (e.g., inductive interface) 725 that receives a signal, for example signal denominated as OFFSET. The second loop 722b includes an interface (e.g., inductive interface) 726 that receives a signal, for example a signal denominated as LATCH1 or $\overline{\text{LATCH1}}$. Opposite current flows (e.g., clockwise and counterclockwise, as illustrated by arrows in the first loops 722a of the first QFP latches 706a, 706b) can be established in the first loops 722a by applying opposite signals LATCH1 or $\overline{\text{LATCH1}}$ to the interfaces 726 of the second loops 722b of the first QFP latches 706a, 706b. The first loop of material 722a includes a further interface (e.g., inductive interface) 728 (only one called out in FIG. 7A) positioned to communicatively couple a signal (e.g., flux) to interfaces 730 (only one called out in FIG. 7A) of either respective second QFP latches of the sets or sequences of QFP latches 706a, 706b or of the QFP-DACs 702a, 702b. The first and second loops 722a, 722b of material of the first QFP latch 706a, 706b can, for example, be a material that is superconductive at or below a critical temperature.

The QFP-DACs 702a, 702b each include a first loop of material 738a (only one called out in FIG. 7A), a second loop of material 738b (only one called out in FIG. 7A) that interrupts the first loop of material 738a, and a pair of Josephson junctions 740a, 740b (only one pair called out in FIG. 7A) that interrupt the second loop of material 738b. The first loop 738a includes a number of interfaces (e.g., three inductive interfaces) 742, for example to read out a signal stored in the QFP-DACs 702a, 702b. The second loop 738b includes an interface (e.g., inductive interface) 744 that receives a signal, for example a signal denominated as RESET, operable to reset a value of the QFP-DACs 702a, 702b. The sets or sequences of QFP latches 706a, 706b are operable to demux a signal received via the QFP 704 into the QFP-DACs 702a, 702b, which can eventually be read out of the QFP-DACs 702a, 702b. The first and second loops of material of the QFP-DACs 702a, 702b can, for example, be a material that is superconductive at or below a critical temperature.

The QFP-DACs each include a third loop of material 738c (only one called out in FIG. 7A) that interrupts the first loop of material 738a, and a pair of Josephson junctions 746a, 746b (only one pair called out in FIG. 7A) that interrupt the third loop of material 738c. The first loop 738a includes an interface (e.g., inductive interface) 736a that receives a signal, for example signal denominated as TIP. The third loop 738c includes an interface (e.g., inductive interface) 736b that receives a signal, for example a signal denominated as LATCH2. Opposite current flows (e.g., clockwise and counterclockwise, as illustrated by arrows in the first loops 738a of the QFP-DACs 702a, 702b) can be established by establishing opposite current flows in the first loops 722a of the QFP latches 706a, 706b. The first, second, and third loops of material 738a, 738b, 738c of the QFP-DACs 702a, 702b can, for example, be a material that is superconductive at or below a critical temperature.

Figure 7B:
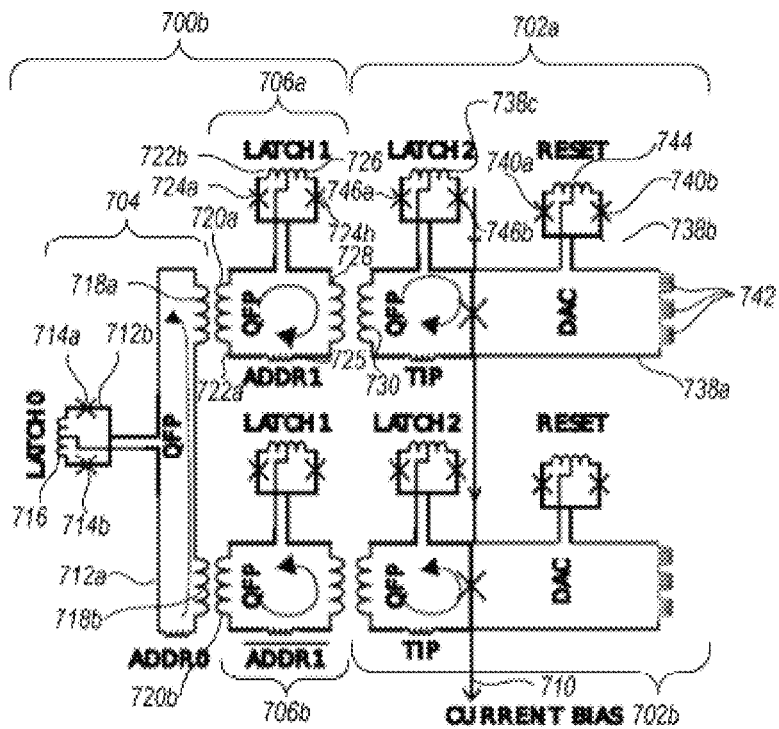
FIG. 7B shows a body flux (address) controlled quantum flux parametron demultiplexer (QFP-Demux) circuit coupled to digital-to-analog converters (DACs), according to at least one illustrated implementation.

FIG. 7B shows a body flux (address) controlled quantum flux parametron demultiplexer (QFP-Demux) circuit 700b coupled to digital-to-analog converters (DACs), according to at least one illustrated implementation. In particular, FIG. 7B shows a last stage of a QFP demux tree.

Many of the structures illustrated in FIG. 7B are similar or even identical to those illustrated in FIG. 7A, and are thus denominated with the same reference numbers. In the interest of conciseness and hence clarity, only significant differences between FIG. 7B and FIG. 7A are discussed immediately below.

In contrast to the implementation of FIG. 7A, the implementation of FIG. 7B applies the same LATCH1 signal to both first QFP latches 706a, 706b, and instead of applying the same OFFSET signal to both first QFP latches 706a, 706b, controls the direction of current flow by applying opposite address signals denominated as ADDR1 and $\overline{\text{ADDR1}}$ to first QFP latches 706a, 706b via address lines.

Note that the demultiplexer works as well in broadcast mode, and also one can generate signals starting in the middle of the tree using the OFFSET line. One can load positive and negative pulses. Reset is accomplished in the same way as with a SFQ-DAC. Optionally, all of the QFP-DACs can be unloaded by over-biasing the Josephson junction of the QFP-DAC, and then causing the bias current to fluctuate while the Josephson junctions of the QFP-DACs are suppressed to allow escape of metastable magnetic flux quanta. Enough fluctuations of the bias current may result in a known state.

The QFP demux can be collapsed by approximately 5 bits by using direct addressing (see FIG. 7B). For example, five address lines can be summed logarithmically into a QFP body. This may be advantageously employed to handle the physically large part of the tree (e.g., the first few addresses).

In some implementations, the QFP-DAC is run in uncontrolled MFQ mode to increase loading speed by unshunting the DAC junction and over current biasing during tipping. This may, for example, be useful for QFP-DACs used just as nonlinear amplifiers in the readout chain.

The implementation of LATCH and $\overline{\text{LATCH}}$ pairs is optimally done via a global LATCHOFFSET line (not shown in FIG. 7B) and a single LATCH per tree level.

The LATCH addressed demultiplexer can be run as a multiplexer, which could be used for readout.

Further, if truly line limited, the compound Josephson junctions (CJJs) of the QFP DAC could intentionally be asymmetrized, allowing omission of the global offset line in the LATCH addressed implementation (FIG. 7A). Such would, however, result in reduced margins since one cannot toggle the "offset" on and off anymore.

As designed, the QFP demux circuit can have a loading bandwidth of one third to one half that of a comparable SFQ demux circuit.

A new reset approach can be implemented as part of the QFP demux circuit of FIGS. 7A and/or 7B. In particular, such can employ four shunted junctions in parallel with each loop, biased equally to provide an improved reset than might otherwise be realized. This can be effectively thought of as a DC SQUID where both the junctions and the main loop are suppressed. Suppression of the junctions removes asymmetry issues and beta limited modulation. It appears to be somewhat better than a normal shunted reset in the presence of asymmetry. With the QFP-DAC, MAX-SFQ may be able to be significantly over-designed without any penalty and, thus, may reduce the reset junction sizes and win more reliable reset that way. The benefit of this reset is that it resets to zero flux quanta even for significant asymmetry in the loop while the shunted two junction reset has a final state dependent on asymmetry of the two junctions.

The use of sufficiently short power pulses for fast lock-in style measurements may facilitate a reduction in the typical cooling time employed with permanent magnetic memory, for example from tens of milliseconds to tens of microseconds.

Figure 8:
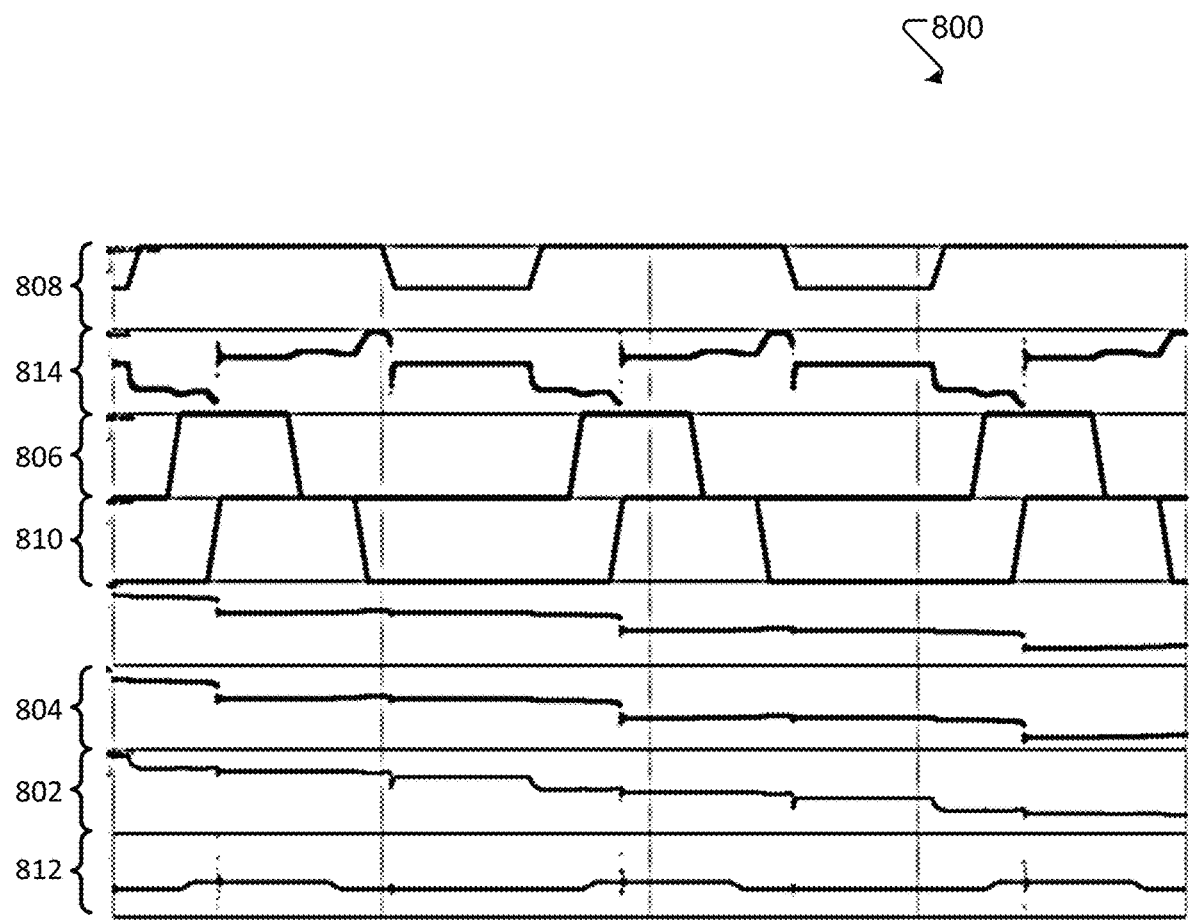
FIG. 8 is a graph of a plot of signals associated with the latch controlled QFP-Demux circuit of FIG. 7A, according to at least one illustrated implementation.

FIG. 8 shows a plot 800 of signals associated with the latch controlled QFP demux circuit of FIG. 7A.

In particular, the plot 800 is a WRSPICE simulation of the QFP-DAC without the demux; the demux is simulated as a flux input.

The plot 800 shows the value of the phase 802 and the current 804 near the bottom of the plot 800, as three pulses are loaded into the QFP-DAC. The plot 800 also shows the value of a fake demux input signal 806, the latch signal 808, and tipping pulse 810, and the bias current 812. The plot 800 also shows the value of the QFP junction phase 814. Note the reset is noisy on the QFP-DAC because the correct input signal was not applied via the tip line to make the QFP-DAC run reversibly, thus the QFP-DAC loading is not adiabatic. If the input signal (fake last demux stage) is reversed, no flux is pumped into the loop.

Multi Junction Superconductive Quantum Interface Device (SQUID) Flux-Pump Useful for Multi-Phase Flux DAC Addressing with No Galvanic Select An existing architecture uses an X-Y-Z addressing scheme to select DACs for programming. One of these lines, sometimes denominated as the POWER line, is galvanically connected to the DAC SQUID loop. However, the galvanic connection from the POWER line to the DACs makes awkward some alternative intra-DAC coupling schemes such as, for example, galvanically shared inductance, such as one might otherwise be able to do if using a Josephson DAC, or DAC constructed from a high kinetic inductance material.

The other two lines, denominated as ADDRESS and TRIGGER, are degenerate in their action on selecting the DAC, meaning that when the sum of their biases crosses a threshold value, selection of that DAC is enabled (contingent on POWER). At the operating point, the POWER signal is not orthogonal from ADDRESS and TRIGGER lines. The operating margins using three relatively non-orthogonal biases in this way are in some sense reduced over what they might be were one to use X-Y addressing, and this approach would, thus, not scale well to higher dimensional addressing schemes, with the available operating margins decreasing something like 1/(number of addressing dimensions).

Both of these problems are ameliorated to some extent by the addressing scheme described below, as: (1) no galvanic connection to the DAC by addressing circuit is required; and (2) the control signals of a flux pump are relatively more orthogonal.

Figure 9:
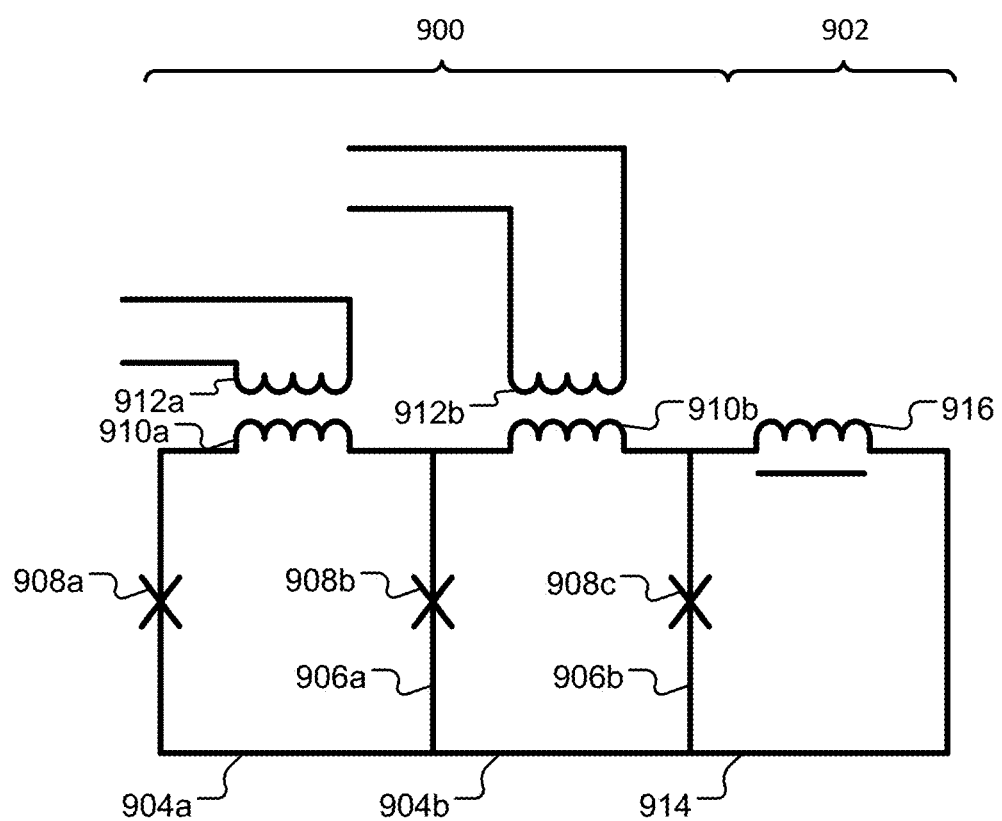
FIG. 9 shows a three-junction two-loop flux pump addressing a digital-to-analog converter (DAC), according to at least one illustrated implementation.

FIG. 9 shows a three-junction two-loop flux pump circuit 900 addressing a digital-to-analog converter (DAC) 902, according to at least one illustrated implementation.

The illustrated three-junction two-loop flux pump circuit 900 includes two loops 904a, 904b (collectively 904). Each of the loops 904 has a shared portion 906a, 906b (collectively 906) shared by a successively adjacent one of the loops 904. The three-junction two-loop flux pump circuit 900 includes three Josephson junctions 908a, 908b, 908c. Each of the shared portions 906 of the loops 904 shared by the successively adjacent one of the loops 904 is interrupted by a respective one of the Josephson junctions 908a, 908b, 908c. Each of the loops 904 of the three-junction two-loop flux pump 900 has a respective storage inductance 910a, 910b.

Two interfaces 912a, 912b are positioned with respect to respective storage inductances 910a, 910b of the loops 904 to selectively communicatively couple a flux $\Phi_{xa}$, $\Phi_{xb}$ therewith. Each loop 904 may be comprised of a material that superconducts at least at a critical temperature.

A DAC 902 is coupled to an end most one of the loops 904b of the first multi junction SQUID flux-pump circuit 900. The loop of The DAC includes a loop 914 that includes a shared portion 906b that is shared by the end most loop 904b of the first multi junction SQUID flux-pump circuit 900. The DAC 902 includes a storage inductance 916. The storage inductance 916 of the DAC 902 is at least one of a magnetic inductance, a kinetic inductance, a Josephson inductance, or a combination of two or more of a magnetic inductance, a kinetic inductance, and a Josephson inductance. The DAC 902 may be comprised of a loop of a material that superconducts at least at the critical temperature.

Figure 10:
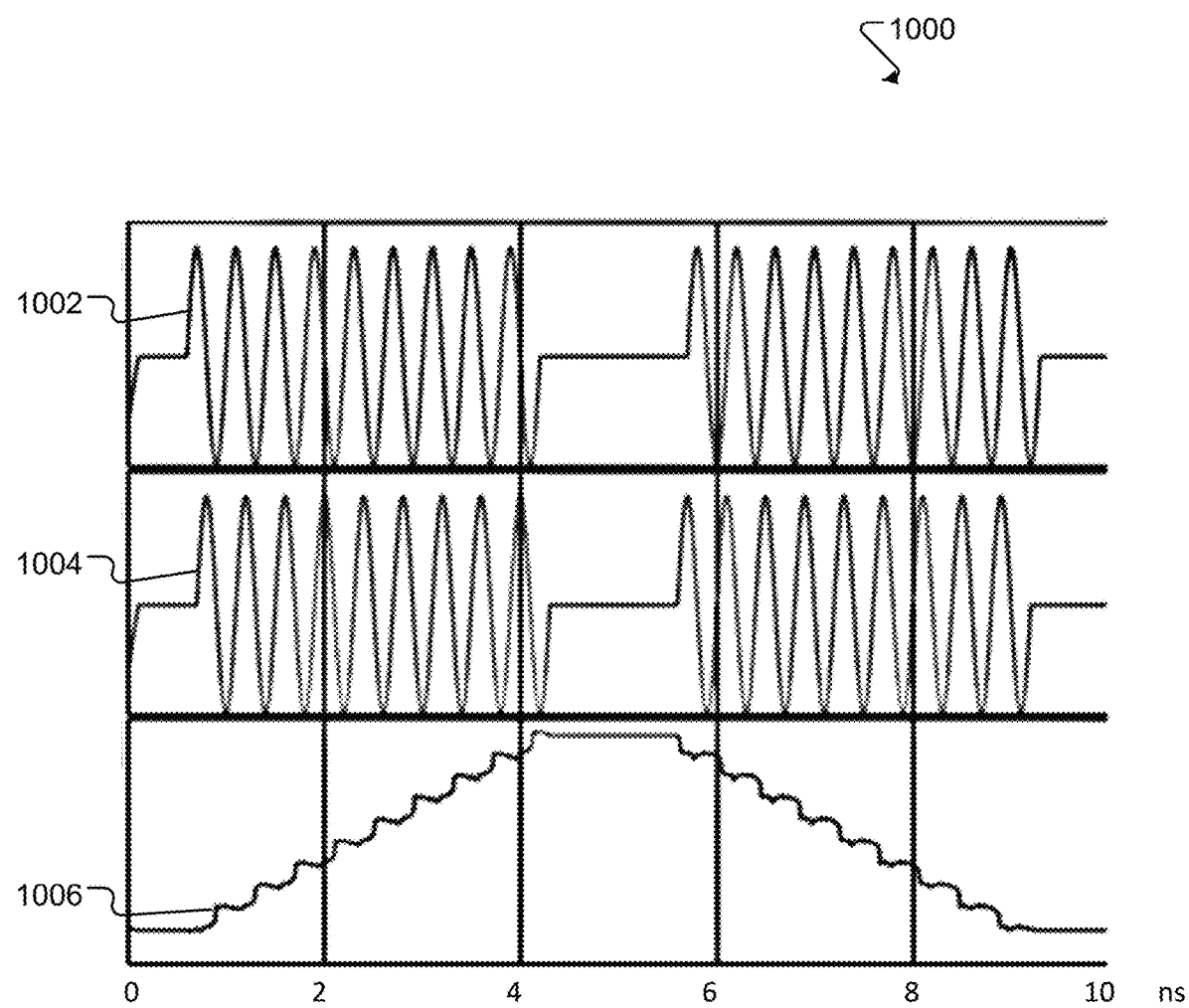
FIG. 10 is a graph showing a plot of applied flux waveforms and Josephson phase of the end-most junction for programming/deprogramming pattern for the three junction two-loop flux pump of FIG. 9, according to at least one illustrated implementation.

FIG. 9 shows the most basic incarnation, where a two loop, three-junction flux pump is connected to a single superconducting storage inductor. The size of the inductor and flux-pump junctions determine the maximal useful capacity of the DAC. FIG. 10 shows a programming/deprogramming pattern, applied flux waveforms 1002 and 1004, for the three-junction two-loop flux pump of FIG. 9. The Josephson phase 1006 of junction 908c of FIG. 9, also shown, is $2\pi$ times the total number of flux quanta in the loop.

One mode of programming operation, illustrated in FIG. 10, shows how applied flux $\Phi_{xa}$, can be used to push flux into and out of the 908a/908b loop, which applied flux $\Phi_{xb}$, can be used to do so for the 908b/908c loop. If operated together, with the phase of clock $\Phi_{xa}$, advanced relative to $\Phi_{xb}$ by $\pi/2$, flux will be pushed through the pump into the DAC with one $\Phi_0$ per cycle of programming signal. If $\Phi_{xa}$ is retarded by $\pi/2$ relative to $\Phi_{xb}$, flux will be pumped out of the loop, or negative flux pumped in. The three clock pulse bursts in FIG. 10 show $N\Phi_0$ being pumped into the loop, $2N\Phi_0$ being pumped out, and $N\Phi_0$ being pumped back in.

Figure 11:
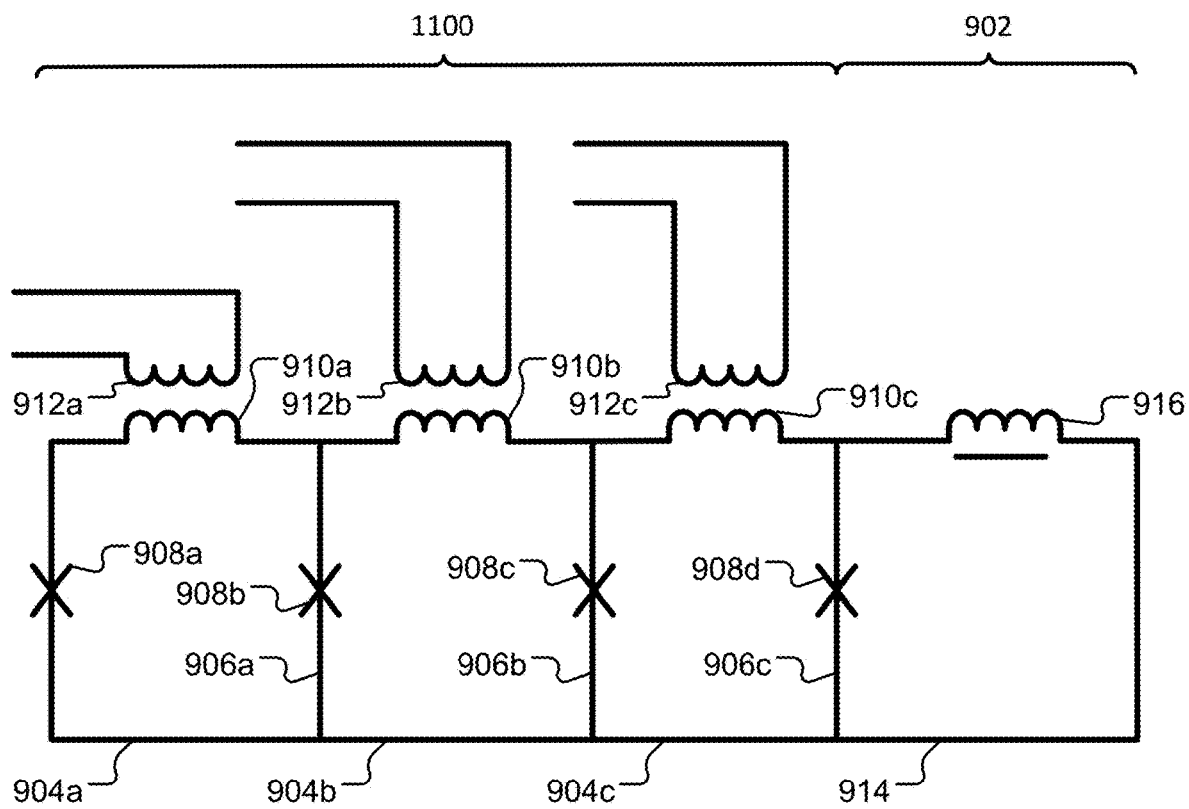
FIG. 11 is a schematic diagram of a four-junction three-loop flux pump circuit addressing a digital-to-analog converter (DAC), according to at least one illustrated implementation.

FIG. 11 shows a four-junction three-loop flux pump circuit 1100 addressing a digital-to-analog converter (DAC) 902, according to at least one illustrated implementation.

The four-junction three-loop flux pump circuit 1100 is similar to the three-junction three-loop flux pump 900 (FIG. 9) but adds a loop thereto. Similar or even identical structures are identified using the same references numbers as used in FIG. 9 and the accompanying discussion of FIG. 12. In the interest of conciseness and hence clarity, only significant differences between FIG. 11 and FIG. 9 are discussed immediately below.

As illustrated the four-junction two-loop flux pump adds a third loop 904c, a fourth Josephson junction 908d, and a third storage inductance 901c in the third loop 904c. A third interface 912c is positioned with respect to the third storage inductance 910c to selectively communicatively couple a flux $\Phi_{xc}$ therewith. As previously noted, each loop 904 may be comprised of a material that superconducts at least at a critical temperature.

Figure 12:
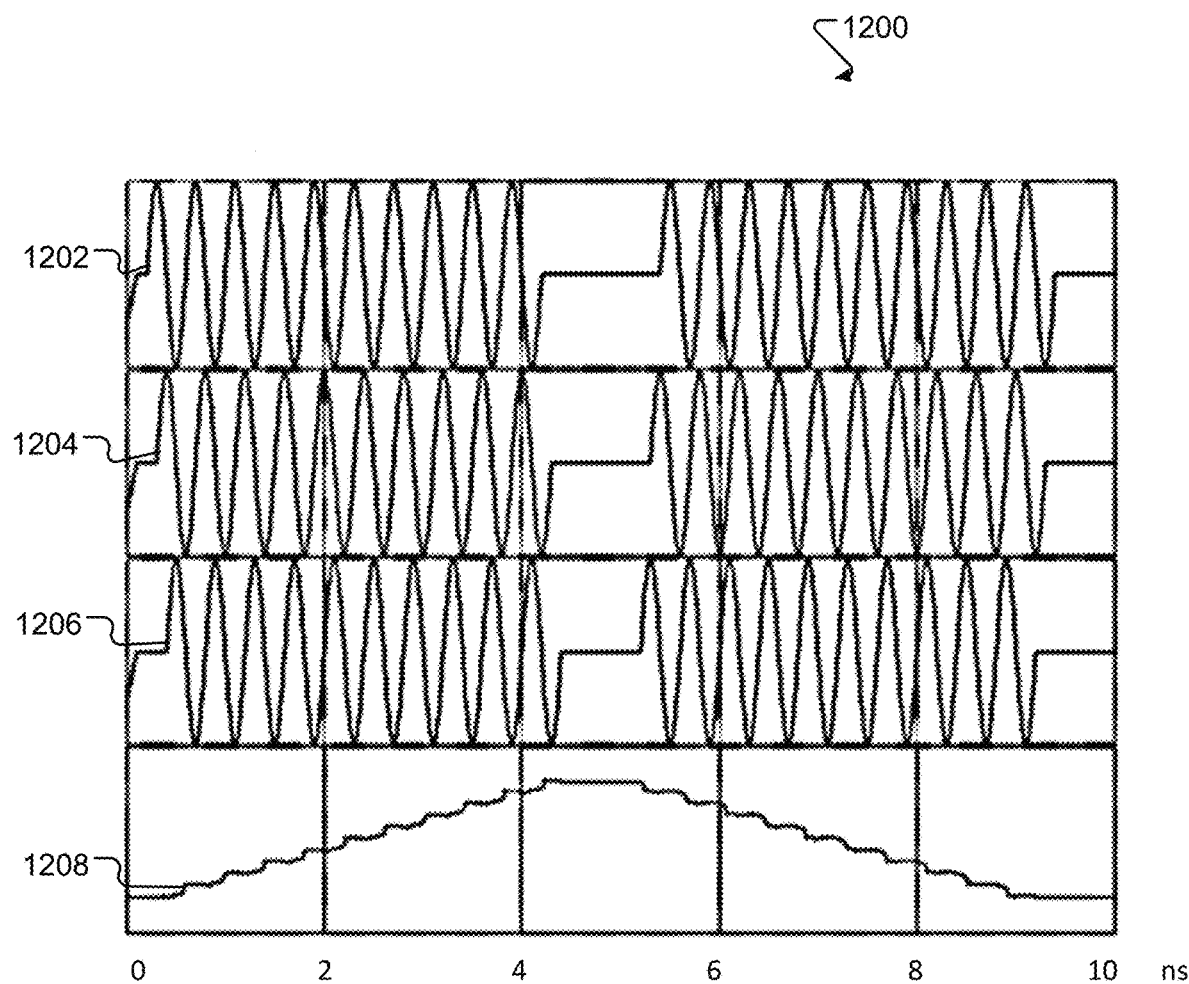
FIG. 12 is a graph showing a plot of applied flux waveforms and Josephson phase of the end-most junction for programming/deprogramming pattern for the four-junction three-loop flux pump of FIG. 11, according to at least one illustrated implementation.

FIG. 12 shows a plot 1200a of applied flux waveforms 1202 to 1206 and a Josephson phase 1208 of the end-most junction 908d for programming/deprogramming pattern for the four-junction three-loop flux pump of FIG. 11, according to at least one illustrated implementation.

While illustrated with two loops and three Josephson junctions as well as with three loops and four Josephson junctions, the teachings herein are extendible to even more loops and Josephson junctions. Increasing the number of loops may make it possible for flux to be stored within the pump without applied bias, and activation of a few of the clocks would be enough to put the flux in the loops.

One of the advantages of avoiding a galvanic select line (e.g., POWER line in at least some existing implementations) is that such allows successive DAC storage loops to be galvanically connected without being concerned about other galvanic connections on the source side, which might in turn result in other undesired current return paths. This could be of particular benefit for multistage DACs with kinetic inductance based storage elements, such as with a Josephson DAC or large A thin film TiN, NbN, NbTiN, or granular aluminum. In this case, the design of the division ratio may be simplified by using shared inductance in articulated storage loops, rather than having each magnetically coupled into an articulated washer as is done in at least some existing architectures.

Figure 13:
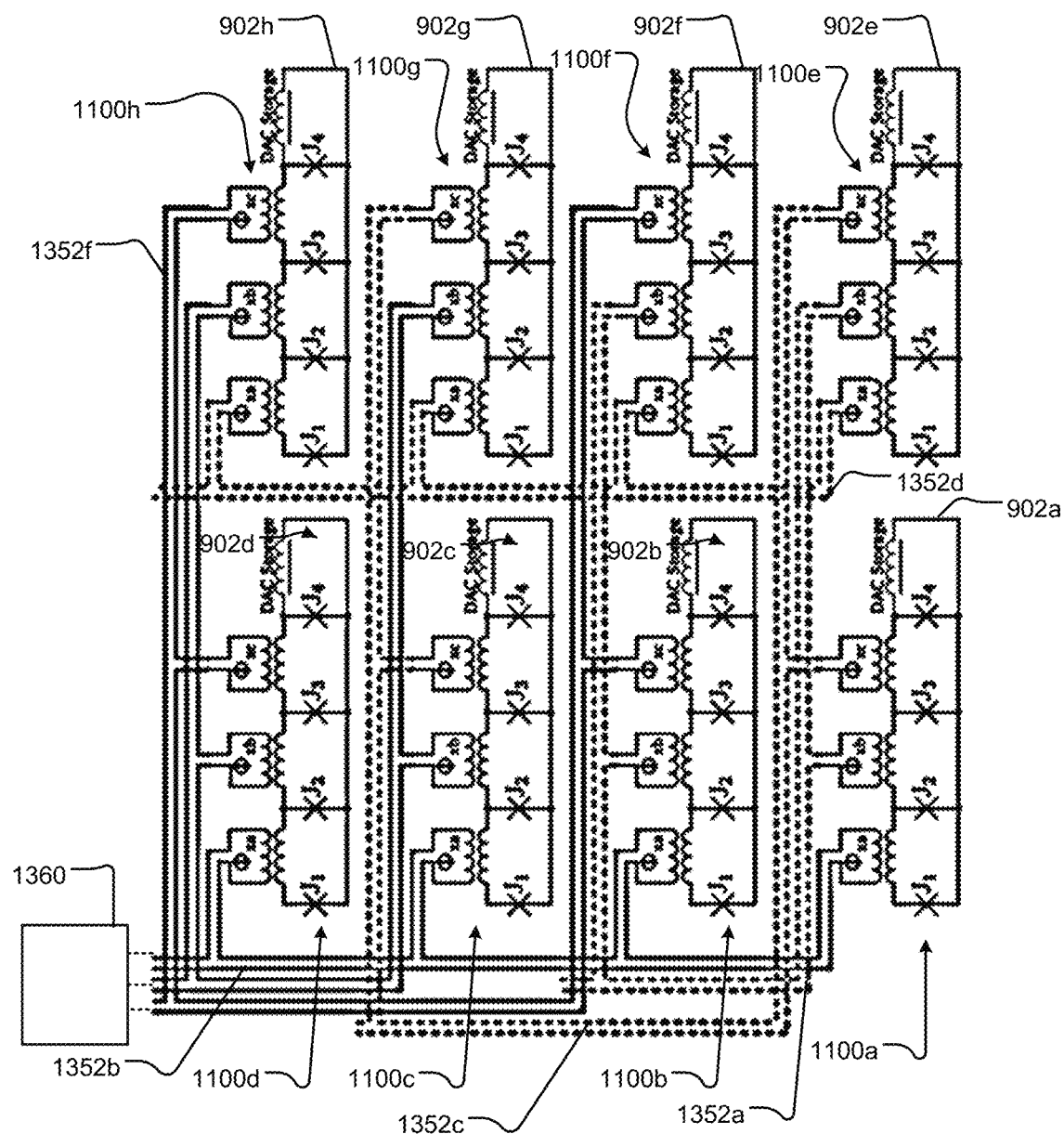
FIG. 13 is a schematic diagram of eight sets of four-junction three-loop flux pump circuits addressing respective digital-to-analog converters (DACs), via a number of address lines, according to at least one illustrated implementation.

With multiple phases, an X-Y-Z addressing scheme is possible, for example as illustrated in FIG. 13. FIG. 13 shows eight sets of four-junction three-loop flux pump circuits 1100a, 1100b, 1100c, 1100d, 1100e, 1100f, 1100g, 1100h (collectively 1100) addressing respective digital-to-analog converters (DACs) 902a, 902b, 902c, 902d, 902e, 902f, 902g, 902h (collectively 902), via a number of address lines 1352, according to at least one illustrated implementation.

The four-junction three-loop flux pump circuits 1100 may, for example, be identical to the four-junction three-loop flux pump circuit 1100 (FIG. 11). The DACs 902 may, for example, be identical to the DACs 902 (FIG. 11). Similar or even identical structures are identified using the same references numbers as used in FIG. 11 and the accompanying discussion of FIG. 14. In the interest of conciseness and hence clarity, description of the structure will not be repeated, and the description will focus on the X-Y-Z addressing scheme used to address the set or array of four-junction three-loop flux pump circuits.

In particular, eight DACs 902 are addressed with eight three-phase flux pumps 1100, operated by (2+2+2) clock lines. Among the set of devices, a particular phase is operated by one of N lines (two in FIG. 13, indicated by solid vs dashed). Making the selection possible, lines for each phase completely specify which DAC is addressed. A selection is made at each phase, choosing between solid or dashed line of each color.

A first set of control lines may include a first subset of control lines to address a first subset of the multi junction SQUID flux-pump circuits, for example a first column of multi junction SQUID flux-pump circuits 1100a-1100d, and a second subset of control lines to address a second subset of the multi junction SQUID flux-pump circuits, for example a second column of multi junction SQUID flux-pump circuits 1100e-1100h.

For example, the first subset of control lines may include a first control line 1352a coupled to respective interfaces of a first loop of each multi junction SQUID flux-pump circuit 1100a-1100d of the first subset, a second control line 1352b coupled to respective interfaces of a second loop of each multi junction SQUID flux-pump circuits 1100a-1100d of the first subset, and a third control line 1352c coupled to respective interfaces of a third loop of the multi junction SQUID flux-pump circuits 1100a-1100d of the first subset.

For example, the second subset of control lines may include a first control line 1352d coupled to respective interfaces of a first loop of each multi junction SQUID flux-pump circuit 1100e-1100h of the second subset, a second control line 1352e coupled to respective interfaces of a second loop of each multi junction SQUID flux-pump circuits 1100e-1100g of the second subset, and a third control line 1352f coupled to respective interfaces of a third loop of the multi junction SQUID flux-pump circuits 1100e-1100h of the third subset.

The first set of control lines 1352a-1352f (collectively 1352) may include a number $N_{ctrl}$ of control lines, where $N_{ctrl}=2\times N$, and where there are total number $N_{fp}$ of multi junction SQUID flux-pumps and $N_{fp}$ is equal to $2(N+1)$.

Control circuitry 1360 is communicatively coupled and operable to implement a multi-phase radio frequency (RF) clocking of flux signals with no direct current (DC) bias to the loops of the multi junction SQUID flux-pump circuits 1100.

The multi-phase radio frequency (RF) clocking of flux signals pushes flux sequentially through the loops of the first multi junction SQUID flux-pump into the DAC 902. The multi-phase radio frequency (RF) clocking of flux signals pushes flux sequentially through the loops of the multi junction SQUID flux-pump circuit(s) 1100 out of the DAC 902. A total number of phases of the multi-phase radio frequency (RF) clocking of flux signals is equal to the total number N of loops of the multi junction SQUID flux-pump circuit(s) 1100 into the DAC 902.

For example, the control circuitry 1360 may sequentially apply flux signals to successive loops of the multi junction SQUID flux-pump circuit(s) 1100 via a first number N of interfaces where a respective flux signal applied to each interface is advanced by $\pi/2$ with respect to a respective flux signal applied to an immediately following loop along a linear succession of the loops the multi junction SQUID flux-pump circuit 1100.

Also for example, the control circuitry 1360 may sequentially apply flux signals to successive loops of the multi junction SQUID flux-pump circuit(s) 1100 via the first number N of interfaces where a respective flux signal applied to each interface is retarded by $\pi/2$ with respect to a respective flux signal applied to an immediately following loop along a linear succession of the loops the multi junction SQUID flux-pump circuit(s) 1100.

In general, with an n-phase clocking scheme, an incomplete pattern (e.g. a pattern missing a clock signal on one or more of the phases) will interfere with transmitting the flux quanta through the pump. At least for some parameter values, and for some combinations of clocks, this interference is not complete, and partial clocking can transmit pulses. However, blocking pulses can advantageously be used on an otherwise quiescent line to effect, for example, normal X-Y-Z select behavior. This is shown in the plot 1400 of FIG. 14.

Figure 14:
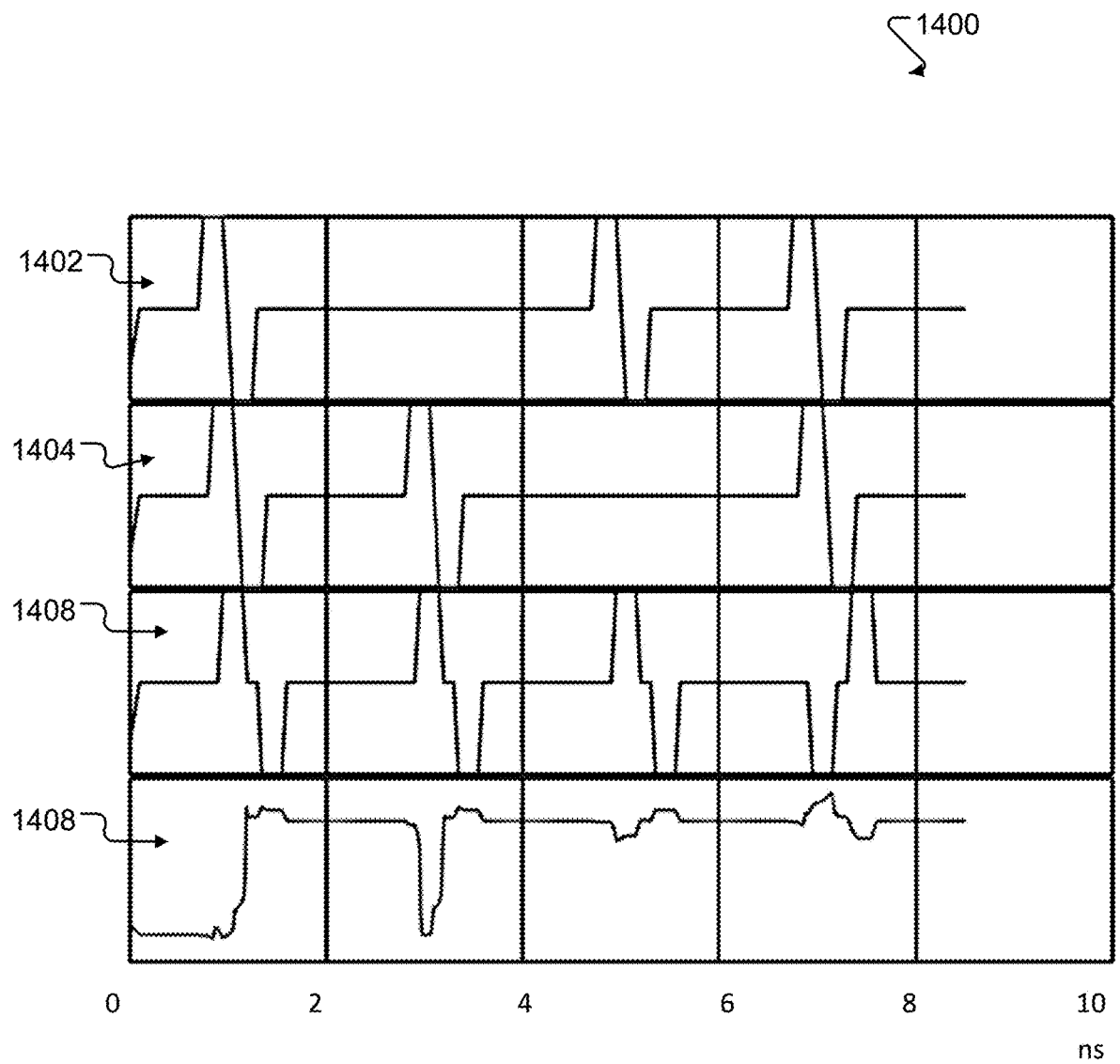
FIG. 14 is a graph showing a plot of applied flux waveforms and a Josephson phase of the end-most Josephson junction for programming/deprogramming pattern for the four-junction three-loop flux pump of FIG. 11, according to at least one illustrated implementation.

FIG. 14 shows a plot 1400 of applied flux waveforms and a Josephson phase of the end-most junction 908d for programming/deprogramming pattern for the four-junction two-loop flux pump of FIG. 11, according to at least one illustrated implementation.

In particular, the plot 1400 shows three clock signals 1402, 1404, and 1406, and one phase 1408 of the last-most Josephson junction 908d in the flux pump, demonstrating the X-Y-Z select capability. Notably, the last sequence employs a blocking pulse of opposite magnitude on the third clock phase.

The sequence shows one successful addressing of the DAC, with the attendant phase advance in the flux pump's output junction, and three partial (⅔) selects which do not result in phase advance. The third partial select is the challenging case, and requires a blocking pulse (clock pulse with the opposite magnitude) to prevent addressing the DAC. The requirement of a blocking pulse does not limit the X-Y-Z addressing scheme, although it would apply an additional constraint in computing parallel DAC loading schemes.

FIGS. 9-14 and the accompanying discussion make clear that at least a multi junction superconducting quantum interface device (SQUID) flux-pump can comprise: a number N of loops where N is an integer greater than or equal to two and each loop comprises a material that superconducts at least at a critical temperature, each of the loops having a portion shared by a successively adjacent loop, a number M of Josephson junctions, where M is greater than N, each of the portions of the loops shared by the successively adjacent loop interrupted by at least one of the Josephson junctions, each of the loops having a respective storage inductance; and a first number N of interfaces positioned with respect to respective loops to selectively communicatively couple a flux therewith. The loops of the multi junction SQUID flux-pump form a linear array of loops. The number N may be an integer, for example, from 2 to 4 inclusive. The number M is equal to the sum N+1.

A DAC is coupled to an end most loop of the multi junction SQUID flux-pump, the DAC comprising a loop of a material and a storage inductance. The loop of the DAC includes a portion shared by the end most loop of the multi junction SQUID flux-pump. The interfaces may each be a respective inductive interface positioned proximate the storage inductances of respective loops of the multi junction SQUID flux-pump.

Figure 15:
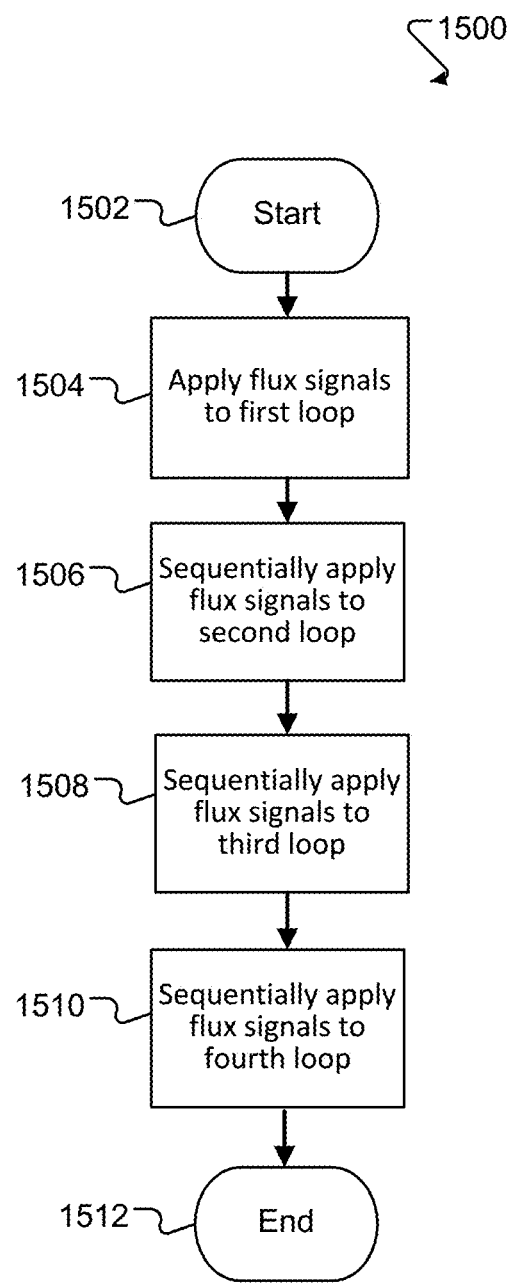
FIG. 15 is a flow diagram of a method of operating a plurality of multi-junction superconducting quantum interface device (SQUID) flux-pumps, according to at least one illustrated implementation.

FIG. 15 shows a method 1500 of operating a plurality of multi junction superconducting quantum interface device (SQUID) flux-pumps, according to at least one illustrated implementation.

The method starts at 1502, for example on application of power, submission of a problem, or invocation by a calling routine or program.

At 1504, controller circuitry causes flux signals to be applied to a first loop of a multi junction SQUID flux-pumps via a respective first interface. At 1506, the controller circuitry then sequentially causes flux signals to be applied to a second loop of the multi junction SQUID flux-pumps via a respective second interface, where the flux signal applied to the second loop is out of phase with the flux signal applied to the first loop.

Optionally where the flux pump includes a third loop, the controller circuitry causes flux signals to be sequentially applied to at least the third loop of the first multi junction SQUID flux-pump via a respective third interface at 1508. The flux signal applied to the third loop is out of phase with the flux signal applied to the second loop.

Optionally where the flux pump includes a fourth loop, the controller circuitry causes flux signals to be sequentially applied to at least the fourth loop of the first multi junction SQUID flux-pump via a respective fourth interface at 1510. The flux signal applied to the fourth loop is out of phase with the flux signal applied to the third loop.

For example, the controller circuitry can apply a respective flux signal to each of the respective first, second, and third interfaces that is $\pi/2$ out of phase with respect to the respective flux signal applied to an immediately following loop along a linear succession of the loops the multi junction SQUID flux-pumps.

Applying flux signals to the first, second, and optionally additional (e.g., third) loops of a multi junction SQUID flux-pump can include applying flux signals that pushes flux sequentially through the loops of the multi junction SQUID flux-pump into a digital-to-analog converter (DAC). For example, the controller circuitry can apply flux signals to the first, second, and third loops of the multi junction SQUID flux-pump where the respective flux signal applied to each of the respective first, second, and third interfaces is advanced by $\pi/2$ with respect to a respective flux signal applied to an immediately following loop along a linear succession of the loops the multi junction SQUID flux-pump.

Alternatively, applying flux signals to the first, second and optionally additional (e.g., third) loops of a multi junction SQUID flux-pump may include applying flux signals that push flux sequentially through the loops of the multi junction SQUID flux-pump out of a digital-to-analog converter (DAC). For example, the controller circuitry can apply flux signals to the first, second, and third loops of the multi junction SQUID flux-pump where the respective flux signal applied to each of the respective first, second, and third interfaces is retarded by $\pi/2$ with respect to a respective flux signal applied to an immediately following loop along a linear succession of loops in the multi-junction SQUID flux-pump.

Applying flux signals to the first, second, and third loops of a first multi-junction SQUID flux-pump may include applying flux signals of a first sign and a first magnitude via first, second and third control lines; and applying a flux signal of a second sign and the first magnitude to at least one of the loops of a second multi junction SQUID flux-pump via a fourth control line sequentially with applying flux signals to the first, second and third loops of the first multi junction SQUID flux-pump, where the second sign is opposite the first sign.

The method 1500 terminates at 1512, for example until invoked again.

Figure 16A:
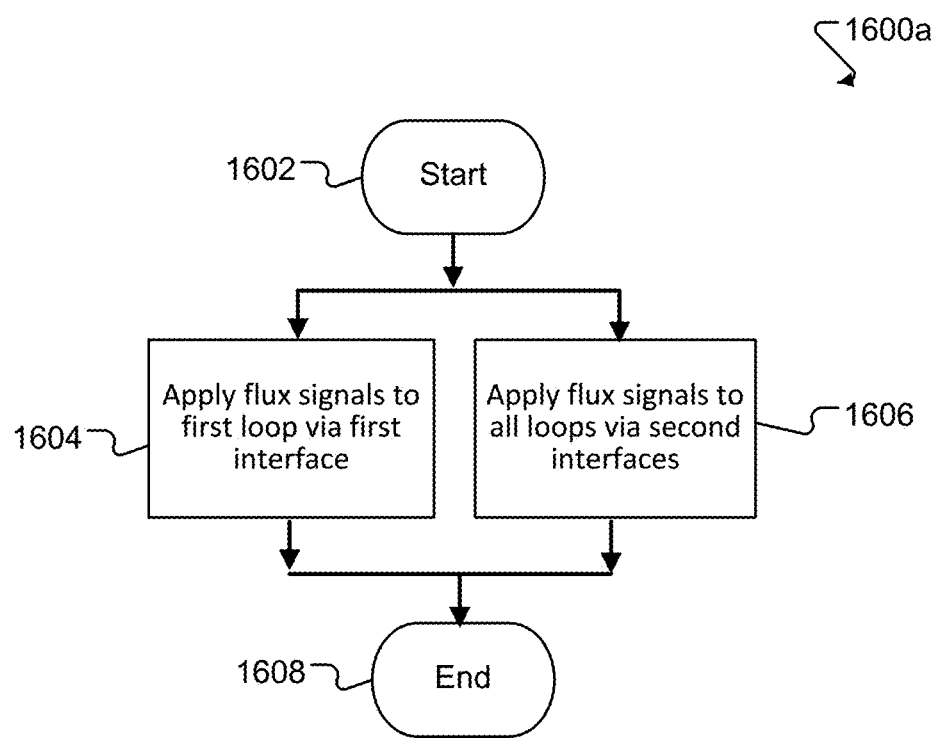
FIG. 16A is a flow diagram of a method of operating a plurality of multi-junction superconducting quantum interface device (SQUID) flux-pumps, according to at least one illustrated embodiment.

FIG. 16 shows a method 1600 of operating a plurality of multi junction superconducting quantum interface device (SQUID) flux-pumps, according to at least one illustrated embodiment.

The method starts at 1602, for example on application of power, submission of a problem, or invocation by a calling routine or program.

Controller circuitry concurrently causes application of flux signals of a first sign and a first magnitude to a first loop of a multi junction SQUID flux-pump via a respective first interface at 1604; and causes application of flux signals of the first sign and the first magnitude to all of the other loops of the multi junction SQUID flux-pump via respective second interfaces at 1606, where the flux signals applied to all of the loops are in phase with one another.

Applying flux signals of the first sign and the first magnitude to all of the other loops can include applying the flux signals of the first sign and the first magnitude to a first, a second, and at least a third loop of the first multi junction SQUID flux-pump via respective first, second and third control lines.

The method 1600 terminates at 1608, for example until invoked again.

Figure 16B:
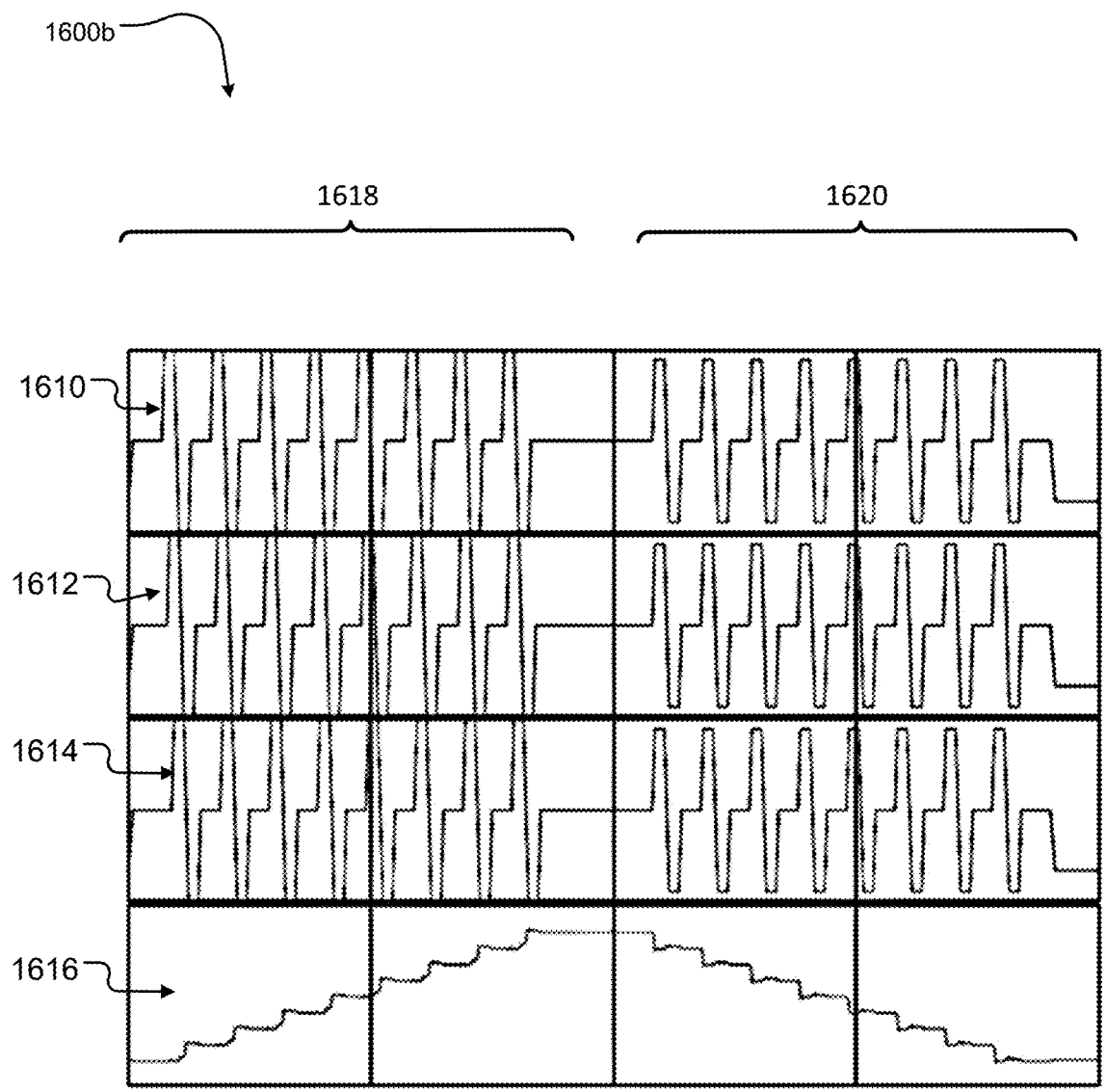
FIG. 16B is a graph showing a plot of applied flux waveforms and a Josephson phase of the end-most Josephson junction for resetting the four-junction three-loop flux pump of FIG. 11, according to at least one illustrated implementation.

Resetting flux-DACs is a challenging behavior to implement, as one simple reset scheme, illustrated in the plot 1600b of FIG. 16B, involves activating all clock phases 1610, 1612, and 1614 at the same time—and in phase—to deprogram the DAC (see 1616). As illustrated in FIG. 16B, an initial clock sequence 1618 programs the DAC loop, and a second subsequent sequence 1620 unloads it. The essential difference in the second sequence is that the pulses occur simultaneously, as opposed to the staggered pulses of the programming sequence. Occurring simultaneously, there is no preferred direction for flux and will, thus, unload pulses of either orientation. Thus, the DAC is first programmed with a clock sequence as described. Then the DAC is emptied by running the clocks simultaneously.

An alternative scheme, which would work for DACs that are of equivalent design capacity, would be to attempt to overfill the DAC, causing the DAC to reach capacity, and then to deprogram the DAC by a known amount. Even in the case where designed capacities of various DACs differed from each other, this approach can still be applied, and it may simply be that the starting point of programming for some DACs would not be mid-scale, but could be, for example, +10 Φ0. In fact, all DACs could be filled to capacity, and then not deprogrammed, to treat being filled to capacity as the starting point. However this approach disadvantageously would likely increase the total number of the flux pumps must transmit to achieve a given processor state.

Using capacity as a reference point does not avoid the problem of DACs whose capacity are right on the boundary between two levels and, thus, which end up stochastically in either one of two possible states on subsequent resets. This behavior can be treated by performing a customized DAC-by-DAC reset recovery for those DACs who, when reset nominally, were right on the edge. In the case of a flux pump used to program a DAC to capacity (or some other reset scheme) this can be handled in a similar manner, by operating individual flux pumps with customized levels in a reset recovery sequence.

Extending X-Y-Z Addressing to Multicore Processors

The X-Y-Z addressing scheme discussed above may be extended to the case of processors, for example quantum processors, with multiple cores. In particular, adding two or more processor cores in series allows to use the some of the same signal lines (e.g. IO line for driving a particular device).

Signal lines may be connected in series on a sample holder, carrier PCB or multi-chip module, while individual core may be tested and calibrated separately before being assembled.

An example implementation of such multi-core processor may have N cores, where each core is an arrangement of cells of qubits. N may be two or more. A cell of qubits may have Q qubits, for example eight qubits, and a core may have C cells, for example 24 cells.

In an implementation with 8 qubits per cell, there are nine DACs per qubits, so that in a cell there are 5 trigger lines and 15 address line and one common power line. Power lines select an array of tiles and address and trigger lines may be shared between different arrays of cells. Considering an implementation with 24 cells of 8 qubits per core and N cores, there are 9×8×(24×24)*N=41,472N DACs to be addressed. In case of 16 cores, for example, there are 661,248 DACs. An implementation with 16 cores is here discuss for exemplary purposes only and a person skilled in the art will understand than a lower or greater number of cores is also possible.

An X-Y-Z addressing requires three times the ceiling of cubic root of the number of lines, or 264 in the above example. To make the layout more regular it may be possible user power lines to select one quarter of cells on each processor core, 64 power lines in the above example, where each line selects 6×24=144 cells. To address each DAC in a group of 144 cells, there need to be 24×5=120 trigger lines and 6×15=90 address lines. Therefore, for the above example, the total number line for a X-Y-Z programming of all DACs is 64+120+90=274.

In another implementation with 24 qubits per cell comprising 12 horizontal qubits and 12 vertical qubits, there may be 7 DACs per qubit and 1 DAC for each coupler that a qubit is connected to so that in 16 unit cells arranged in a tile, there are 29 address lines and 32 power lines. In such an arrangement, up to 15 DACs may control each qubit. Power lines select columns of DACs and address lines may be shared between different columns of DACs and different arrays of unit cells. Considering an implementation with 16 unit cells of 24 qubits per core and N cores, there are 15×24×16*N=5760N DACs to be addressed. In case of 16 cores, for example, there are 92,160 DACs.

In another approach, power lines select a column of DACs and address lines may be shared between columns of DACs and different arrays of unit cells. Columns of DACs may be defined as vertical segments of DACs that are tiled to form a grid or array of DACs so that in a core comprising 680 qubits, there are 57 address lines and 28 power lines. Considering an implementation of 680 qubits per core and N cores, there are 15×680*N=10200N DACs to be addressed. In case of 16 cores, for example, there are 163,200 DACs. An implementation with 16 cores is given for exemplary purposes only and a person skill in the art will understand that a smaller or greater number of cores is also possible.

Braided Control Lines

Figure 17A:
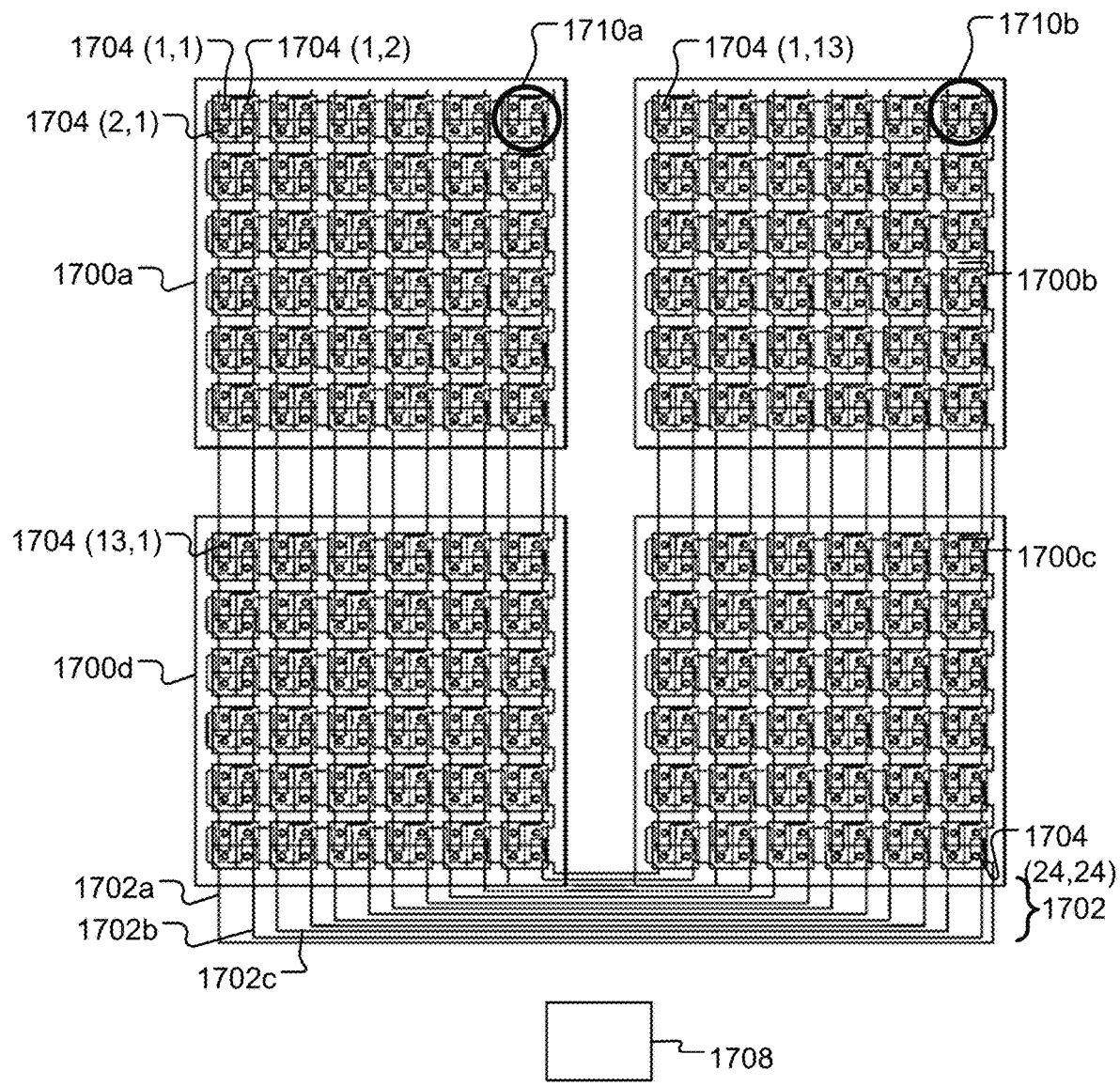
FIG. 17A is a schematic diagram of four sets of digital-to-analog converters (DACs), a number of signal lines arranged to individually address each of DACs, and control circuitry communicatively coupled to cause signals to be supplied to selected ones of the DACs via respective triplets of signal lines, according to at least one illustrated implementation.

FIG. 17A shows four sets of digital-to-analog converters (DACs) 1700*a*, 1700*b*, 1700*c*, 1700*d* (collectively 1700), a number of signal lines 1702*a*-1702*c* (collectively 1702, only three called in FIG. 17A for clarity) arranged to individually address each of DACs 1704 (*i*, *j*) (where i are integers from 1 to n, and j are integers from 1 to n, only six called out in FIG. 17A for clarity of illustration, collectively 1704). Control circuitry 1708 is communicatively coupled to cause signals to be supplied to selected ones of the DACs 1704 via respective pairs of signal lines 1702 and one of four power lines (not shown), according to at least one illustrated implementation.

In the illustrated implementation, the DACs 1704 in each set of DACs 1700*a*-1700*d* are arranged in a respective two-dimensional array, with a plurality of rows (e.g., extending horizontally across drawing sheet) and a plurality of columns (e.g., extending vertically across drawing sheet). Each set or array of DACs 1700*a*-1700*d* are controlled or selected via a respective one of four signal lines (not shown) which can be denominated as a "power line" for convenience of reference. Likewise, each set or array of DACs 1700*a*-1700*d* may be denominated as a power domain; each DAC in a power domain is controlled or selected by the same power line. The DACs 1704 of each set or array of DACs 1700*a*-1700*d* may be arranged or arrayed in a six by six (6×6) grid or array of quartets (i.e., four DACs) of DACs 1710*a*, 1710*b* (only two called out, one for set or array 1700*a*, and one for set or array 1700*b*, collectively 1710), for a total of thirty-six (36) quartets of DACs 1710 and a total of one hundred and forty-four (144) DACs 1704 per power domain (e.g., set or array of DACs 1700*a*-1700*d*). While generally illustrated as an ordered array, many of the techniques and structures described herein can be employed with a non-ordered array or set of DACs and/or other devices.

In additional to the "power lines", there are other signal lines 1702, in combination with the power lines, to uniquely address each of the one hundred and forty-four (144) DACs 1704 of the four power domains 1700*a*-1700*d*. These additional signal lines 1702 can be denominated as "control lines" for convenience of reference. As illustrated and described below, these control lines 1702 are arranged in a braided pattern or configuration across the respective sets or array or power domains 1700*a*-1700*d* to effectuate a very efficient addressing scheme, with a relatively low total number of signal lines 1702 to address a given number of DACs 1704. For example, a number $N_{signal}$ of signal lines 1702 is capable of addressing $4(N_{signal}-1)^2$ DACs 1704 that are communicatively coupled to respective pairs of the signal lines 1702 and one power line to be controlled via signals carried by the respective pairs of signal lines 1702 and one power line as supplied via the control circuitry 1708. Thus, the control circuitry 1708 is able to uniquely address every DAC 1704 via a pair of signal lines 1702 and one of four power lines.

The number $N_{signal}$ of signal lines 1702 can include a set of control lines 1702 and a set of power lines (not shown), and each triplet is comprised of a unique combination of two of the control lines 1702 and one of the power lines. The signal lines 1702 and the power lines can each be comprised of material that superconducts at least at a critical temperature.

As described above, the DACs 1704 are arrayed in a plurality of two-dimensional arrays, each of the two-dimensional arrays including a respective plurality of the DACs 1704, the number of signal lines 1702 and a first subset of the signal lines, each signal line of the first subset of signal lines communicatively coupled to the DACs of a respective two-dimensional array. Each signal line of the first subset of signal lines may be denominated as a power line and is communicatively coupled to all of the DACs of the respective two-dimensional array or power domain 1700a-1700d. Each signal line 1702 may be denominated as a control line 1702 and is communicatively coupled to a subset of the DACs 1704 on each of two or more of the two-dimensional arrays 1700a-1700d. For example, each signal line 1702 of the second subset of the signal lines is communicatively coupled to a subset of the DACs of all of the two-dimensional arrays 1700a-1700d. As illustrated, a first control line is positioned operationally proximate (e.g., sufficiently close to transfer flux) at least one DAC in each of at least three rows and at least three columns of a first two-dimensional array of DACs to communicatively couple with the respective DACs in each of at least three rows and at least three columns of the first two-dimensional array of DACs. As illustrated, a second control line is positioned operationally proximate at least one DAC in each of at least three rows and at least three columns of the first two-dimensional array of DACs to communicatively couple with the respective DACs in each of at least three rows and at least three columns of the first two-dimensional array of DACs. The first control line and the second control line can be positioned operationally proximate different DACs, with no DAC in common. Alternatively, the first control line and the second control line can be positioned operationally proximate a same at least one of DACs, with the at least one DAC in common.

Figure 17B:
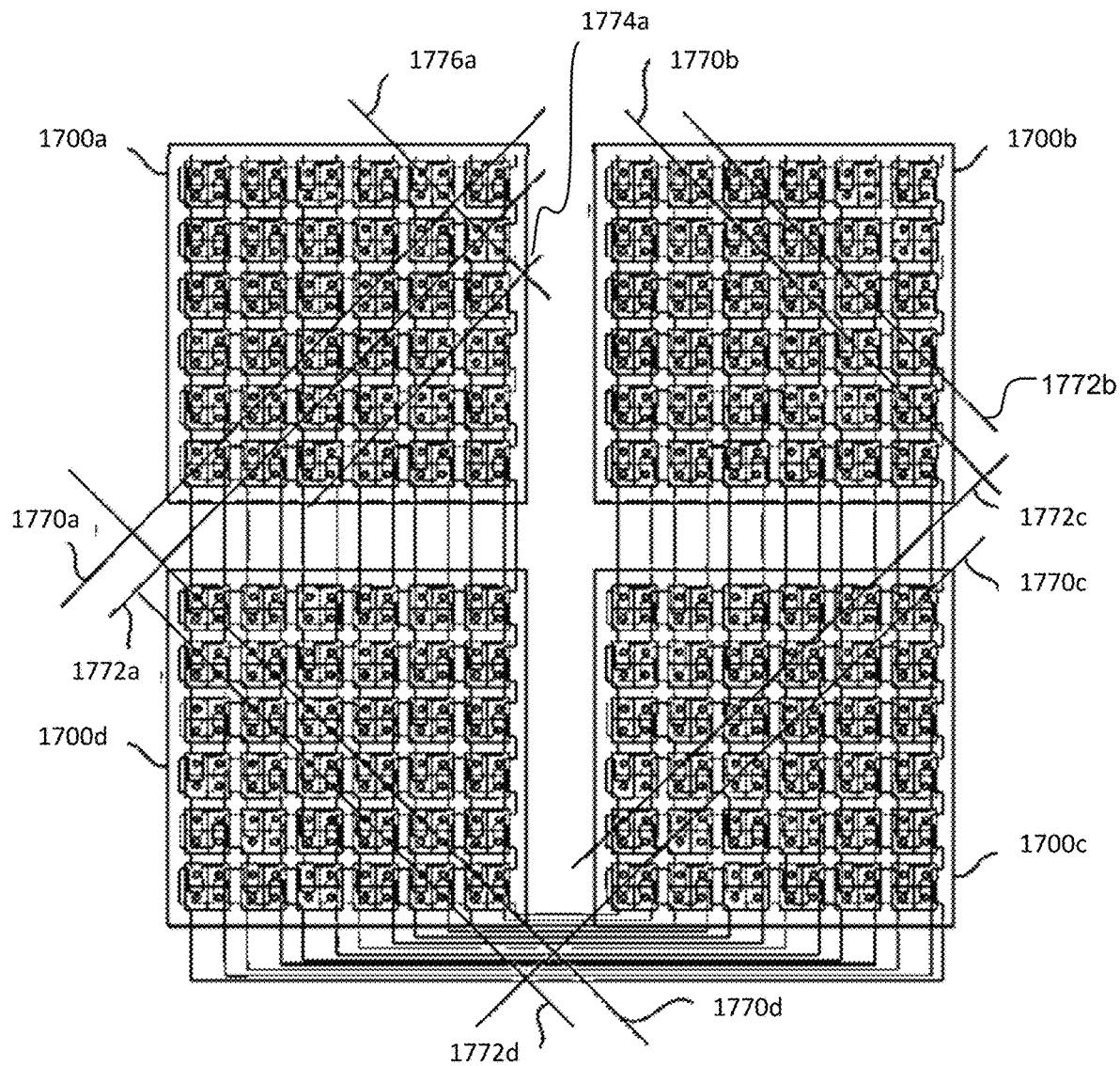
FIG. 17B is a schematic diagram of the four sets of digital-to-analog converters (DACs) and control lines of FIG. 17A, further illustrating a number of diagonal lines that represent a direction of braided control lines across the sets of DACs.

FIG. 17B shows the four sets of digital-to-analog converters (DACs) 1700a, 1700b, 1700c, 1700d (collectively 1700) and control lines 1702 e.g. 1702a, 1702b, and 1702c of FIG. 17A (not specifically called out in FIG. 17B to prevent clutter), and shows a number of diagonal lines that represent a direction of braided control lines 1702. The approach can advantageously control $4(N_{signal}-1)^2$ DACs with $N_{signal}$ control lines.

With respect to the braiding of the control lines 1702, a first control line is positioned proximate each DAC along a first diagonal 1770a of a first two-dimensional array of DACs 1700a to communicatively couple with the respective DACs along the first diagonal 1770a of the first two-dimensional array of DACs 1700a. The first control line is also positioned proximate each DAC along a first diagonal 1770b of a second two-dimensional array of DACs 1702b to communicatively couple with the respective DACs along the first diagonal 1770b of the second two-dimensional array of DACs 1700b. Likewise, the first control line can also be positioned proximate each DAC along a first diagonal 1770c of a third two-dimensional array 1700c and a first diagonal 1770d of a fourth two-dimensional array of DACs 1700d to communicatively couple with the respective DACs along the first diagonal 1770c, 1770d of the third and the fourth two-dimensional arrays of DACs 1700c, 1700d, respectively.

Where the DACs of the first two-dimensional array of DACs 1700a are arrayed in a number of rows and columns, the first diagonal 1770a of the first two-dimensional array of DACs 1700a may, for example, extend across all rows and all columns of the first two-dimensional array of DACs 1700a. Where the DACs of the second two-dimensional array of DACs 1700b are arrayed in a number of rows and columns, the first diagonal 1770b of the second two-dimensional array of DACs 1700b may, for example, extend across all rows and all columns of the second two-dimensional array of DACs. Likewise, the respective first diagonal 1770c, 1770d of the third and the fourth two-dimensional arrays of DACs 1700c, 1700d may, for example, extend across all rows and all columns of the third and the fourth two-dimensional arrays of DACs 1700c, 1700d, respectively.

In some implementations, the first diagonal 1770b of the second two-dimensional array 1702b is perpendicular to the first diagonal 1770a of the first two-dimensional array 1700a and the first diagonal 1770c of the third two-dimensional array 1700c is perpendicular to the first diagonal 1770b of the second two-dimensional array 1700b. In some implementations, the first diagonal 1770d of the fourth two-dimensional array 1700d is perpendicular to the first diagonal 1770a of the first two-dimensional array 1700a and the first diagonal 1770d of the fourth two-dimensional array 1700d is perpendicular to the first diagonal 1770c of the third two-dimensional array 1700c.

In particular, the first control line can follow a meandering path along the first diagonal 1770a of the first two-dimensional array of DACs 1700a. The first control line can follow a meandering path along the first diagonal 1770b of the second two-dimensional array of DACs 1700b. The first control line can follow a meandering path along the first diagonal 1770c of the third two-dimensional array of DACs 1700c. The first control line can follow a meandering path along the first diagonal 1770d of the fourth two-dimensional array of DACs 1700d. Likewise, additional control lines can follow meandering paths along respective diagonals of the first, second or other two-dimensional arrays of DACs 1700a-1700d.

With respect to the braiding of the control lines, a second control line is positioned proximate each DAC along a second diagonal 1772a of the first two-dimensional array of DACs to communicatively couple with the respective DACs along the second diagonal 1772a of the first two-dimensional array of DACs 1700a. The second control line is also positioned proximate each DAC along a second diagonal 1772b of the second two-dimensional array of DACs 1700b to communicatively couple with the respective DACs along the second diagonal 1772b of the second two-dimensional array of DACs 1700b. Likewise, the second control line can also be positioned proximate each DAC along a second diagonal 1772c, 1772d of a third and a fourth two-dimensional array of DACs 1700c, 1700d to communicatively couple with the respective DACs along the second diagonal 1772c, 1772d of the third and the fourth two-dimensional array of DACs 1700c, 1700d.

Where the DACs of the first two-dimensional array of DACs are arrayed in a number of rows and a number of columns, the second diagonal 1772*a* of the first two-dimensional array of DACs 1700*a* may, for example, extend across all rows and all columns of the first two-dimensional array of DACs 1700*a*. Alternatively, the second diagonal 1772*a* of the first two-dimensional array of DACs 1700*a* may, for example, extend across a subset (i.e., less than all) of rows and/or a subset (i.e., less than all) of columns of the first two-dimensional array of DACs 1700*a*. Thus, any given control line can extend along a first diagonal partially across the two-dimensional array of DACs 1700*a*-1700*d*, then switch direction and extend along a second diagonal across a remainder of the two-dimensional array of DACs 1700*a*-1700*d*. The second diagonal can extend at a non-zero angle from first diagonal, for example at a right angle or 90°. In some implementations, for example with large enough arrays of DACs, a given control line may extend along one, two, three or even more diagonals, each successive diagonal which extends at a non-zero angle with respect to a preceding and a subsequent diagonal. The successive angles can all be the same, or one or more angles can differ from one another in magnitude and/or in direction. For instance, non-zero angles can, for example, include 90°, 60°, 45° or 30° angles. Also for instance, directions of angle can be clockwise or counterclockwise relative to a preceding or subsequent diagonal. Thus, some of the control lines can take a tortious, zigzag path across one or more sets or arrays of DACs 1700*a*-1700*d*.

With respect to the braiding of the control lines, a third control line is positioned proximate each DAC along a third diagonal 1774*a* and a fourth diagonal 1776*a* of the first two-dimensional array of DACs 1800*a* to communicatively couple with the respective DACs along the third and the fourth diagonals 1774*a*, 1776*a* of the first two-dimensional array of DACs 1700*a*. The fourth diagonal extends at a non-zero angle (e.g., perpendicular, right angle, 90°) with respect to the third diagonal. For example, where the DACs of the first two-dimensional array of DACs 1700*a* are arrayed in a number of rows and columns, the third diagonal 1774*a* of the first two-dimensional array of DACs 1700*a* may extend across a first number of rows and a first number of columns of the first two-dimensional array of DACs 1700*a*, and the fourth diagonal 1776*a* of the first two-dimensional array of DACs 1700*a* may extend across a second number of rows and a second number of columns of the first two-dimensional array of DACs 1700*a*. In some implementations, a combination of the first number and second number of rows includes all rows of the first two-dimensional array of DACs 1700*a* and a combination of the first number and second number of columns includes all columns of the first two-dimensional array of DACs 1700*a*.

The third control line can also be positioned proximate each DAC along a third diagonal (not shown) and fourth diagonal (not shown) of the second two-dimensional array of DACs 1700*b* to communicatively couple with respective DACs along the third and fourth diagonals of the second two-dimensional array of DACs, where the fourth diagonal of the second two-dimensional array of DACs extends at a non-zero angle (e.g., perpendicular, right angle) to the third diagonal of the second two-dimensional array of DACs. The third control line can further be positioned proximate each DAC along a third diagonal and a fourth diagonal of the third dimensional array of DACs 1700*c* to communicatively couple with the respective DACs along the third and the fourth diagonals of the third two-dimensional array of DACs 1700*c*, again where the fourth diagonal of the third two-dimensional array of DACs 1700*c* extends at a non-zero angle with respect to the third diagonal of the third two-dimensional array of DACs 1700*c*. The third control line can even further be positioned proximate each DAC along a third diagonal and a fourth diagonal of the fourth dimensional array of DACs 1700*d* to communicatively couple with the respective DACs along the third and fourth diagonals of the fourth two-dimensional array of DACs 1700*d*, again where the fourth diagonal of the fourth two-dimensional array of DACs extends at a non-zero angle to the third diagonal of the fourth two-dimensional array of DACs 1700*d*.

There is a small difference in the implementation of this idea when there are an even or odd number of DACS per column. FIG. 18 shows a repeatable tile for pairs of braid crossings which scales to arbitrarily large numbers of lines.

Figure 18A:
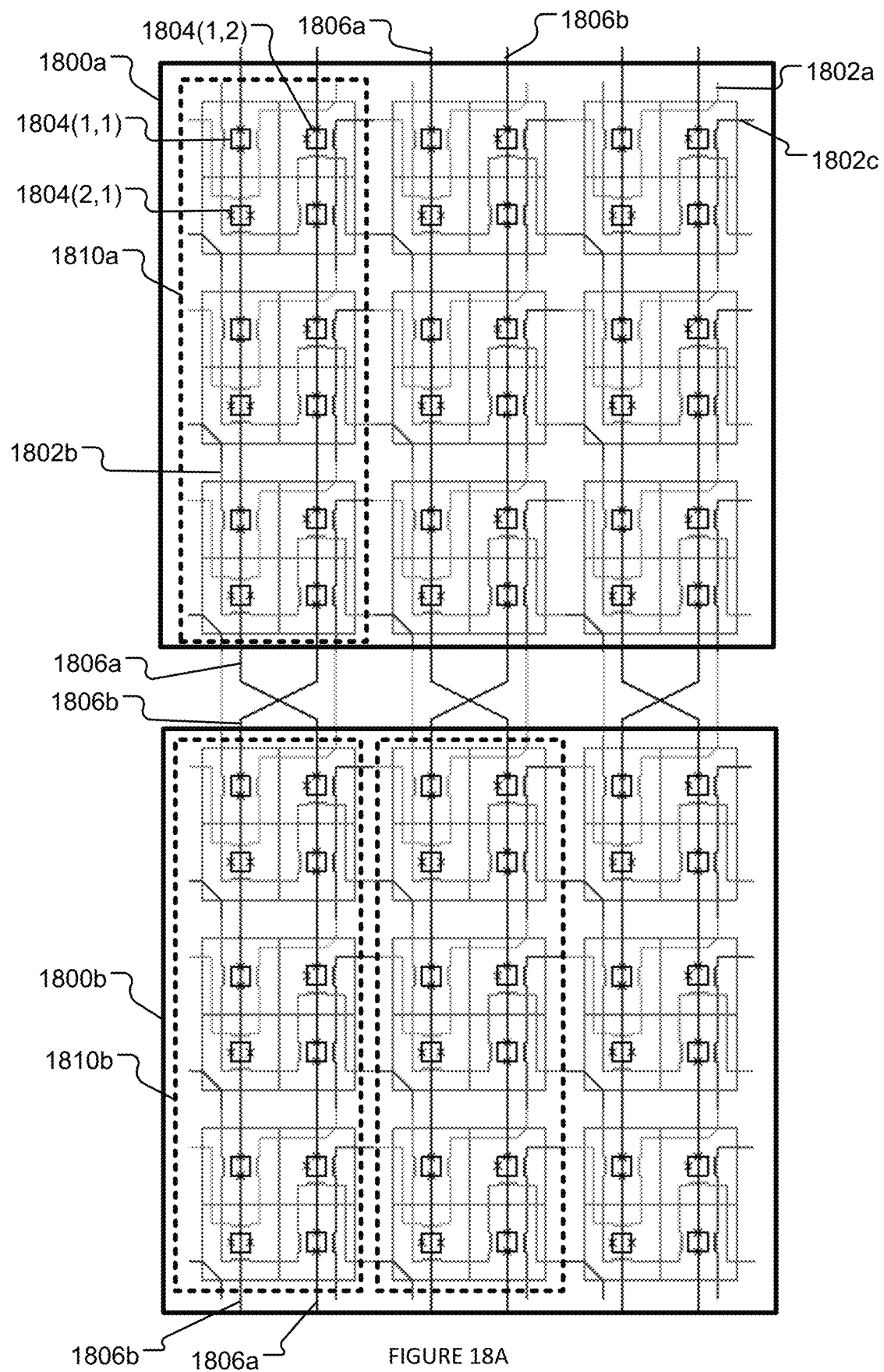
FIG. 18A is a schematic diagram of two arrays of digital-to-analog converters (DACs) illustrating power lines supplying current to respective columns of DACs and an arrangement of control lines that electrically couples two arrays.

FIG. 18A shows two arrays of digital-to-analog converters (DACs) 1800*a*, 1800*b* (collectively and individually 1800), a number of signal lines 1802*a*-1802*c* (collectively and individually 1802, only three called in FIG. 18A for clarity) arranged to individually address each of DACs 1804 (*i*,*j*) (only three called out in FIG. 18A for clarity of illustration, collectively and individually 1804). Control circuitry is communicatively coupled to cause signals to be supplied to selected ones of DACs 1804 via respective pairs of control lines 1802 and at least a first power line 1806*a* and a second power line 1806*b*, according to at least one illustrated implementation.

In the illustrated implementation, the DACs 1804 in each array of DACs 1800 are arranged in a plurality of respective sub-arrays 1810*a*,1810*b* (collectively and individually 1810, only two called out in FIG. 18A for clarity), each sub-array 1810 with a plurality of rows (e.g., extending horizontally across the drawing sheet) and two columns (e.g., extending vertically up and down the drawing sheet). DACs in each array of DACs 1800 and DACs in each sub-array of DACs 1810 can be controlled or selected via one of at least two power lines 1806*a*,1806*b*. One of at least two power lines 1806 may control or select each DAC in a number of non-adjacent columns of an array. For example, each DAC in a column of a sub-array may be controlled or selected by one of at least two power lines 1806. Non-adjacent columns have at least one column interposed between them.

In one approach, power lines may be configured (e.g., laid out, positioned) to control or select DACs 1804 in a first array 1800*a* differently from DACs 1804 in a second array 1800*b*. For example, in the first array 1800*a*, each DAC in the first column of a sub-array 1810 may be controlled or selected by a first power line 1806*a* and each DAC in the second column of a sub-array 1810 may be controlled or selected by a second power line 1806*b*. In the second array 1800*b*, each DAC in the first column of a sub-array 1810 may be controlled or selected by the second power line 1806*b* and each DAC in the second column of a sub-array 1810 may be controlled or selected by the first power line 1806*a*. In other implementations, power lines may be configured (e.g., laid out, positioned) to control or select DACs 1804 in the first array 1800*a* similarly to DACs 1804 in the second array 1800*b*. For example, in the first array 1800*a* and the second array 1800*b*, each DAC in the first column of a sub-array 1810 may be controlled by the first power line 1806*a* and each DAC in the second column of a sub-array 1810 may be controlled by the second power line 1806*b*. While illustrated with two power lines 1806, the techniques and structures described in the present application can be employed with more than two power lines 1806 and more than two columns in a sub-array 1810.

Arrangement of the DACs 1804 of each array in a three by three (3×3) grid or array of quartets (i.e., four DACs) of DACs is merely exemplary. For example, DACs 1804 of each array 1800 may be arranged in a six by six (6×6) grid or array of quartets of DACs 1804 for a total of one hundred and forty-four (144) DACs in an array 1800. In a six by six array of quartets of DACs 1804, each array 1800 may comprise six sub-arrays 1810 wherein each sub-array 1810 may comprise twelve rows and two columns of DACs 1804. While two arrays 1800 are depicted in FIG. 18A, a person who is skilled in the art would recognize that any number of arrays may be implemented in a processor or core. For example, sixteen (16) arrays of 144 DACs may be arranged in a four by four grid in a processor or core for a total of 2304 DACs. While generally illustrated as an ordered array, many of the techniques and structures described in the present application can be employed with a non-ordered array or set of DACs and/or other devices.

Control lines 1802a-1802c (collectively and individually 1802, only three called out in FIG. 18A for clarity) in combination with power lines 1806a and 1806b (collectively and individually 1806) uniquely address each one of the DACs 1804 in each array 1800. As illustrated, control lines 1802 are arranged in a braided configuration within an array 1800. A braided configuration of control lines 1802 is one in which the control lines 1802 are intertwined with one another, or interwoven in a pattern, for example interwoven in a repeating pattern, operable to communicatively couple two or more of the DACs 1804 in an array 1800.

At a boundary of an array, control lines of a first array 1800a may electrically couple with control lines 1802 in a second array 1800b in a straight-through arrangement as illustrated in FIG. 18A. A straight-through arrangement may be suitable for connecting arrays 1800 that are not at an edge or border of a processor or core. See, for example, control lines 1802a-1802c, each of which electrically couples a control line in the first array 1800a to a control line in the second array 1800b.

Figure 18B:
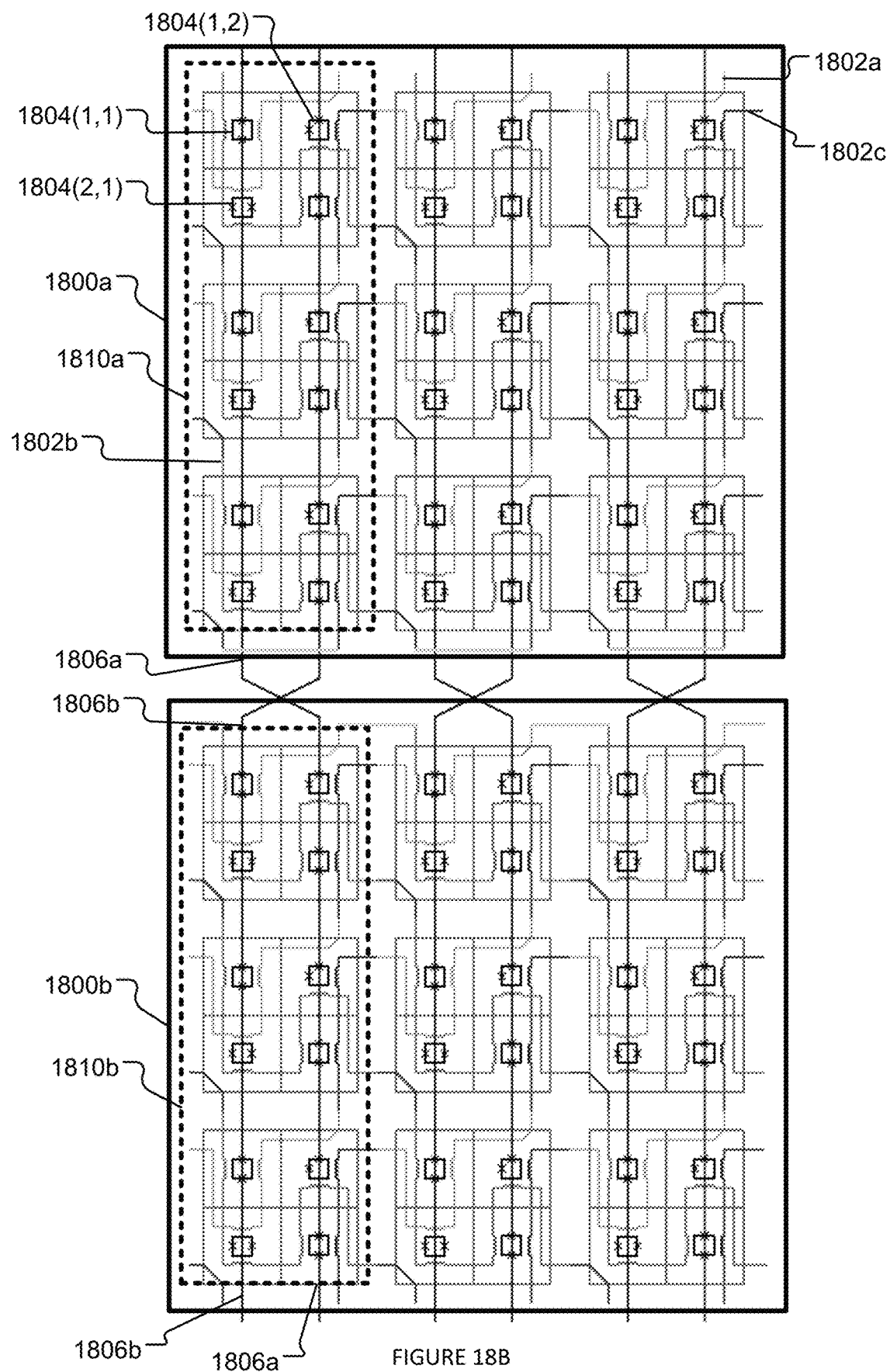
FIG. 18B is a schematic diagram of two arrays of digital-to-analog converters (DACs) illustrating power lines supplying current to respective columns of DACs and an arrangement of control lines that feeds back into a respective array.

Alternatively, at a boundary of an array (such as first array 1800a and second array 1800b), control lines 1802 of a first array 1800a may be arranged to continue within or feed back into the first array 1800a in a braided-boundary arrangement, for example in the arrangement illustrated in FIG. 18B. A braided-boundary arrangement (such as the example illustrated in FIG. 18B) feeds a control line 1802 exiting the first array back into the first array, electrically coupling the exiting control line 1802 to another control line 1802 in the first array 1800a. A braided-boundary arrangement is suitable for the edges of an array 1800 that are not electrically coupled to another array 1800b, such as at the edge or border of a processor or core. Electrically coupled control lines 1802 may be coupled through a galvanic connection or inductive coupling.

A number of control lines 1802 and power lines 1806 effectuate an efficient addressing scheme with a relatively low total number of signal lines to address a given number of DACs 1804. In the illustrated example, a number n of control lines 1802 and a number P of power lines 1806 is capable of addressing $P(n-1)^2$ DACs 1804. Each DAC can be communicatively coupled to a respective pair of control lines 1802 and one power line 1806. Each DAC can be controlled via signals supplied via control circuitry, and carried by the respective pair of control lines 1802 and the power line 1806. The control circuitry can uniquely address each DAC 1804 via a pair of control lines 1802 and one of at least two power lines 1806. That is, each triplet of signal lines that controls a DAC 1804 comprises a unique combination of two control lines 1802 and one of the power lines 1806.

The DACs 1804 are arranged in a plurality of two-dimensional arrays (two arrays 1800a and 1800b are shown in FIG. 18A), each array including a respective plurality of DACs 1804 arranged in a plurality of sub-arrays 1810. Each control line of the number of control lines 1802 is communicatively coupled to the DACs 1804 of a respective two-dimensional array (for example, one of arrays 1800a and 1800b). Each power line of the number of power lines 1806 is communicatively coupled to one column of DACs of a respective sub-array. That is, each power line 1806 is communicatively coupled to half of the total number of columns of DACs of the respective two-dimensional array 1800, wherein the columns to which the power is communicatively coupled are non-adjacent. Columns that are non-adjacent have at least one column interposed between them. Each control line can be communicatively coupled to a subset of the DACs 1804 of each of the two or more two-dimensional arrays 1800.

As illustrated in FIG. 18A, a first control line 1802a and a second control line 1802b in FIG. 18A are positioned operatively proximate at least one DAC like the first control line and the second control line depicted in FIG. 17A.

In FIG. 18A and FIG. 18B, a first power line 1806a is coupled to selectively provide a current to the DACs of at least two non-adjacent columns of the first two-dimensional array of DACs 1800a. The first power line 1806a is further coupled to selectively provide a current to the DACs of at least two non-adjacent columns of the second two-dimensional array of DACs 1800b.

A second power line 1806b is coupled to selectively provide a current to the DACs of at least two non-adjacent columns of the first two-dimensional array of DACs 1800a that are not coupled to the first power line 1806a. The second power line 1806b is further coupled selectively provide a current to the DACs of at least two non-adjacent columns of the second two-dimensional array of DACs 1800b that are not coupled to the first power line 1806a.

A control line 1802 is positioned proximate or operatively proximate a DAC 1804 if the interfaces of each component, for example the inductive interfaces, can communicatively couple via flux, thereby transferring signals from the control line 1802 to the respective DAC 1804. Note that the terms "proximate" and "operatively proximate" are used interchangeably throughout this specification and claims to indicate that a control line is located close to a DAC such that the two components are communicatively coupled and the control line may transfer a signal to the DAC via flux.

Figure 18C:
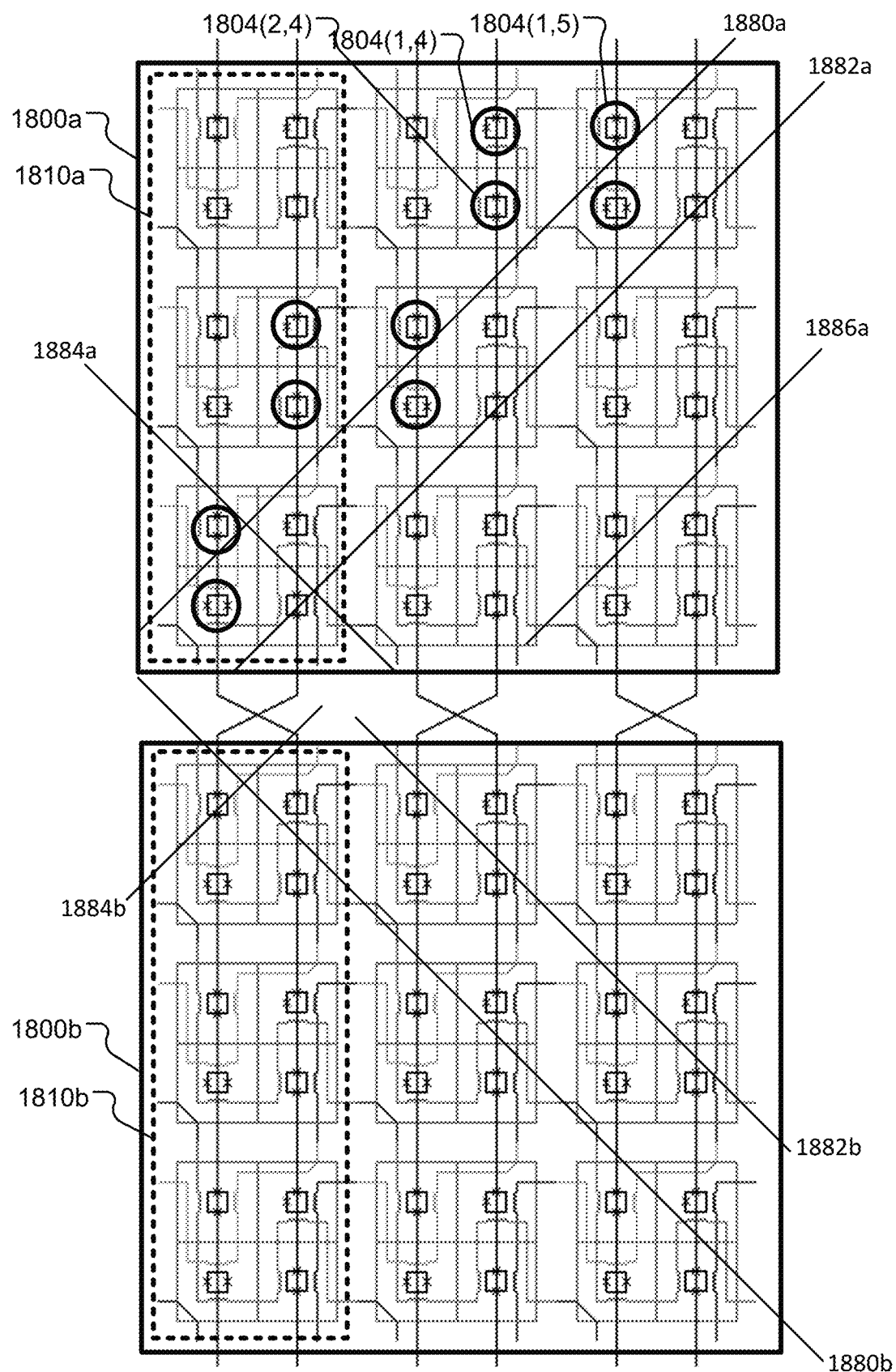
FIG. 18C is a schematic diagram of the two arrays of digital-to-analog converters (DACs) and signal lines of FIG. 18A and FIG. 18B, further illustrating a number of diagonal lines that represent a direction of braided control lines.

FIG. 18C shows the two arrays of digital-to-analog converters (DACs) 1800a and 1800b (collectively and individually 1800) and control lines 1802a-1802c (collectively and individually 1802 and not specifically called out in FIG. 18C for clarity) of FIG. 18A, and shows a number of diagonal lines that represent a direction of braided control lines 1802. This approach can advantageously control $P(n-1)^2$ DACs where n is the number of control lines 1802 and P is the number of power lines 1806, or control $4(N-1)^2$ DACs in the special case where the number of power domains is 4 and the number of signal lines equals the number of control lines.

As illustrated in FIG. 18A, at a boundary of an array, control lines 1802 of the first array 1800a may electrically couple with control lines 1802 of the second array 1800a, for example in a straight-through configuration or another suitable configuration. In the configuration illustrated in FIG. 18A, control lines 1802 of the first array 1800a and the second array 1800b depicted in FIG. 18A are positioned like the control lines 1702 of the first array 1700a and the fourth array 1700d depicted in FIG. 17B. Referring to FIGS. 18A and 18C together, a first control line 1802a is positioned proximate each DAC along a first diagonal 1880a of a first two-dimensional array 1800a to communicatively couple with the respective DACs along the first diagonal 1880a of the first two-dimensional array 1800a. The first control line 1802a is also positioned proximate each DAC along a first diagonal 1880b of the second two-dimensional array 1800b to communicatively couple with the respective DACs along the first diagonal 1880b of the second two-dimensional array of DACs 1800b.

A control line that is positioned proximate a DAC along a diagonal follows a meandering path in the direction of the diagonal. For example, the first diagonal 1880 is directed from the top right, downwards, and to the left of the first two-dimensional array 1800a. The DACs 1804(2,4), 1804 (1,4), 1804(1,5) that are circled (collectively and individually 1804, only three called in FIG. 18C for clarity) in FIG. 18C are positioned along the first diagonal 1880a of the first two-dimensional array 1800a and the first control line 1802a is positioned proximate each of the DACs that are circled. A meandering path that any control line 1802 follows may be a tortuous, or zigzag, crenulated, path that brings the control line close to or proximate a plurality of DACs 1804 to communicatively couple the control line to each of the proximate DACs through, for example, an inductive interface. The meandering path of each braided control line 1802 follows the general direction of a respective diagonal.

Where the DACs of the first two-dimensional array of DACs 1800a are arrayed in a number of rows and columns, the first diagonal 1880a of the first two-dimensional array of DACs 1800a may, for example, extend across all rows and all columns of the first two-dimensional array of DACs 1800a. Where the DACs of the second two-dimensional array of DACs 1800b are arrayed in a number of rows and columns, the first diagonal 1880b of the second two-dimensional array of DACs 1800b may, for example, extend across all rows and all columns of the second two-dimensional array of DACs 1800b. In some implementations, the first diagonal 1880b of the second two-dimensional array 1800b is perpendicular to the first diagonal 1880a of the first two-dimensional array 1800a. In some implementations, at least one of the first diagonals of the first and the second two-dimensional arrays extends across a subset of the rows and the columns of the respective two-dimensional array 1800.

In the configuration illustrated in FIG. 18A, a first control line 1802a can follow a meandering path along the first diagonal 1880a of the first two-dimensional array of DACs 1800a. The first control line 1802a can also follow a meandering path along the first diagonal 1880b of the second two-dimensional array of DACs 1800b.

A second control line 1802b is positioned proximate each DAC along a third diagonal 1884a of the first two-dimensional array of DACs 1800a to communicatively couple with the respective DACs along the third diagonal 1884a of the first two-dimensional array of DACs 1800a. The second control line 1802b is also positioned proximate each DAC along a second diagonal 1882b of the second two-dimensional array of DACs 1800b to communicatively couple with the respective DACs along the second diagonal 1882b of the second two-dimensional array of DACs 1800b.

A third control line 1802c is positioned proximate each DAC along the second diagonal 1882a of the first two-dimensional array of DACs 1800a to communicatively couple with the respective DACs along the second diagonal 1882a of the first two-dimensional array of DACs 1800a. The third control line 1802c is also positioned proximate each DAC along a third diagonal 1884b of the second two-dimensional array of DACs 1800b to communicatively couple with the respective DACs along the third diagonal 1884b of the second two-dimensional array of DACs 1800b.

The second diagonal 1882a, the third diagonal 1884a, and a fourth diagonal 1886a of the first two-dimensional array 1800a may, for example, extend across all rows and all columns of the first array. Alternatively, the second diagonal 1882a, the third diagonal 1884a, and the fourth diagonal 1886a of the first two-dimensional array 1800a may extend across a subset of rows and/or a subset of columns of the first array. Likewise, the second diagonal 1882b and the third diagonal 1884b of the second two-dimensional array 1800b may, for example, extend across all rows and all columns of the second array 1800b. Alternatively, the second diagonal 1882b and the third diagonal 1884b of the second two-dimensional array 1800b may extend across a subset of rows and/or a subset of columns of the second array 1800b.

As illustrated in FIG. 18B, at a boundary of an array, control lines 1802 of the first array 1800a may be arranged to continue within the first array 1800a in a braided-boundary configuration. In the braided-boundary approach, control lines 1802 of the first array 1800a and the second array 1800b depicted in FIG. 18B are positioned like the control lines 1702 of the first array 1700a and the second array 1700b depicted in FIG. 17B. Referring to FIGS. 18B and 18C together, a first control line 1802a is positioned proximate each DAC along a first diagonal 1880a of a first two-dimensional array 1800a to communicatively couple with the respective DACs along the first diagonal 1880a of the first two-dimensional array 1800a. The first control line 1802a is also positioned proximate each DAC along a second diagonal 1882a of the first two-dimensional array 1800a to communicatively couple with the respective DACs along the second diagonal 1882a of the first two-dimensional array of DACs 1800a. A control line is proximate a DAC if the interfaces of each component, for example the inductive interfaces, can communicatively couple via flux, thereby transferring signals from the control line to the respective DAC.

In the braided boundary approach illustrated in FIG. 18B, the first control line 1802a can follow a meandering path along the first diagonal 1880a of the first two-dimensional array of DACs 1800a. The first control line 1802a can also follow a meandering path along the second diagonal 1882a of the first two-dimensional array of DACs 1800a. The second control line 1802b is positioned is positioned proximate each DAC along a third diagonal 1884a of the first two-dimensional array of DACs 1800a to communicatively couple with the respective DACs along the third diagonal 1884a of the first two-dimensional array of DACs 1800a. The second control line 1802b is also positioned proximate each DAC along the fourth diagonal 1886a of the first two-dimensional array of DACs 1800a to communicatively couple with the respective DACS along the fourth diagonal 1886a of the first two-dimensional array of DACs 1800a. The third control line 1802c is positioned is positioned proximate each DAC along the second diagonal 1882a of the first two-dimensional array of DACs 1800a to communicatively couple with the respective DACs along the second diagonal 1882a of the first two-dimensional array of DACs 1800a. The third control line 1802c is also positioned proximate each DAC along the first diagonal 1880a of the first two-dimensional array of DACs 1800a to communicatively couple with the respective DACS along the first diagonal 1880a of the first two-dimensional array of DACs 1800a.

In either the configuration illustrated in FIG. 18A or the configuration illustrated in FIG. 18B, additional control lines 1802 can follow meandering paths along respective diagonals of the first or second two-dimensional arrays 1800a,1800b. The braiding of control lines 1802 in the illustrated implementation is like the braiding of control lines illustrated in FIG. 17A and FIG. 17B. For instance, the first control line 1802a and the third control line 1802c of FIG. 18A are interwoven in a pattern similar to the first control line and second control line in the first two-dimensional array of FIG. 17A and FIG. 17B. Similarly, the second control line 1802b of FIG. 18A is interwoven with two control lines (not called in FIG. 18A) in a pattern similar to the second control line in the second two-dimensional array of FIG. 17A and FIG. 17B. The power lines 1806 of FIG. 18A, FIG. 18B, and FIG. 18C differ from power lines of FIG. 17A and FIG. 17B in that each power line 1806 is coupled to selectively provide current to a respective column of DACs rather than an array of DACs. In the configurations illustrated in FIGS. 18A and 18B, control lines 1802 that are shown as not electrically coupled at the side boundaries on the left and the right (relative to the drawing sheet) may be electrically coupled to an additional array by the straight-through arrangement of FIG. 18A or may be arranged to continue or feed back into the respective array by the braided-boundary arrangement of FIG. 18B.

Figure 19:
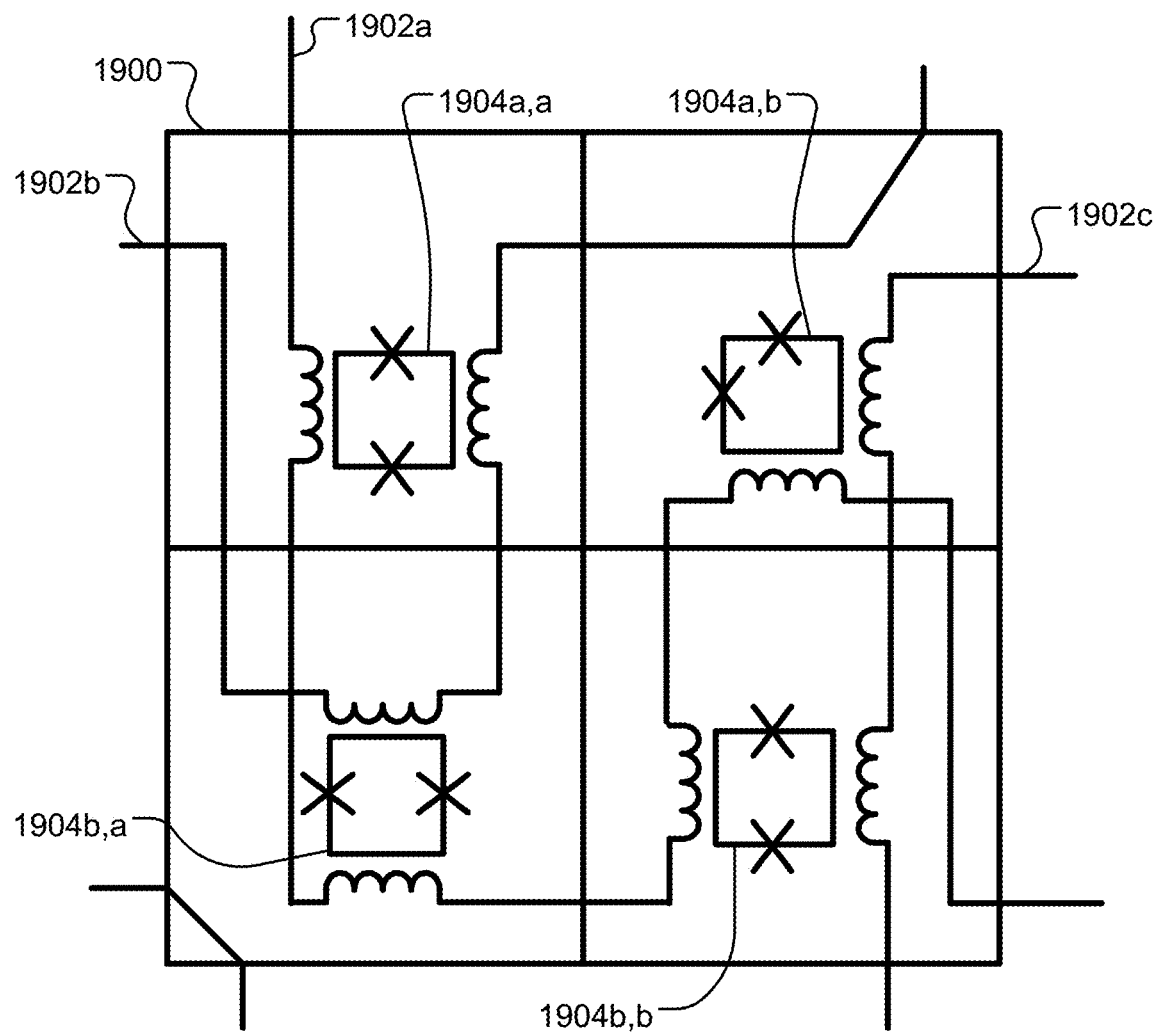
FIG. 19 is a schematic diagram of a quartet of digital-to-analog converters (DACs), a power line, and three control lines, according to at least one illustrated implementation.

FIG. 19 shows an array for pairs of braid crossings which can be repeatable tiled and scaled to form an array of a larger size.

FIG. 19 shows an array of DACs 1900, and three control lines 1902a, 1902b, 1902c, according to at least one illustrated implementation. The array of DACs 1900, three control lines 1902a, 1902b, 1902c (collectively 1902) may be similar or even identical to the corresponding structures of FIGS. 17A, 17B, 18A, 18B, and 18C. FIG. 19 better illustrates the physical arrangement of the control lines 1902 to individually address each of the DACs of the array 1900.

The array 1900 includes a first DAC 1904a,a, a second DAC 1904a,b, a third DAC 1904b,b, and a fourth DAC 1904b,a. Each of the DACs includes a loop of material, a pair of Josephson junctions that interrupt the loop of material, and a pair of interfaces (e.g., inductive interfaces).

A first control line 1902a passes operatively proximate the first DAC 1904a,a, the fourth DAC 1904b,a, the third DAC 1904b,b, and the second DAC 1904a,b of the array 1900. The first control line 1902a includes interfaces (e.g., inductive interfaces) operatively proximate complementary interfaces of the first, fourth, third and second DACs 1904a,a, 1904b,a, 1904b,b, 1904a,b to provide a signal (e.g., flux) therebetween.

A second control line 1902b passes operatively proximate the fourth DAC 1904b,a and the first DAC 1904a,a of the array 1900. The second control line 1902b includes interfaces (e.g., inductive interfaces) operatively proximate complementary interfaces of the fourth and first DACs 1904b,a, 1904a,a to provide a signal (e.g., flux) therebetween.

A third control line 1902c passes operatively proximate the third DAC 1904b,b and the second DAC 1904a,b of the array 1900. The third control line 1902c includes interfaces (e.g., inductive interfaces) operatively proximate complementary interfaces of the third and second DACs 1904b,b, 1904a,b to provide a signal (e.g., flux) therebetween.

The array 1900 of FIG. 19 is a basic unit tile and shows the simplest example implementation of the array which is a quartet of DACs. Array 1900 forms a quartet which includes a number of DACs arranged in two rows and two columns. A first column of the array 1900 may include the first DAC 1904a,a and the fourth DAC 1904b,a. A second column of the array 1900 may include the second DAC 1904a,b and the third DAC 1904b,b. Each DAC 1904 of the array 1900 may be controlled via a unique combination of one power line (not shown) and two control lines 1902. At least one of a plurality of power lines (not shown) may be coupled to selectively provide a current to each DAC of the first column and the second column of the array 1900. The two control lines 1902 that communicatively couple with each DAC 1904 of the array 1900 may be selected from a group of: the first 1902a, the second 1902b, or the third control line 1902c. In the illustrated implementation, the first control line 1902a is positioned operatively proximate each DAC 1904 of the first column and the second column to communicatively couple with the respective DACs of the first column and the second column. For example, the first control line 1902a is positioned operatively proximate the first DAC 1904a,a, the fourth DAC 1904b,a, the third DAC 1904b,b, and the second DAC 1904a,b. The second control line 1902b is positioned operatively proximate each DAC of the first column, for example the first DAC 1904a,a and the fourth DAC 1904b,a, to communicatively couple with the respective DACs of the first column. The third control line 1902c is positioned operatively proximate each DAC of the second column, for example the first DAC 1904a,b and the fourth DAC 1904b,a, to communicatively couple with the respective DACs of the second column.

In other implementations, the first column and the second column of the basic unit tile or simplest implementation illustrated in FIG. 19 can be tiled separately in a repeating pattern to include additional columns and additional power lines. A first additional column of DACs that is like the first column (i.e., includes DACs that are similar to or are positioned in an arrangement similar to the first DAC 1904a,a and the fourth DAC 1904b,a of FIG. 19) of the array is interposed between the second column and a subset of columns that are like the first column of the array. A second additional column of DACs that is like the second column (i.e., includes DACs that are similar to or are positioned in an arrangement similar to the second DAC 1904a,b and the third DAC 1904b,b of FIG. 19) of the array is adjacent to a subset of columns that are like the second column of the array. An additional power line is coupled to selectively provide a current to each DAC of the first additional column and the second additional column. The illustrated implementation can be expanded to include any number (integer) of first additional columns, second additional columns, and corresponding number of additional power lines. The first control line is positioned operatively proximate each DAC of each column of the array to communicatively couple with the respective DACs of each column of the array. The second control line is positioned operatively proximate each DAC of the subset of columns that are like the first column and the first additional column of the array to communicatively couple with the respective DACs of the subset of columns that are like the first column and the first additional column of the array. The third control line is positioned operatively proximate each DAC of the subset of columns that are like the second column and the second additional column of the array to communicatively couple with the respective DACs of the subset of columns that are like the second column and the second additional column of the array.

One example implementation of tiling the first column and the second column of the array of FIG. 19 includes a third column and a fourth column of DACs. The third column of DACs is like the first column. The third column of DACs may include DACs that are similar to the first DAC 1904a,a and the fourth DAC 1904b,a of the first column of the array. The array may also include fourth column of DACs like the second column. The fourth column of DACs may include DACs that are similar to the second DAC 1904a,b and the third DAC 1904b,b of the second column of the array. The third column is interposed between the first column and the second column. The fourth column is adjacent to the second column. Note that the order of the first, the second, the third, and the fourth columns is not in sequence from the left side to the right side of an array. The order of columns starting from the left side going to the right side of the array is: the first, the third, the second, and the fourth column. The first power line may be coupled to selectively provide a current to each DAC of the first and the second column of the array, wherein the second column is interposed between the third and the fourth columns. A second power line may be coupled to selectively provide a current to each DAC of the third and the fourth column of the array, wherein the third column is interposed between the first and the second column. Thus, each power line may be coupled to selectively provide a current to each DAC in alternating columns of the array. The first control line is positioned operatively proximate each DAC of the first, the second, the third, and the fourth columns of the array to communicatively couple with the respective DACs of the first, the second, the third, and the fourth columns of the array. The second control line is positioned operatively proximate each DAC of the first column and the third column of the array to communicatively couple with the respective DACs of the first column and the third column of the array. The third control line is positioned operatively proximate each DAC of the second column and the fourth column of the array to communicatively couple with the respective DACs of the second column and the fourth column of the array.

Figure 20:
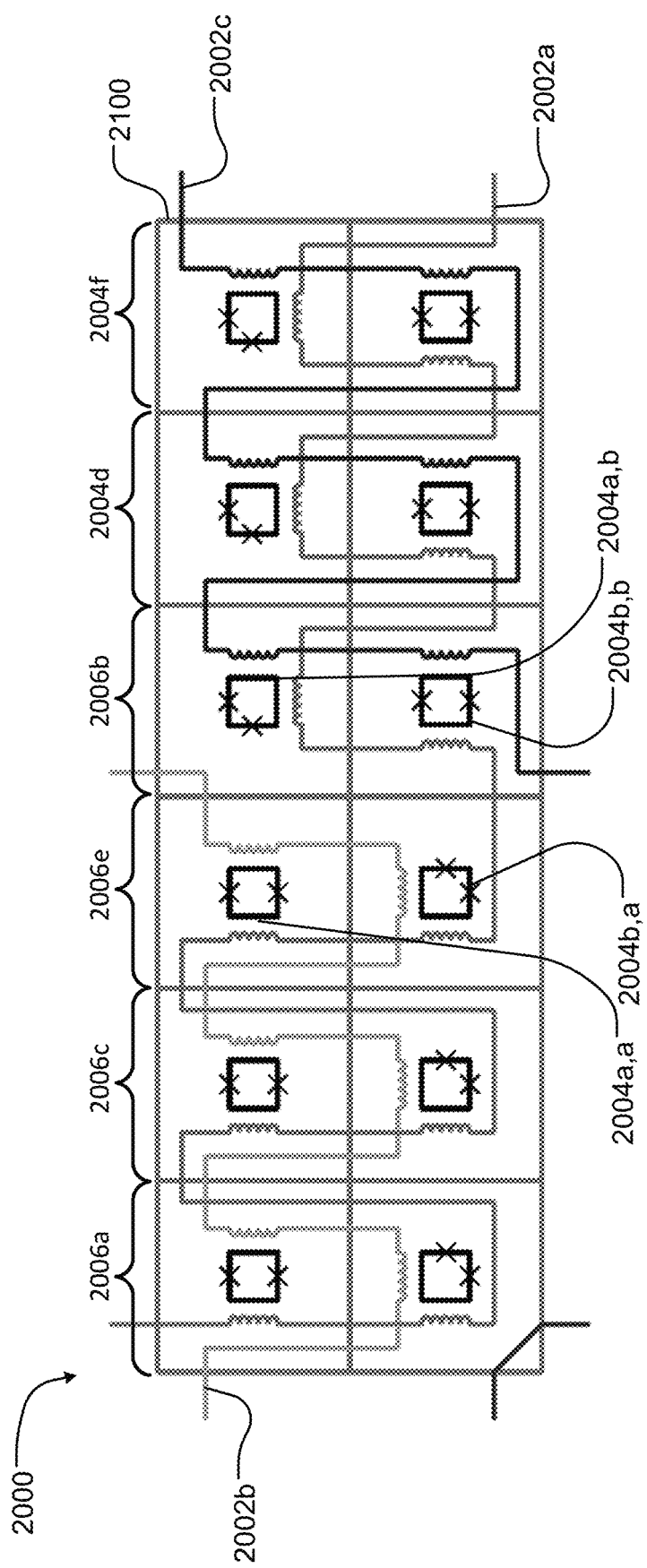
FIG. 20 is a schematic diagram of an array of digital-to-analog converters (DACs) illustrating the arrangement of three control lines across a number of columns of DACs.
Figure 21:
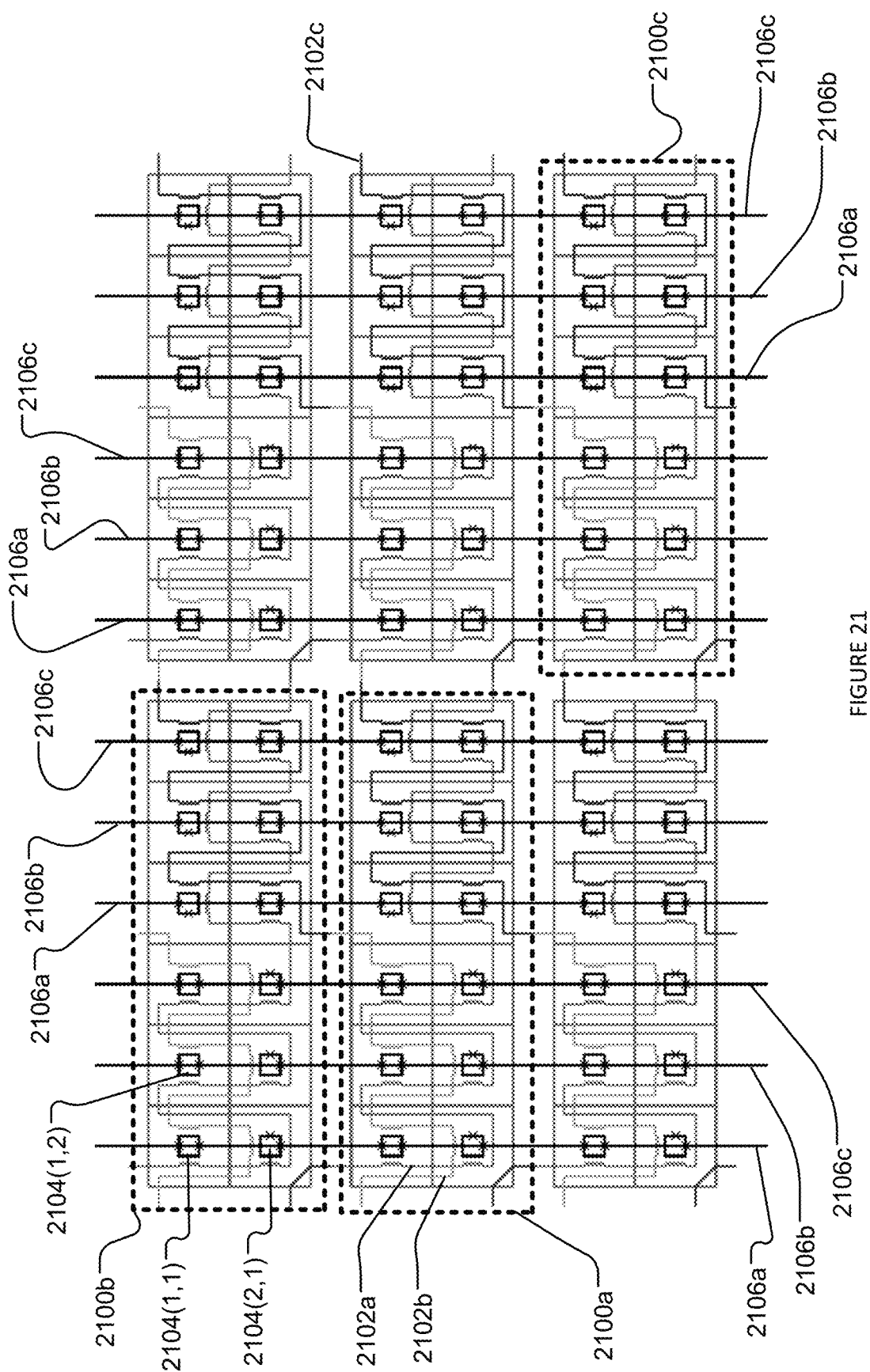
FIG. 21 is a schematic diagram of a plurality of arrays of FIG. 20 illustrating the arrangement of a number of control lines and three power lines across the plurality of arrays.
Figure 22:
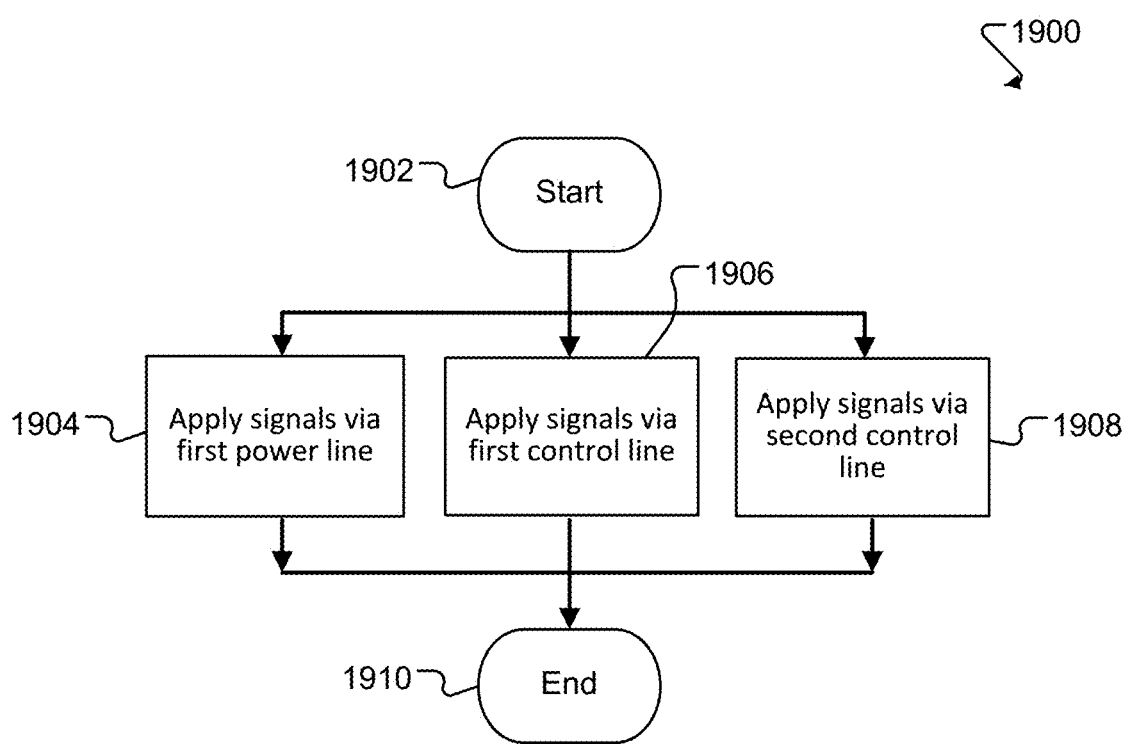
FIG. 22 is a flow diagram of a method of operation employing a braided arrangement of control lines to individually address DACs in a two-dimensional set (e.g., ordered array) of DACs, according to at least one illustrated implementation.

In the example implementation illustrated in FIG. 20, an array 2000 includes six columns 2006a-2006f of DACs 2004 formed from tiling the first column 2006a and the second column 2006b of FIG. 19. Note that the order of the six columns is not in sequence from the left side to the right side of the array 2000 (with respect to the drawing sheet). The order of columns starting from the left side going to the right side of the array 2000 is: the first, the third, the fifth, the second, the fourth, and the sixth column 2006a, 2006c, 2000e, 2006b, 2006d, 2006f. The fifth column 2006e and the third column 2006c are like the first column 2006a of the array 2000 and may include DACs that are similar to the first DAC 1904a,a and the fourth DAC 1904b,a of FIG. 19. The fifth column 2006e is interposed between the third column 2006c and the second column 2006b of the array 2000. The first, the third, and the fifth columns form a subset of columns that are like the first column 2006a of the array 2000. The sixth column 2006f and the fourth column 2006d are like the second column 2006b of the array 2000 and may include DACs that are similar to the second DAC 1904a,b and the third DAC 1904b,b of FIG. 19. The sixth column 2006f is adjacent to the fourth column 2006d. The second, the fourth, and the sixth columns form a subset of columns that are like the second column 2006b of the array 2000. In the implementation of FIG. 21, array 2000 may include a first, a second, and a third power line (not shown). The first power line is coupled to selectively provide a current to each DAC of the first column 2006a and the second column 2006b. The second power line is coupled to selectively provide a current to each DAC of the third column 2006c and the fourth column 2006d. The third power line is coupled to selectively provide a current to each DAC of the fifth column 2006e and the sixth column 2006f. Thus, each power line supplies current to one column of the subset of columns like the first column 2006a and to another column of the subset of columns like the second column 2006b.

A first control line 2002a is positioned operatively proximate each DAC of the first, the second, the third, the fourth, the fifth, and the sixth columns 2006a-2006f of the array 2000 to communicatively couple with the respective DACs of the first, the second, the third, the fourth, the fifth, and the sixth columns 2006a-2006f of the array 2000. A second control line 2002b is positioned operatively proximate each DAC of the first, the third, and the fifth columns 2006a, 2006c, 2006e of the array to communicatively couple with the respective DACs of the first, the third, and the fifth columns 2006a, 2006c, 2006e of the array. A third control line 2002c is positioned operatively proximate each DAC of the second, the fourth, and the sixth columns 2006b, 2006d, 2006f of the array to communicatively couple with the respective DACs of the second, the fourth, and the sixth columns 2006b, 2006d, 2006f of the array.

FIG. 21 shows six arrays of digital-to-analog converters (DACs) 2100a, 2100b, 2100c (only three called out in FIG. 21 for clarity, collectively and individually 2100) like the array of FIG. 20. FIG. 21 also shows a number of control lines 2102a-2102c (only three called out in FIG. 21 for clarity, collectively 2102) arranged to address each of DACs 2104i,j (where i are integers from 1 to n and j are integers from 1 to n, only three called out in FIG. 21 for clarity, collectively 2104). Control circuitry is communicatively coupled to cause signals to be supplied to selected ones of DACs 2104 via respective pairs of control lines 2102 and one of at least three power lines 2106a-2106c (collectively 2106), according to at least one illustrated implementation.

In the illustrated implementation, the DACs 2104 in each array 2100 of DACs 2104 are arranged in six columns, like the array of FIG. 20. Note that for each array 2100, the order of the six columns is not in sequence from the left side to the right side of the array (with respect to the drawing sheet). The order of columns starting from the left side going to the right side of each array is: the first, the third, the fifth, the second, the fourth, and the sixth column. Each array comprises a subset of columns that are like the first column of FIG. 19 that includes DACs 2104 similar to the first DAC 1904a,a and the fourth DAC 1904b,a of FIG. 19. The subset of columns that are like the first column includes: the first, the third, and the fifth columns (i.e., the third column is interposed and adjacent to the first and the fifth columns). Each array also comprises a subset of columns that are like the second column of FIG. 19 that includes DACs 2104 similar to the second DAC 1904a,b and the third DAC 1904b,b of FIG. 19. The subset of columns that are like the second column includes: the second, the fourth, and the sixth columns (i.e., the fourth column is interposed and adjacent to the second and the sixth columns). Each array 2100 of DACs is controlled or selected by three power lines 2106. Each power line selectively provides current to a respective pair of columns in each array 2100. For example, a first power line 2106a selectively provides current to the first and the second columns of each array 2100, a second power line 2106b selectively provides current to the third and the fourth columns of each array 2100, and a third power line 2106c selectively provides current to the fifth and the sixth columns of each array 2100.

Control lines 2102 are used in combination with the power lines to uniquely address each DAC in each array

2100. As illustrated, these control lines are interwoven across each of the respective arrays to effectuate an efficient addressing scheme where each DAC is controlled via signals carried by a respective pair of control lines 2102 and a power line 2106. For example, a number n of control lines 2102 and a number P of power lines 2106 is capable of addressing about n(n−1)P DACs 2104. While each array in the illustrated implementation may include a number 2P of DACs, the number of rows in an array may be higher and thus an array may include, for example, a number 3P or 4P of DACs.

As illustrated in FIG. 21, the DACs are arranged in six arrays 2100, each array including a respective plurality of DACs 2104, a number of control lines 2102, and a number of power lines 2106. A first array 2100*a* may include a first control line 2102*a* that is positioned operatively proximate each DAC of each column of the first array 2100*a* to communicatively couple with the respective DACs of each column of the first array 2100*a*. The first array 1200*a* may include a second control line 2102*b* that is positioned operatively proximate each DAC of the first, the third, and the fifth columns. The first array 2100*a* may also include a third control line 2102*c* that is positioned operatively proximate each DAC of the second, the fourth, and the sixth columns.

In one implementation, the second control line 2102*b* is further positioned operatively proximate each DAC of the second, the fourth, and the sixth columns of a second array 2100*b* to communicatively couple with the respective DACs of the second, the fourth, and the sixth columns of the second array 2100*b*. A fourth control line (not called out) that is like the first control line 2102*a* of the first array 2100*a* is positioned operatively proximate each DAC of each column of the second array 2100*b* to communicatively couple with the respective DACs of each column of the second array 2100*b*. The fourth control line may be electrically coupled to the first control line 2102*a* of a third array that is like the first array 2100*a*. A fifth control line (not called out) that is like the second control line 2102*b* of the first array 2100*a* is positioned operatively proximate each DAC of the first, the third, and the fifth columns of the second array 2100*b* to communicatively couple with the respective DACs of the first, the third, and the fifth columns of the second array 2100*b*. The fifth control line may be electrically coupled to the third control line of a third array that is like the first array 2100*a*.

In another implementation, the first control line 2102*a* is further positioned operatively proximate each DAC of each column of a third array 2100*c* to communicatively couple with the respective DACs of each column of the third array 2100*c*. A fourth control line (not called out) that is like the second control line of the first array 2100*a* is positioned operatively proximate each DAC of the first, the third, and the fifth columns of the third array 2100*c* to communicatively couple with the respective DACs of the first, the third, and the fifth columns of the third array 2100*c*. The fourth control line may be electrically coupled to the third control line of a fourth array that is like the first array 2100*a*. A fifth control line (not called out) that is like the third control line of the first array 2100*a* is positioned operatively proximate each DAC of the second, the fourth, and the sixth columns of the third array 2100*c* to communicatively couple with the respective DACs of the second, the fourth, and the sixth columns of the third array 2100*c*. The fifth control line may be electrically coupled to the second control line of a fourth array that is like the first array 2100*a*.

Throughout this specification and the appended claims, reference is made to "two-dimensional array" and "array", which are two terms that are used interchangeably. In general, it is preferable that the array in the above implementations is two-dimensional and the relevant components (e.g., control lines, DACs, Josephson junctions) can be easily manufactured in superconducting integrated circuit fabrication processes. Some implementations are schematic diagrams and thus line configurations represented in an array may differ in appearance from the actual layout implemented on a processor or core. While the above implementations are generally illustrated as an ordered array, many of the techniques and structures described herein can be employed with a non-ordered array or set of DACs and/or other devices.

The above described method(s), process(es), or technique(s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for exemplary purposes only and may change in alternative examples. Some of the exemplary acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the exemplary methods for quantum computation generally described above.

The various implementations described above can be combined to provide further implementations. All of the US patent application publications, US patent applications, foreign patents, and foreign patent applications referred to in this specification and/or listed in the Application Data Sheet and commonly assigned to D-Wave Systems Inc are incorporated herein by reference, in their entirety, including but not limited to: International Patent Application No. PCT/US2017/030857; U.S. Patent Application Ser. No. 62/405,027; and U.S. Patent Application Ser. No. 62/331,287.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A system, comprising:
a first two-dimensional array of digital-to-analog converters (DACs) comprising a plurality of DACs arranged in a plurality of sub-arrays, each sub-array comprising a number of rows, a first column of DACs, and a second column of DACs;
a first power line coupled to selectively provide a current to the DACs of the first column of each sub-array of the plurality of sub-arrays of the first two-dimensional array;
a second power line coupled to selectively provide a current to the DACs of the second column of each sub-array of the plurality of sub-arrays of the first two-dimensional array;
a first control line positioned proximate each DAC along a first diagonal of the first two-dimensional array of DACs to communicatively couple with the respective DACs along the first diagonal of the first two-dimensional array of DACs; and
at least a second two-dimensional array of DACs comprising a plurality of DACs arranged in a plurality of sub-arrays, each sub-array comprising a number of rows, a first column of DACs, and a second column of DACs; wherein
the first power line is further coupled to selectively provide a current to the DACs of the second column of each sub-array of the plurality of sub-arrays of the second two-dimensional array;
the second power line is further coupled to selectively provide a current to the DACs of the first column of the sub-arrays of the second two-dimensional array; and
the first control line is further positioned proximate each DAC along a first diagonal of the second two-dimensional array of DACs to communicatively couple with the respective DACs along the first diagonal of the second two-dimensional array of DACs.

2. The system of claim 1 wherein the first diagonal of the first two-dimensional array of DACs extends across each row of the number of rows, the first column, and the second column of each sub-array of the plurality of sub-arrays of the first two-dimensional array of DACs.

3. The system of claim 1 wherein the first diagonal of the first two-dimensional array of DACs extends across each row of the number of rows, the first column, and the second column of each sub-array of the plurality of sub-arrays of the first two-dimensional array of DACs.

4. The system of claim 3 wherein the first diagonal of the first two-dimensional array is perpendicular to the first diagonal of the second two-dimensional array.

5. The system of claim 1 wherein the first diagonal of the second two-dimensional array of DACs extends across each row of the number of rows, the first column, and the second column of each sub-array of the plurality of sub-arrays of the second two-dimensional array of DACs.

6. The system of claim 1 wherein the first control line follows a meandering path along the first diagonal of the first two-dimensional array of DACs and the first control line follows a meandering path along the first diagonal of the second two-dimensional array of DACs.

7. The system of claim 1 wherein the first control line follows a meandering path along the first diagonal of the first two-dimensional array of DACs and the first control line follows a meandering path along a second diagonal of the first two-dimensional array of DACs.

8. The system of claim 1 further comprising:
a second control line positioned proximate each DAC along a third diagonal of the first two-dimensional array of DACs to communicatively couple with the respective DACs along the third diagonal of the first two-dimensional array of DACs and the second control line further positioned proximate each DAC along a second diagonal of the second two-dimensional array of DACs to communicatively couple with the respective DACs along the second diagonal of the second two-dimensional array of DACs.

9. The system of claim 8 further comprising:
a third control line positioned proximate each DAC along a second diagonal of the first array to communicatively couple with the respective DACs along the second diagonal of the first array and the third control line is further positioned proximate each DAC along a third diagonal of the second array to communicatively couple with the respective DACs along the third diagonal of the second array.

10. The system of claim 1 further comprising:
a second control line positioned proximate each DAC along a third diagonal of the first two-dimensional array of DACs to communicatively couple with the respective DACs along the third diagonal of the first two-dimensional array of DACs and the second control line further positioned proximate each DAC along a fourth diagonal of the first two-dimensional array of DACs to communicatively couple with the respective DACS along the fourth diagonal of the first two-dimensional array of DACs.

11. The system of claim 10 further comprising:
a third control line positioned proximate each DAC along a second diagonal of the first array to communicatively couple with the respective DACs along the second diagonal of the first array and the third control line is further positioned proximate each DAC along a first diagonal of the first array to communicatively couple with the respective DACs along the first diagonal of the first array.

12. The system of claim 1 wherein there are a number n of control lines and a number P of power lines and each of the first and the second two-dimensional array of DACs includes a number $P(n-1)^2$ of DACs.

13. The system of claim 1, further comprising:
control circuitry communicatively coupled to cause signals to be supplied to selected ones of the DACs via a respective triplet comprising one power line and two control lines, the triplet uniquely communicatively coupled to operate a single respective DAC.

14. A system, comprising:
a first two-dimensional array of digital-to-analog converters (DACs) comprising a plurality of DACs arranged in a plurality of sub-arrays, each sub-array comprising a number of rows, a first column of DACs, and a second column of DACs;
a first power line coupled to selectively provide a current to the DACs of the first column of each sub-array of the plurality of sub-arrays of the first two-dimensional array;
a second power line coupled to selectively provide a current to the DACs of the second column of each sub-array of the plurality of sub-arrays of the first two-dimensional array; and
a first control line positioned proximate each DAC along a first diagonal of the first two-dimensional array of DACs to communicatively couple with the respective DACs along the first diagonal of the first two-dimensional array of DACs, wherein:
the first power line is coupled to selectively provide a current to the DACs of a third column of the first two-dimensional array of DACs, the third column non-adjacent to the first column;
the second power line is coupled to selectively provide a current to the DACs of a fourth column of the first two-dimensional array of DACs, the fourth column non-adjacent to the second column; and
the first control line is positioned operatively proximate at least one DAC in each of at least three rows and at least three columns of the first two-dimensional array of DACs to communicatively couple with the respective DACs in each of at least three rows and at least three columns of the first two-dimensional array of DACs.

15. The system of claim 14, further comprising:
at least a second two-dimensional array of DACs comprising a plurality of DACs that are not DACs in the first two-dimensional array, and which are arranged in a plurality of rows and a plurality of columns of the second two-dimensional array; wherein
the second power line is further coupled to selectively provide a current to the DACs of a third column of the second two-dimensional array of DACs, the third column non-adjacent to the first column of the second two-dimensional array of DACs; and
the first power line is further coupled to selectively provide a current to the DACs of a fourth column of the second two-dimensional array of DACs, the fourth column non-adjacent to the second column of the second two-dimensional array of DACs.

16. The system of claim 14, further comprising:
a second control line positioned operatively proximate at least one DAC in each of at least three rows and at least three columns of the first two-dimensional array of DACs to communicatively couple with the respective DACs in each of at least three rows and at least three columns of the first two-dimensional array of DACs.

17. The system of claim 16 wherein the first control line and the second control line are positioned operatively proximate different DACs, with no DAC in common.

18. The system of claim 17 wherein the first control line and the second control line are positioned operatively proximate a same at least one of DACs, with the at least one DAC in common.

19. A system, comprising:
a first array of digital-to-analog converters (DACs) comprising a plurality of DACs arranged in a plurality of rows and a plurality of columns of the first array;
a first power line coupled to selectively provide a current to each DAC of a first column of the first array, the DACs of the first column positioned in a first arrangement;
the first power line further coupled to selectively provide a current to each DAC of a second column of the first array, the DACs of the second column positioned in a second arrangement;
a first control line positioned operatively proximate each DAC of the first column and the second column of the first array to communicatively couple with the respective DACs of the first column and the second column of the first array;
a second control line positioned operatively proximate each DAC of first column of the first array to communicatively couple with the respective DACs of the first column of the first array;
a third control line positioned operatively proximate each DAC of the second column of the first array to communicatively couple with the respective DACs of second column of the first array;
a third column of DACs positioned in the first arrangement, the third column interposed between the first column and the second column of the first array;
a fourth column of DACs positioned in the second arrangement, the fourth column adjacent to the second column of the first array; and
a second power line coupled to selectively provide a current to each DAC of the third column and the fourth column of the first array; wherein
the first control line is further positioned operatively proximate each DAC of the third column and the fourth column of the first array to communicatively couple with the respective DACs of the third column and the fourth column of the first array;
the second control line is further positioned operatively proximate each DAC of third column of the first array to communicatively couple with the respective DACs of the third column of the first array; and
the third control line is further positioned operatively proximate each DAC of the fourth column of the first array to communicatively couple with the respective DACs of the fourth column of the first array.

20. The system of claim 19 further comprising:
a fifth column of DACs positioned in the first arrangement, the fifth column interposed between the third column and the second column of the first array;
a sixth column of DACs positioned in the second arrangement, the sixth column adjacent to the fourth column of the first array;
a third power line coupled to selectively provide a current to each DAC of the fifth column and the sixth column of the first array; wherein
the first control line is further positioned operatively proximate each DAC of the fifth column and the sixth column of the first array to communicatively couple with the respective DACs of the fifth column and the sixth column of the first array;
the second control line is further positioned operatively proximate each DAC of the fifth column of the first array to communicatively couple with the respective DACs of the fifth column of the first array; and
the third control line is further positioned operatively proximate each DAC of the sixth column of the first array to communicatively couple with the respective DACs of the sixth column of the first array.

21. The system of claim 20 further comprising:
a first additional column of DACs positioned in the first arrangement, the first additional column interposed between the second column and a subset of columns of the first array that includes DACs positioned in the first arrangement;
a second additional column of DACs positioned in the second arrangement, the second additional column adjacent to a subset of columns of the first array that includes DACs positioned in the second arrangement;
an additional power line coupled to selectively provide a current to each DAC of the first additional column and the second additional column of the first array; wherein
the first control line is further positioned operatively proximate each DAC of the first additional column and the second additional column to communicatively couple with the respective DACs of the first additional column and the second additional column of the first array;

the second control line is further positioned operatively proximate each DAC of the first additional column to communicatively couple with the respective DACs of the first additional column of the first array; and the third control line further is positioned operatively proximate each DAC of the second additional column to communicatively couple with the respective DACs of the second additional column of the first array.

22. The system of claim 19 further comprising:
at least a second array of DACs comprising a plurality of DACs that are not DACs in the first array, and which are arranged in a plurality of rows and a plurality of columns of the second array; wherein the first power line is coupled to selectively provide a current to each DAC of a first column of the second array, the DACs of the first column positioned in the first arrangement;

the first power line is further coupled to selectively provide a current to each DAC of a second column of the second array, the DACs of the second column positioned in a second arrangement;

the second control line is positioned operatively proximate each DAC of the second column of the second array to communicatively couple with the respective DACs of the second column of the second array;

a fourth control line positioned operatively proximate each DAC of the first column and the second column of the second array to communicatively couple with the respective DACs of the first column and the second column of the second array; and a fifth control line is positioned operatively proximate each DAC of the first column of the second array to communicatively couple with the respective DACs of the first column of the second array.

23. The system of claim 22 further comprising:
a first additional column of DACs positioned in the first arrangement, the first additional column interposed between the second column of the second array and a subset of columns of the second array that includes DACs positioned in the first arrangement;

a second additional column of DACs positioned in the second arrangement, the second additional column adjacent to a subset of columns of the second array that includes DACs positioned in the second arrangement;

an additional power line coupled to selectively provide a current to each DAC of the first additional column and the second additional column of the second array;

the second control line is further positioned operatively proximate each DAC of the second additional column to communicatively couple with the respective DACs of the second additional column of the second array;

the fourth control line is further positioned operatively proximate each DAC of the first additional column and the second additional column to communicatively couple with the respective DACs of the first additional column and the second additional column of the second array; and the fifth control line is further positioned operatively proximate each DAC of the first additional column to communicatively couple with the respective DACs of the first additional column of the second array.

24. The system of claim 23 further comprising a third array wherein the fourth control line is electrically coupled to the first control line of the third array.

25. The system of claim 23 further comprising a third array wherein the fifth control line is electrically coupled to the third control line of the third array.

26. The system of claim 19 further comprising:
at least a second array of DACs comprising a plurality of DACs that are not DACs in the first array, and which are arranged in a plurality of rows and a plurality of columns of the second array; wherein the first power line is coupled to selectively provide a current to each DAC of a first column and a second column of the second array; wherein the first control line is positioned operatively proximate each DAC of the first column and the second column of the second array to communicatively couple with the respective DACs of the first column and the second column of the second array;

a fourth control line is positioned operatively proximate each DAC of the first column of the second array to communicatively couple with the respective DACs of the first column of the second array; and a fifth control line is positioned operatively proximate each DAC of the second column of the second array to communicatively couple with the respective DACs of the second column of the second array.

27. The system of claim 26 further comprising:
a first additional column of DACs positioned in the first arrangement, the first additional column interposed between the second column and a subset of columns that includes DACs positioned in the first arrangement of the second array;

a second additional column of DACs positioned in the first arrangement, the second additional column adjacent to a subset of columns that includes DACs positioned in the second arrangement of the second array;

an additional power line coupled to selectively provide a current to each DAC of the first additional column and the second additional column; wherein the first control line is further positioned operatively proximate each DAC of the first additional column and the second additional column to communicatively couple with the respective DACs of the first additional column and the second additional column;

the fourth control line is further positioned operatively proximate each DAC of the first additional column to communicatively couple with the respective DACs of the first additional column; and the fifth control line is further positioned operatively proximate each DAC of the second additional column to communicatively couple with the respective DACs of the second additional column.

28. The system of claim 27 further comprising a third array wherein the fourth control line is electrically coupled to the third control line of the third array.

29. The system of claim 27 further comprising a third array wherein the fifth control line is electrically coupled to the second control line of the third array.

30. The system of claim 19 wherein there are a number $n(n-1)P$ of DACs controlled by a total of n control lines and P power lines.

31. The system of claim 19 wherein there are a total of P power lines and the first array includes a number $2P$ of DACs.

32. The system of claim 19, further comprising:
control circuitry communicatively coupled to cause signals to be supplied to selected ones of the DACs via a respective triplet comprising one power line and two control lines, the triplet uniquely communicatively coupled to operate a single respective DAC.

* * * * *